(12) United States Patent
Nagai

(10) Patent No.: US 9,305,996 B2
(45) Date of Patent: Apr. 5, 2016

(54) SEMICONDUCTOR DEVICE

(71) Applicant: FUJITSU SEMICONDUCTOR LIMITED, Yokohama-shi, Kanagawa (JP)

(72) Inventor: Kouichi Nagai, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/310,407

(22) Filed: Jun. 20, 2014

(65) Prior Publication Data

US 2014/0299965 A1  Oct. 9, 2014

Related U.S. Application Data

(60) Division of application No. 13/396,129, filed on Feb. 14, 2012, now Pat. No. 8,796,043, which is a division of application No. 12/545,469, filed on Aug. 21, 2009, now Pat. No. 8,212,300, which is a continuation of application No. PCT/JP2007/053138, filed on Feb. 21, 2007.

(51) Int. Cl.
| | |
|---|---|
| *H01L 21/02* | (2006.01) |
| *H01L 49/02* | (2006.01) |
| *H01L 27/115* | (2006.01) |

(52) U.S. Cl.
CPC .......... *H01L 28/60* (2013.01); *H01L 27/11502* (2013.01); *H01L 27/11507* (2013.01); *H01L 27/11509* (2013.01); *H01L 28/55* (2013.01)

(58) Field of Classification Search
CPC .......... H01L 28/60; H01L 21/00; H01L 21/66
See application file for complete search history.

(56) References Cited

U.S. PATENT DOCUMENTS

| | | | |
|---|---|---|---|
| 5,604,696 | A | 2/1997 | Takaishi |
| 5,801,079 | A | 9/1998 | Takaishi |
| 5,872,053 | A | 2/1999 | Smith |

(Continued)

FOREIGN PATENT DOCUMENTS

| | | | |
|---|---|---|---|
| JP | 05-243517 A | 9/1993 | |
| JP | 08-023079 A | 1/1996 | |

(Continued)

OTHER PUBLICATIONS

Japanese Office Action dated Jul. 29, 2014, issued in Japanese Patent Application No. 2013-259162, w/English translation (6 pages).

(Continued)

*Primary Examiner* — Bilkis Jahan
(74) *Attorney, Agent, or Firm* — Westerman, Hattori, Daniels & Adrian, LLP

(57) ABSTRACT

After the formation of a first interlayer insulating, an etching stopper film made of SiON is formed thereon. Subsequently, a contact hole extending from the upper surface of the etching stopper film and reaching a high concentration impurity region is formed, and a first plug is formed by filling W into the contact hole. Next, a ferroelectric capacitor, a second interlayer insulating film, and the like are formed. Thereafter, a contact hole extending from the upper surface of the interlayer insulating film and reaching the first plug is formed. Then, the contact hole is filled with W to form a second plug. With this, even when misalignment occurs, the interlayer insulating film is prevented from being etched.

7 Claims, 54 Drawing Sheets

(56) References Cited

U.S. PATENT DOCUMENTS

| | | |
|---|---|---|
| 5,907,788 A | 5/1999 | Kasai |
| 6,136,683 A | 10/2000 | Saito |
| 6,297,537 B1 | 10/2001 | Saito |
| 6,426,255 B1 | 7/2002 | Asano et al. |
| 6,642,563 B2 | 11/2003 | Kanaya |
| 6,794,757 B1 | 9/2004 | Smith |
| 6,914,336 B2 | 7/2005 | Matsuki et al. |
| 6,953,950 B2 | 10/2005 | Sashida |
| 7,285,460 B2 | 10/2007 | Sashida |
| 7,301,238 B2 | 11/2007 | Smith |
| 7,518,173 B2 | 4/2009 | Hikosaka et al. |
| 7,633,107 B2 | 12/2009 | Matsuura |
| 7,683,412 B2 | 3/2010 | Saigoh et al. |
| 7,910,968 B2 | 3/2011 | Wang |
| 8,212,300 B2* | 7/2012 | Nagai .................. 257/304 |
| 8,552,484 B2 | 10/2013 | Nagai |
| 2002/0102791 A1 | 8/2002 | Kurasawa et al. |
| 2003/0030084 A1 | 2/2003 | Moise et al. |
| 2003/0222299 A1* | 12/2003 | Miura .................. 257/306 |
| 2003/0227046 A1* | 12/2003 | Ando ............. H01L 27/11502 257/310 |
| 2004/0113189 A1* | 6/2004 | Takamatsu ........ H01L 21/31691 257/295 |
| 2006/0170031 A1 | 8/2006 | Kang et al. |
| 2006/0199342 A1 | 9/2006 | Matsuura et al. |
| 2007/0048963 A1 | 3/2007 | Miura |
| 2007/0108489 A1 | 5/2007 | Nagai |
| 2008/0105911 A1 | 5/2008 | Wang |

FOREIGN PATENT DOCUMENTS

| | | |
|---|---|---|
| JP | 08-046152 A | 2/1996 |
| JP | 08-204012 A | 8/1996 |
| JP | 08-236476 A | 9/1996 |
| JP | 10-289950 A | 10/1998 |
| JP | 11-186391 A | 7/1999 |
| JP | 2001-210711 A | 8/2001 |
| JP | 2002-110932 A | 4/2002 |
| JP | 2003-110095 A | 4/2003 |
| JP | 2003-243629 A | 8/2003 |
| JP | 2003-273217 A | 9/2003 |
| JP | 2006-202848 A | 8/2006 |
| KR | 2002-0064135 A | 8/2002 |
| KR | 2006-0089938 A | 8/2006 |
| WO | 2006-134664 A1 | 12/2006 |

OTHER PUBLICATIONS

Office Action dated Apr. 7, 2015, issued in corresponding Japanese Patent Application No. 2012-136753, with Partial English translation (6 pages).

Japanese Office Action dated Oct. 15, 2013, issued in corresponding Japanese Patent Application No. 2012-136753 with English translation (11 pages).

International Search Report of PCT/JP2007/053138, Mailing Date of May 22, 2007 (3 pages).

Korean Office Action dated Feb. 25, 2011, issued in corresponding Korean Patent Application No. 10-2009-7017358 (37 pages).

Fujitsu LtdJapanese Office Action dated Jul. 10, 2012, issued in corresponding Japanese Patent Application No. 2009-500034, with English translation (4 pages).

Japanese Office Action dated Oct. 2, 2012, issued in corresponding Japanese Patent Application No. 2009-500034, with English translation (5 pages).

* cited by examiner

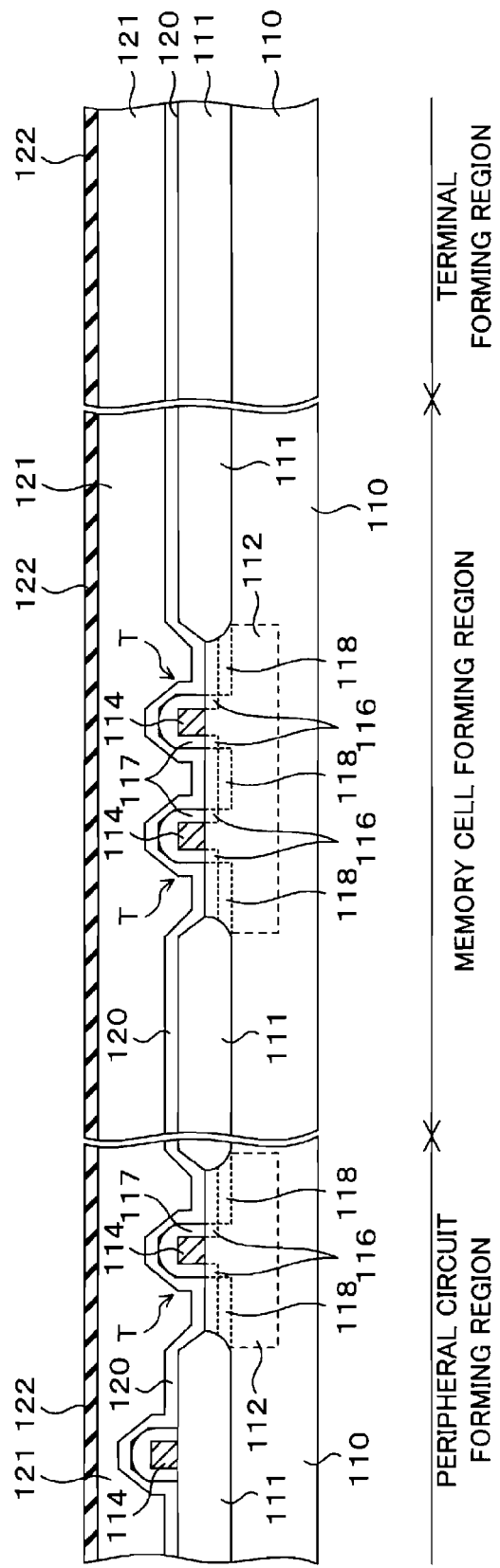

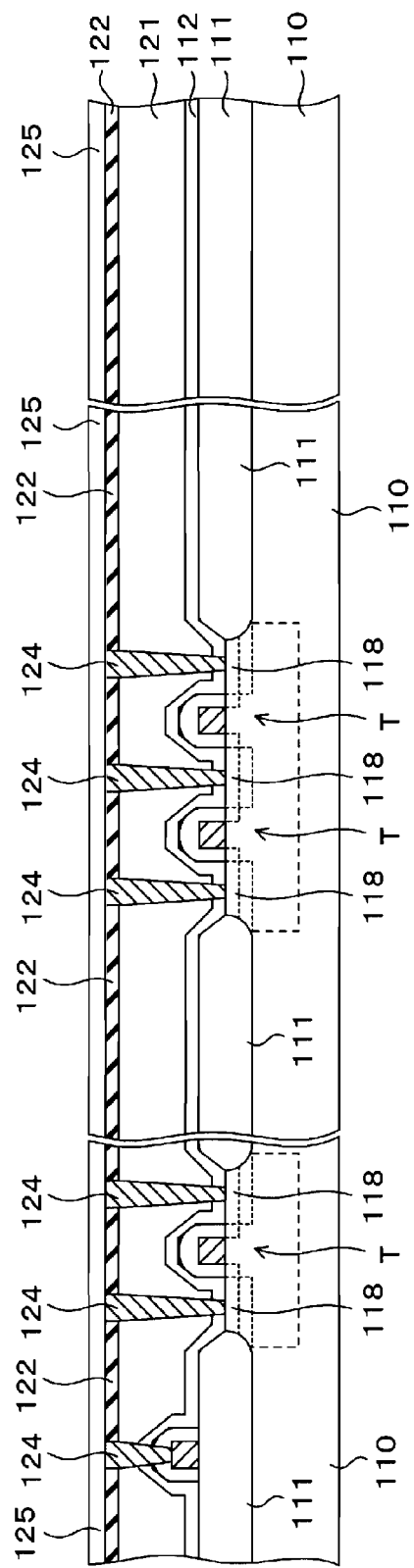

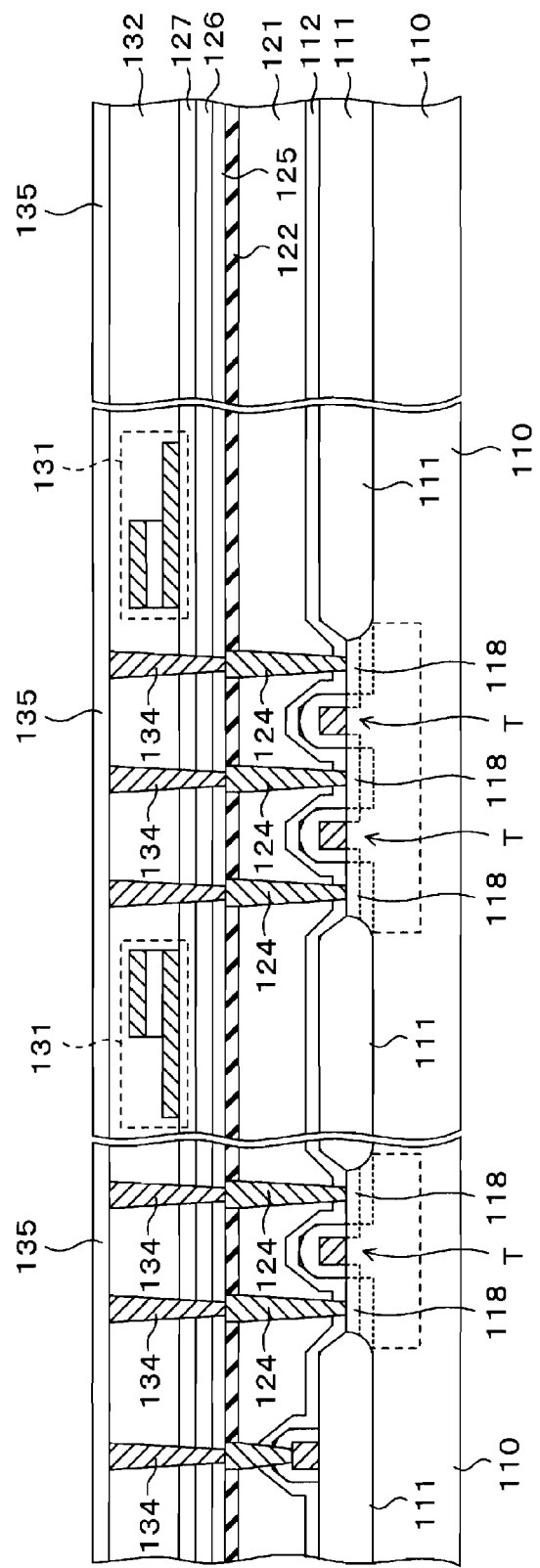

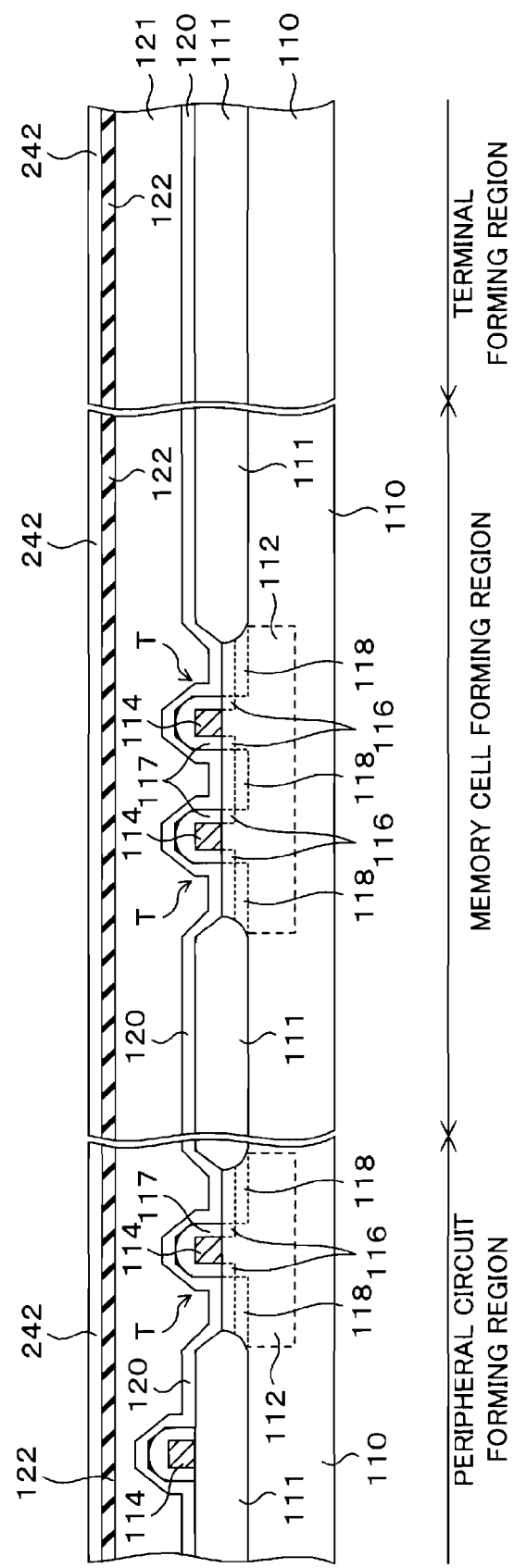

SEMICONDUCTOR DEVICE

CROSS-REFERENCE TO RELATED APPLICATION

This application is a divisional of U.S. patent application Ser. No. 13/396,129, filed Feb. 14, 2012, which is a divisional of U.S. patent application Ser. No. 12/545,469, filed August 21, 2009, now U.S. Pat. No. 8,212,300, which in turn is a continuation of prior International Patent Application No. PCT/JP2007/053138, filed Feb. 21, 2007, the entire contents of which are incorporated herein by reference.

FIELD

The embodiments discussed herein are related to a semiconductor device including a ferroelectric capacitor configured by sandwiching a ferroelectric film between a pair of electrodes and to a method for manufacturing the semiconductor device.

BACKGROUND

In recent years, development has been progressed for memories including a ferroelectric capacitor which stores information using the hysteresis characteristic of a ferroelectric material (Ferroelectric Random Access Memory: hereinafter referred to as "FeRAM"). A FeRAM is a nonvolatile memory in which information is not erased even after power is turned off, and has excellent characteristics of achieving high integration, high speed driving, high durability, and low power consumption.

As a ferroelectric film material of a ferroelectric capacitor, mainly used is a ferroelectric oxide having the perovskite crystal structure such as PZT ($Pb(Zr,Ti)O_3$) or SBT ($SrBi_2Ta_2O_9$) whose residual polarization amount is large. The residual polarization amounts of these ferroelectric oxides are approximately 10 to 30 $\mu C/cm^2$.

FIG. 1 is a schematic view depicting an example of a semiconductor device having a conventional ferroelectric capacitor. A semiconductor substrate 10 is separated into multiple element regions by an element isolation film 11. A transistor T and other elements, which constitute an electronic circuit, are formed in each element region.

The transistor T includes a pair of high concentration impurity regions (source/drain) 18 each of which is formed by selectively injecting an impurity into the semiconductor substrate 10, a gate insulating film (unillustrated) formed on a region between the pair of these high concentration impurity regions 18, and a gate electrode 14 formed on the gate insulating film. A stopper layer 20 is formed on the semiconductor substrate 10. This stopper layer 20 covers the transistor T and the element isolation film 11. In addition, a first interlayer insulating film 21 is formed on the stopper layer 20. A W (tungsten) plug 22 is formed in this interlayer insulating film 21, and the W plug 22 reaches one of the high concentration impurity regions 18 of the transistor T from the upper surface of the interlayer insulating film 21.

A ferroelectric capacitor 30 is formed on the interlayer insulating film 21, and has a structure in which a lower electrode 26a, a ferroelectric film 27, and an upper electrode 28a are stacked in this order from the bottom. This ferroelectric capacitor 30 is covered with a second interlayer insulating film 31 formed on the first interlayer insulating film 21.

Wirings 37 of a first wiring layer are formed on the second interlayer insulating film 31. One of these wirings 37 is electrically connected to the upper electrode 28a through a W plug 33a extending from the upper surface of the interlayer insulating film 31 and being connected to the upper electrode 28a of the ferroelectric capacitor 30. Another wiring 37 is electrically connected to the lower electrode 26a through a W plug 33b extending from the upper surface of the interlayer insulating film 31 and being connected to the lower electrode 26a of the ferroelectric capacitor 30. Still another wiring 37 is electrically connected to the W plug 22 through the W plug 33c penetrating the interlayer insulating film 31 in a vertical direction.

A third interlayer insulating film 40 is formed on the wirings 37 of the first wiring layer and the second interlayer insulating film 31. Wirings 42 of a second wiring layer are formed on this third interlayer insulating film 40. Some predetermined ones of these wirings 42 are each electrically connected to the wirings 37 of the first wiring layer through a W plug 41 penetrating the interlayer insulating film 40 in the vertical direction.

A fourth interlayer insulating film 46 is formed on the wirings 42 of the second wiring layer and the third interlayer insulating film 40. Wirings 48 of a third wiring layer and a terminal 49 are formed on this fourth interlayer insulating film 46. A predetermined one of the wirings 48 of the third wiring layer is electrically connected to the wiring 42 of the second wiring layer through a W plug 47 penetrating the interlayer insulating film 46 in the vertical direction.

On the wirings 48 of the third wiring layer and the fourth interlayer insulating film 46, a first passivation film 51, a second passivation film 52, and a protection film are formed in this order from the bottom. Then, the first passivation film 51, the second passivation film 52, and the protection film 53, which are formed on the terminal 49, are selectively removed to expose the surface of the terminal 49.

As depicted in this FIG. 1, conventionally, the high concentration impurity region 18 of the transistor T and the wiring 37 of the first wiring layer are connected to each other through the two W plugs 22 and 33c, which are lined up in the vertical direction. This configuration is employed because: the two interlayer insulating films 21 and 31 are present between the wiring 37 of the first wiring layer and the high concentration impurity region 18; the wiring 37 of the first wiring layer and the high concentration impurity region 18 has such a long distance therebetween; so that long-time etching needs to be performed to form a contact hole extending from the upper surface of the interlayer insulating film 31 and reaching the high concentration impurity region 18; and such long-time etching may badly damage the ferroelectric capacitor 30. In short, with the long etching time, characteristic of the ferroelectric capacitor 30 deteriorates by receiving plasma damages. In addition, if contact holes respectively reaching the upper electrode 28a and the lower electrode 26a and a contact hole reaching the high concentration impurity region 18 are formed simultaneously, the upper electrode 28a and the lower electrode 26a are etched before the contact hole reaching the high concentration impurity region 18 is completed. Instead, the contact hole reaching the high concentration impurity region 18 may be formed alone. In this case, however, a problem arises that an etching amount is not stabilized (controlled etching is difficult) because of a high aspect ratio (an etching depth is too large relative to the diameter of the contact hole).

As depicted in FIG. 1, the two W plugs 22 and 33c, which are formed individually, connect the wiring 37 of the first wiring layer and the high concentration impurity region 18, whereby a damage given to the ferroelectric capacitor 30 during the etching of the interlayer insulating films can be suppressed. Thus, preferable ferroelectric characteristic can be obtained.

In this case, as depicted in FIG. 1, the size (diameter) of the W plug 22 on a lower side is designed to be slightly larger than the size (diameter) of the W plug 33c on an upper side. This design is made to securely form a contact hole right above the W plug 22 even if slight misalignment occurs when a contact hole reaching the W plug is formed from the upper surface of the interlayer insulating film 31 by the photolithography method. In this way, the interlayer insulating film 21 can be prevented from being etched when the contact hole is formed in the interlayer insulating film 31.

Note that patent documents 1 to 4 disclose prior arts which are considered relevant to the embodiments discussed herein. Patent document 1 discloses a semiconductor device in which: a silicide pad having a shape larger than that of a plug formed of polysilicon (polysilicon plug) is formed on top of the polysilicon plug; and a plug in an upper layer and the polysilicon plug are electrically connected each other through the silicide pad.

Patent document 2 discloses a semiconductor device manufacturing method involving: sequentially forming a first conductive film and a second conductive film on the entire upper surface of a substrate after forming a plug; patterning the second conductive film in a predetermined shape; performing isotropic etching of the first conductive film by using the second conductive film as a mask, thereby to form a connection pad, made of the first conductive film, on a predetermined plug. The plug and the second conductive film (wiring) are electrically connected each other through the connection pad.

Patent document 3 discloses a structure in a semiconductor device having a stack-type capacitor. In this structure, a contact hole between an impurity region on a substrate surface and an aluminum wiring is filled with polysilicon. Patent document 4 discloses a method for forming a contact plug having a large upper diameter, by performing isotropic etching and anisotropic etching in combination.

As described above, in consideration of misalignment occurring in the photolithography process, the size (diameter) of the plug 22 has been conventionally designed to be slightly larger than the size (diameter) of the contact hole formed thereon. However, with further size reduction (high integration) of a semiconductor device, the position of the contact hole 31a has been sometimes misaligned with the position of the plug 22 as depicted in FIG. 2A.

When the position of the contact hole 31a is misaligned with the position of the plug 22 as described above, a portion, near the upper portion of the plug 22, of the interlayer insulating film 21 is etched when the contact hole 31a is formed, and thus a depression 21a is generated. Usually, when the formation of the contact hole 31a is completed, a barrier metal (glue layer) is formed on the entire surface to cover the wall surface of the contact hole 31a. However, as depicted in FIG. 2B, in the portion where the depression 21a is formed, the barrier metal 33g is not filled into the bottom of the depression 21a. Accordingly, the depression 21a is left unfilled.

When moisture or impurities accumulate(s) in this depression 21a, the moisture or impurities diffuse(s) into the interlayer insulating films 21 and 31 during a heat treatment process performed thereafter, and reaches the ferroelectric film 27. This causes serious deterioration of the characteristic of the ferroelectric capacitor 30. In addition, even if a semiconductor device has no problems right after being manufactured, long term use of the semiconductor device may cause the moisture or impurities to diffuse into the interlayer insulating films 21 and 31, and thereby lead to deterioration of the characteristics of the ferroelectric capacitor 30 or the transistor T.

The size of the plug 22 may be further increased in order to prevent the depression 21a from being generated. However, if so, a problem arises that the size reduction of a semiconductor device is disturbed.

Patent document 1: Japanese Laid-open Patent Publication No. 2001-210711
Patent document 2: Japanese Laid-open Patent Publication No. 10-289950
Patent document 3: Japanese Laid-open Patent Publication No. 05-243517
Patent document 4: Japanese Laid-open Patent Publication No. 08-236476

SUMMARY

According to an aspect of the embodiments, a semiconductor device includes a semiconductor substrate, a transistor formed in the semiconductor substrate, a first insulating film formed on the semiconductor substrate to cover the transistor, an etching stopper film formed on the first insulating film, a first plug formed by filling a conductive material into a contact hole extending from an upper surface of the etching stopper film and reaching an impurity region constituting the transistor, a ferroelectric capacitor formed on the etching stopper film, a second insulating film formed on the etching stopper film to cover the ferroelectric capacitor, and a second plug formed by filling a conductive material into a contact hole extending from an upper surface of the second insulating film and reaching the first plug.

According to another aspect of the embodiments, a method for manufacturing the semiconductor device includes forming a transistor in a semiconductor substrate, forming a first insulating film on the semiconductor substrate, the first insulating film covering the transistor, forming an etching stopper film on the first insulating film, forming a first contact hole extending from an upper surface of the etching stopper film and reaching an impurity region constituting the transistor, forming a first plug by filling a conductive material into the first contact hole, forming a ferroelectric capacitor on the etching stopper film, the ferroelectric capacitor including a lower electrode, a ferroelectric film, and an upper electrode, forming a second insulating film on the etching stopper film, the second insulating film covering the ferroelectric capacitor, forming a second contact hole extending from an upper surface of the second insulating film and reaching the first plug by an etching method, and forming a second plug by filling a conductive material into the second contact hole.

According to a further aspect of the embodiments, a semiconductor device includes a semiconductor substrate, a transistor formed in the semiconductor substrate, a first insulating film formed on the semiconductor substrate to cover the transistor, an etching stopper film formed on the first insulating film, a second insulating film formed on the etching stopper film, a first plug formed by filling a conductive material into a contact hole extending from an upper surface of the second insulating film and reaching an impurity region constituting the transistor, a ferroelectric capacitor formed on the second insulating film, a third insulating film formed on the second insulating film to cover the ferroelectric capacitor, and a second plug formed by filling a conductive material into a contact hole extending from an upper surface of the third insulating film and reaching the first plug.

According to a still further aspect of the embodiments, a method for manufacturing a semiconductor device includes forming a transistor in a semiconductor substrate, forming a first insulating film on the semiconductor substrate, the first insulating film covering the transistor, forming an etching stopper film on the first insulating film, forming a second insulating film on the etching stopper film, forming a first contact hole extending from an upper surface of the second insulating film and reaching an impurity region constituting the transistor, forming a first plug by filling a conductive material into the first contact hole, forming a ferroelectric capacitor on the second insulating film, the ferroelectric capacitor including a lower electrode, a ferroelectric film, and an upper electrode, forming a third insulating film on the second insulating film, the third insulating film covering the ferroelectric capacitor, forming a second contact hole extending from an upper surface of the third insulating film and reaching the first plug by an etching method, and forming a second plug by filling a conductive material into the second contact hole.

According to a yet still further aspect of the embodiments, a semiconductor device includes a semiconductor substrate, a transistor formed in the semiconductor substrate, a first insulating film formed on the semiconductor substrate to cover the transistor, an etching stopper film formed on the first insulating film, a first contact hole extending from an upper surface of the etching stopper film and reaching an impurity region of the transistor, a second insulating film formed on the etching stopper film and having an opening in a position aligned with the first contact hole, the opening having a diameter larger than a diameter of the contact hole, a first plug formed by filling a conductive material into the first contact hole and the opening, a ferroelectric capacitor formed on the second insulating film, a third insulating film formed on the second insulating film to cover the ferroelectric capacitor, a second contact hole extending from an upper surface of the third insulating film and reaching the first plug, and a second plug formed by filling a conductive material into the second contact hole.

According to a yet still further aspect of the embodiments, a method for manufacturing a semiconductor device includes forming a transistor in a semiconductor substrate, forming a first insulating film on the semiconductor substrate, the first insulating film covering the transistor, forming an etching stopper film on the first insulating film, forming a second insulating film on the etching stopper film, forming an opening in the second insulating film, the opening allowing the etching stopper film to be exposed, forming a first contact hole inside the opening, the first contact hole extending from an upper surface of the etching stopper film, reaching an impurity region of the transistor, and having a diameter smaller than a diameter of the opening, forming a first plug by filling a conductive material into the first contact hole and the opening, forming a ferroelectric capacitor on the second insulating film, the ferroelectric capacitor including a lower electrode, a ferroelectric film, and an upper electrode, forming a third insulating film on the second insulating film, the third insulating film covering the ferroelectric capacitor, forming a second contact hole by an etching method, the second contact hole extending from an upper surface of the third insulating film and reaching the first plug, and forming a second plug by filling a conductive material into the second contact hole.

According to a yet still further aspect of the embodiments, a method for manufacturing a semiconductor device includes forming a transistor in a semiconductor substrate, forming a first insulating film on the semiconductor substrate, the first insulating film covering the transistor, forming an etching stopper film on the first insulating film, forming a first contact hole extending from an upper surface of the etching stopper film and reaching an impurity region of the transistor, forming a plug axis part by filling a conductive material into the first contact hole, forming a second insulating film on the etching stopper film, etching the second insulating film to form an opening in which the plug axis part is exposed and which has a diameter larger than a diameter of the plug axis part, filling a conductive material into the opening to form a plug head part constituting, integrally with the plug axis part, a first plug, forming a ferroelectric capacitor on the second insulating film, the ferroelectric capacitor including a lower electrode, a ferroelectric film, and an upper electrode, forming a third insulating film on the second insulating film, the third insulating film covering the ferroelectric capacitor, forming a second contact hole by an etching method, the second contact hole extending from an upper surface of the third insulating film and reaching the first plug, and forming a second plug by filling a conductive material into the second contact hole.

According to a yet still further aspect of the embodiments, a method for manufacturing a semiconductor device includes forming a transistor in a semiconductor substrate, forming a first insulating film on the semiconductor substrate, the first insulating film covering the transistor, forming an etching stopper film on the first insulating film, forming a first contact hole extending from an upper surface of the etching stopper film and reaching an impurity region of the transistor, forming a plug axis part by filling a conductive material into the first contact hole, forming a conductive film on the etching stopper film and the plug axis part, patterning the conductive film to form a plug head part constituting, integrally with the plug axis part, a first plug and having a diameter larger than a diameter of the plug axis part, forming a second insulating film on an entire upper surface of the semiconductor substrate, polishing the second insulating film to expose the first plug, forming a ferroelectric capacitor on the second insulating film, the ferroelectric capacitor including a lower electrode, a ferroelectric film, and an upper electrode, forming a third insulating film on the second insulating film, the third insulating film covering the ferroelectric capacitor, forming a second contact hole by an etching method, the second contact hole extending from an upper surface of the third insulating film and reaching the first plug, and forming a second plug by filling a conductive material into the second contact hole.

According to a yet still further aspect of the embodiments, a semiconductor device includes a semiconductor substrate, a transistor formed on the semiconductor substrate, a first insulating film formed on the semiconductor substrate to cover the transistor, a ferroelectric capacitor formed on the first insulating film, a second insulating film formed on the first insulating film to cover the ferroelectric capacitor, an etching stopper film formed on the second insulating film, a first contact hole extending from an upper surface of the etching stopper film and reaching an impurity region of the transistor, a first plug formed by filling a conductive material into the first contact hole, a third insulating film formed on the etching stopper film, a second contact hole extending from an upper surface of the third insulating film and reaching the first plug, and a second plug formed by filling a conductive material into the second contact hole.

According to a yet still further aspect of the embodiments, a method for manufacturing a semiconductor device includes forming a transistor in a semiconductor substrate, forming a first insulating film on the semiconductor substrate, the first insulating film covering the transistor, forming a ferroelectric capacitor on the first insulating film, the ferroelectric capacitor including a lower electrode, a ferroelectric film, and an upper electrode, forming a second insulating film on the first insulating film, the second insulating film covering the ferroelectric capacitor, forming an etching stopper film on the second insulating film, forming a first contact hole extending from an upper surface of the etching stopper film and reaching an impurity region of the transistor, forming a first plug by filling a conductive material into the first contact hole, forming a third insulating film on the etching stopper film, forming a second contact hole by an etching method, the second contact hole extending from an upper surface of the third insulating film and reaching the first plug, and forming a second plug by filling a conductive material into the second contact hole.

According to a yet still further aspect of the embodiments, a semiconductor device includes a semiconductor substrate, a transistor formed in the semiconductor substrate, a first insulating film formed on the semiconductor substrate to cover the transistor, a ferroelectric capacitor formed on the first insulating film, a second insulating film formed on the first insulating film to cover the ferroelectric capacitor, an etching stopper film formed on the second insulating film, a third insulating film formed on the etching stopper film, a first contact hole extending from an upper surface of the third insulating film and reaching an impurity region of the transistor, a first plug formed by filling a conductive material into the first contact hole, a fourth insulating film formed on the third insulating film, a second contact hole extending from an upper surface of the fourth insulating film and reaching the first plug, and a second plug formed by filling a conductive material into the second contact hole.

According to a yet still further aspect of the embodiments, a method for manufacturing a semiconductor device includes forming a transistor in a semiconductor substrate, forming a first insulating film on the semiconductor substrate, the first insulating film covering the transistor, forming a ferroelectric capacitor on the first insulating film, the ferroelectric film including a lower electrode, a ferroelectric film, and an upper electrode, forming a second insulating film on the first insulating film, the second insulating film covering the ferroelectric capacitor, forming an etching stopper film on the second insulating film, forming a third insulating film on the etching stopper film, forming a first contact hole extending from an upper surface of the third insulating film and reaching an impurity region of the transistor, forming a first plug by filling a conductive material into the first contact hole, forming a fourth insulating film on the third insulating film, forming a second contact hole by an etching method, the second contact hole extending from an upper surface of the fourth insulating film and reaching the first plug, and forming a second plug by filling a conductive material into the second contact hole.

According to a yet still further aspect of the embodiments, a semiconductor device includes a semiconductor substrate, a transistor formed in the semiconductor substrate, a first insulating film formed on the semiconductor substrate to cover the transistor, a ferroelectric capacitor formed on the first insulating film, a second insulating film formed on the first insulating film to cover the ferroelectric capacitor, an etching stopper film formed on the second insulating film, a first contact hole extending from an upper surface of the etching stopper film and reaching an impurity region of the transistor, a third insulating film formed on the etching stopper film and having an opening in a position aligned with the first contact hole, the opening having a diameter larger than a diameter of the first contact hole, a first plug formed by filling a conductive material into the first contact hole and the opening, a fourth insulating film formed on the third insulating film, a second contact hole extending from an upper surface of the fourth insulating film and reaching the first plug, and a second plug formed by filling a conductive material into the second contact hole.

According to a yet still further aspect of the embodiments, a method for manufacturing a semiconductor device includes forming a transistor in a semiconductor substrate, forming a first insulating film on the semiconductor substrate, the first insulating film covering the transistor, forming a ferroelectric capacitor on the first insulating film, the ferroelectric film including a lower electrode, a ferroelectric film, and an upper electrode, forming a second insulating film on the first insulating film, the second insulating film covering the ferroelectric capacitor, forming an etching stopper film on the second insulating film, forming a third insulating film on the etching stopper film, forming an opening in the third insulating film, the opening allowing the etching stopper film to be exposed, forming a first contact hole inside the opening, the first contact hole extending from an upper surface of the etching stopper film, reaching an impurity region of the transistor and having a diameter smaller than a diameter of the opening, forming a first plug by filling a conductive material into the first contact hole and the opening, forming a fourth insulating film on the third insulating film, forming a second contact hole by an etching method, the second contact hole extending from an upper surface of the fourth insulating film and reaching the first plug, and forming a second plug by filling a conductive material into the second contact hole.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 8A to 8F are cross-sectional views depicting a first method for manufacturing a semiconductor device according to the fourth embodiment.

DESCRIPTION OF EMBODIMENTS

Embodiments of the present invention will be described below by referring to the accompanying drawings.

(First Embodiment)

Figure 3:
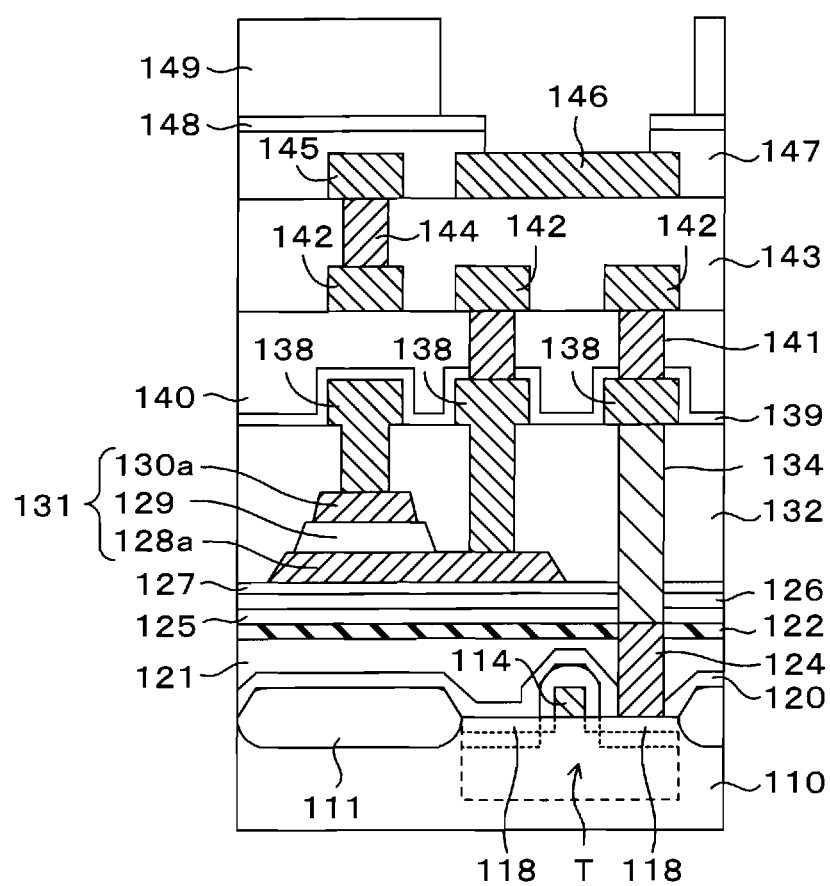
FIG. 3 is a schematic view depicting the structure of a semiconductor device according to a first embodiment.

FIG. 3 is a schematic view depicting the structure of a semiconductor device according to a first embodiment. A semiconductor substrate 110 is separated into multiple element regions by an element isolation film 111. A transistor T and other elements, which constitute an electronic circuit, are formed in each element region.

The transistor T includes a pair of high concentration impurity regions 118, each of which is formed by selectively injecting an impurity into the semiconductor substrate 110, a gate insulating film (unillustrated) formed on a region between the pair of these high concentration impurity regions 118, and a gate electrode 114 formed on the gate insulating film. A stopper layer 120 is formed on the semiconductor substrate 110. This stopper layer 120 covers the transistor T and the element isolation film 111. In addition, a first interlayer insulating film 121 is formed on the stopper layer 120. The upper surface of this interlayer insulating film 121 is subjected to a planarizing process. Formed on this interlayer insulating film 121 is an etching stopper film 122 made of SiON.

A plug 124 reaching one of the high concentration impurity regions 118 of the transistor T from the upper surface of the etching stopper film 122 is formed inside the interlayer insulating film 121. In addition, on the etching stopper film 122, a SiON film 125, a TEOS (oxide silicon) film 126, a hydrogen barrier film 127 made of aluminum oxide (for example, $Al_2O_3$) are formed in this order from the bottom.

Formed on the hydrogen barrier film 127 is a ferroelectric capacitor 131 with the structure in which a lower electrode 128a, a ferroelectric film 129, and an upper electrode 130a are stacked in this order from the bottom. This ferroelectric capacitor 131 is covered with a second interlayer insulating film 132 formed on the hydrogen barrier film 127.

The surface of the second interlayer insulating film 132 is planarized and wirings 138 of a first wiring layer are formed on this interlayer insulating film 132 to be in predetermined patterns. One of these wirings 138 is electrically connected to an upper electrode 129a through a contact hole, extending from the upper surface of the interlayer insulating film 132 and reaching the upper electrode 129a of the ferroelectric capacitor 131. Another one is electrically connected to a lower electrode 128a through a contact hole extending from the upper surface of the interlayer insulating film 132 and reaching the lower electrode 128a of the ferroelectric capacitor 131. Still another one is electrically connected to the plug 124 and the high concentration impurity region 118 through a plug 134 penetrating the interlayer insulating film 132 in the vertical direction.

A hydrogen barrier film 139 made of aluminum oxide (for example, $Al_2O_3$) is formed on the interlayer insulating film 132 and the wiring 138 of the first wiring layer. A third interlayer insulating film 140 is formed on the hydrogen barrier film 139. Multiple plugs 141 are formed inside this interlayer insulating film 140. The multiple plugs 141 penetrate through the interlayer insulating film 140 in the vertical direction to be electrically connected to the wirings 138 of the first wiring layer. In addition, multiple wirings 142 of a second wiring layer are formed on the interlayer insulating film 140. As depicted in FIG. 3, a predetermined wiring of these wirings 142 is electrically connected to the wiring 138 of the first wiring layer through the plug 141.

On the third interlayer insulating film 140 and the wirings 142 of the second wiring layer, a fourth interlayer insulating film 143 is formed. Multiple plugs 144 (only one is depicted in FIG. 3) are formed inside this fourth interlayer insulating film 143. The multiple plugs 144 penetrate through the interlayer insulating film 143 in the vertical direction to be electrically connected to the wirings 142 of the second wiring layer. In addition, wirings 145 of a third wiring layer and a terminal 146 are formed on the interlayer insulating film 143. A predetermined wiring of these wirings 145 of the third wiring layer is electrically connected to the wiring 142 of the second wiring layer through the plug 144.

On the fourth interlayer insulating film 143 and the wirings 145 of the third wiring layer, a first passivation film 147, a second passivation film 148, and a protection film 149 are stacked in this order from the bottom. After that, the first passivation film 147, the second passivation film 148, and the protection film 149, which are formed on the terminal 146, are selectively removed to expose the surface of the terminal 146.

As described above, the semiconductor device of the present embodiment is characterized in that the etching stopper film 122 made of SiON is formed on the first interlayer insulating film 121, the plug 124 is formed from the upper surface of the etching stopper film 122 to the high concentration impurity region 118, and a connected portion of the plug 124 and the plug 134 is positioned on the same plane as the upper surface of the etching stopper film 122.

The semiconductor device of the present embodiment has the connected portion of the plug 124 and the plug 134 on the same plane as the upper surface of the etching stopper film 122. Accordingly, when the plug 134 is formed, in other words, when the contact hole continuing to the plug 124 is formed in the interlayer insulating film 132, the interlayer insulating film 121 is prevented from being etched.

Note that the hydrogen barrier films 127 and 139 are provided for preventing moisture and hydrogen in the interlayer insulating film 121 or the interlayer insulating film 140 from moving into the ferroelectric capacitor 131 to deteriorate the characteristic of the ferroelectric capacitor 131. In addition, as depicted in FIG. 3, forming the lower electrode 128a on the hydrogen barrier film 127 made of aluminum oxide ($Al_2O_3$) also is effective in improving the orientation of the lower electrode 128a as well as the orientation of the ferroelectric film 129 to be formed thereon. In the present invention, these hydrogen barrier films 127 and 139 are not essential. However, providing the hydrogen barrier films 127 and 139 as depicted in FIG. 3 is preferable in order to maintain the characteristic of the ferroelectric capacitor 131 over a long period of time.

Figure 4B:
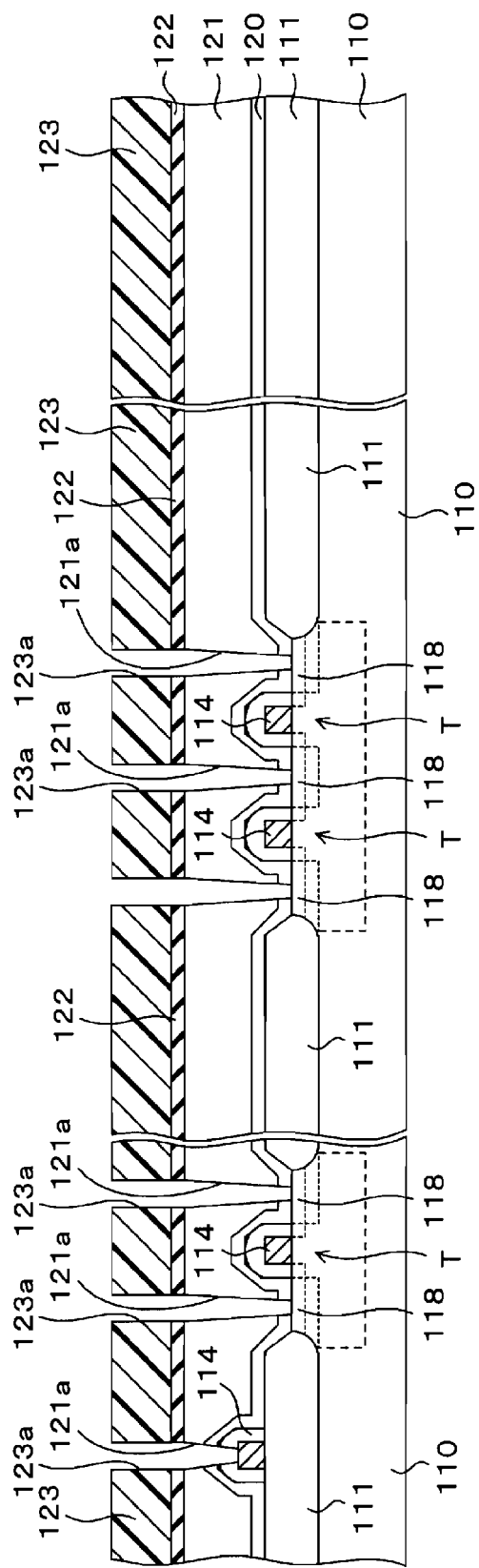
FIGS. 4A to 4R are cross-sectional views depicting a method for manufacturing a semiconductor device according to the first embodiment.
Figure 4D:
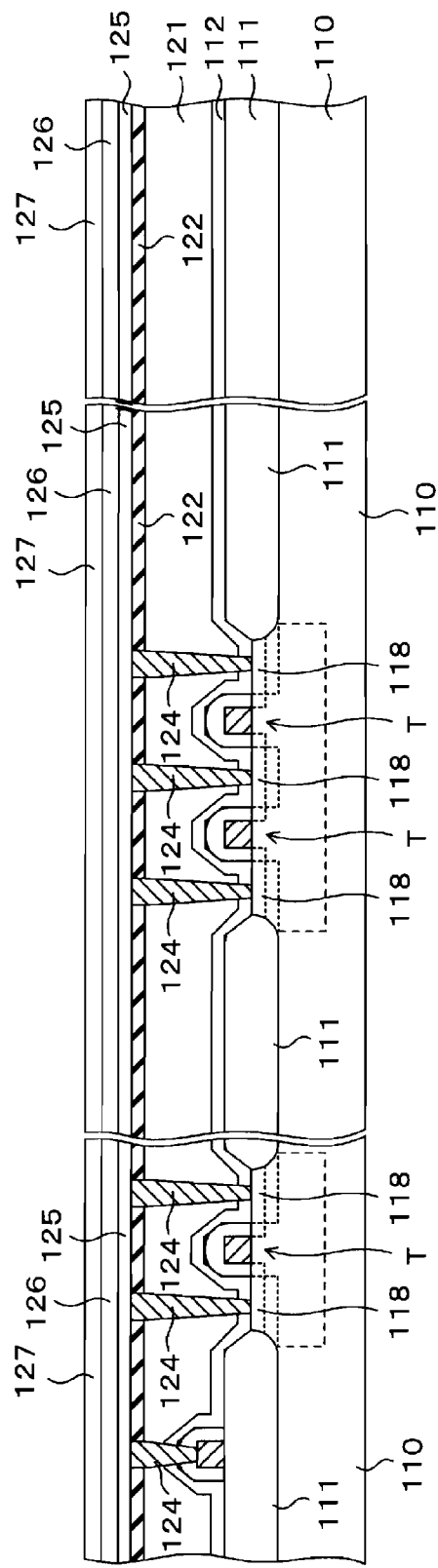
Figure 4E:
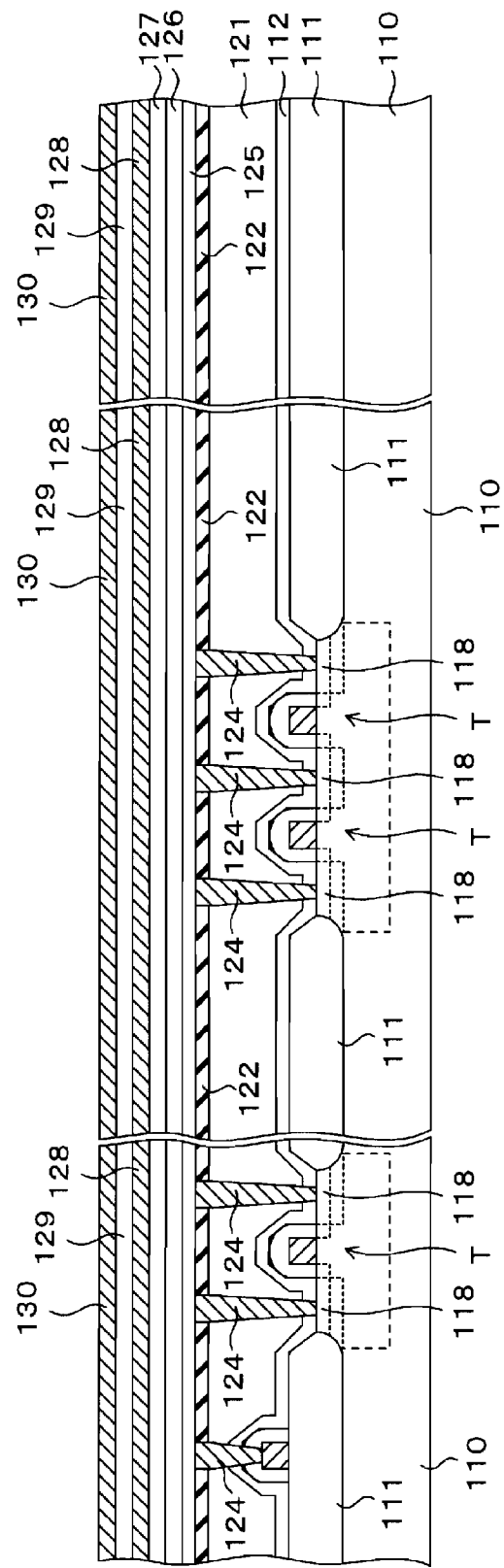
Figure 4F:
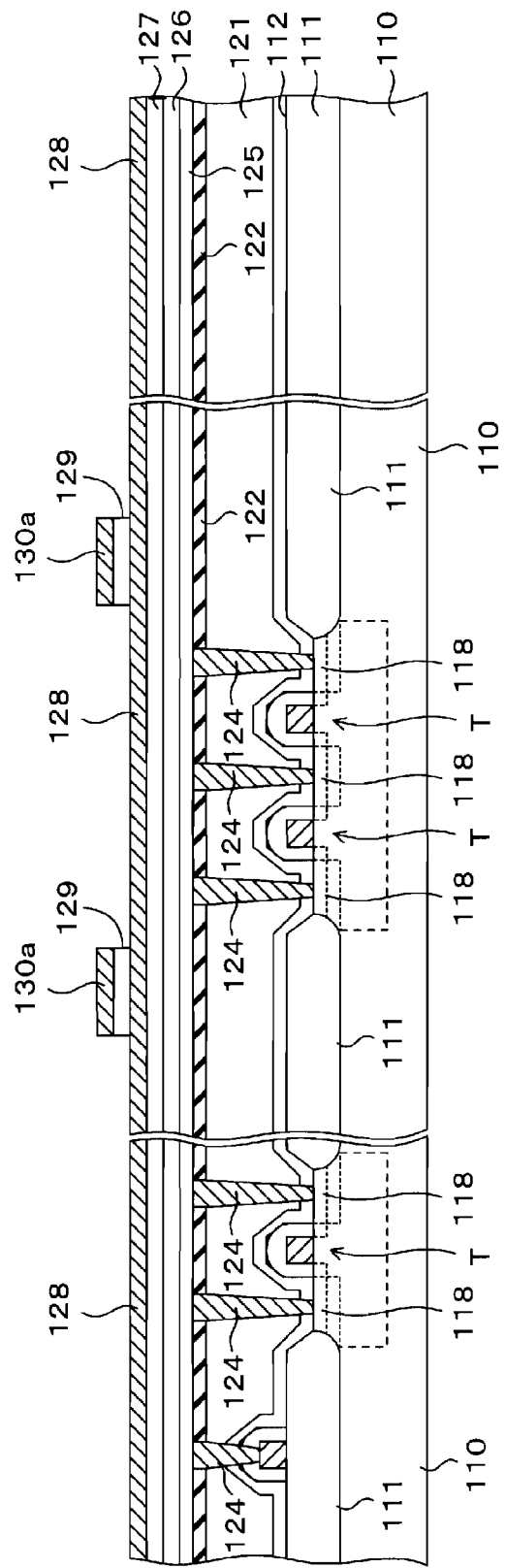
Figure 4G:
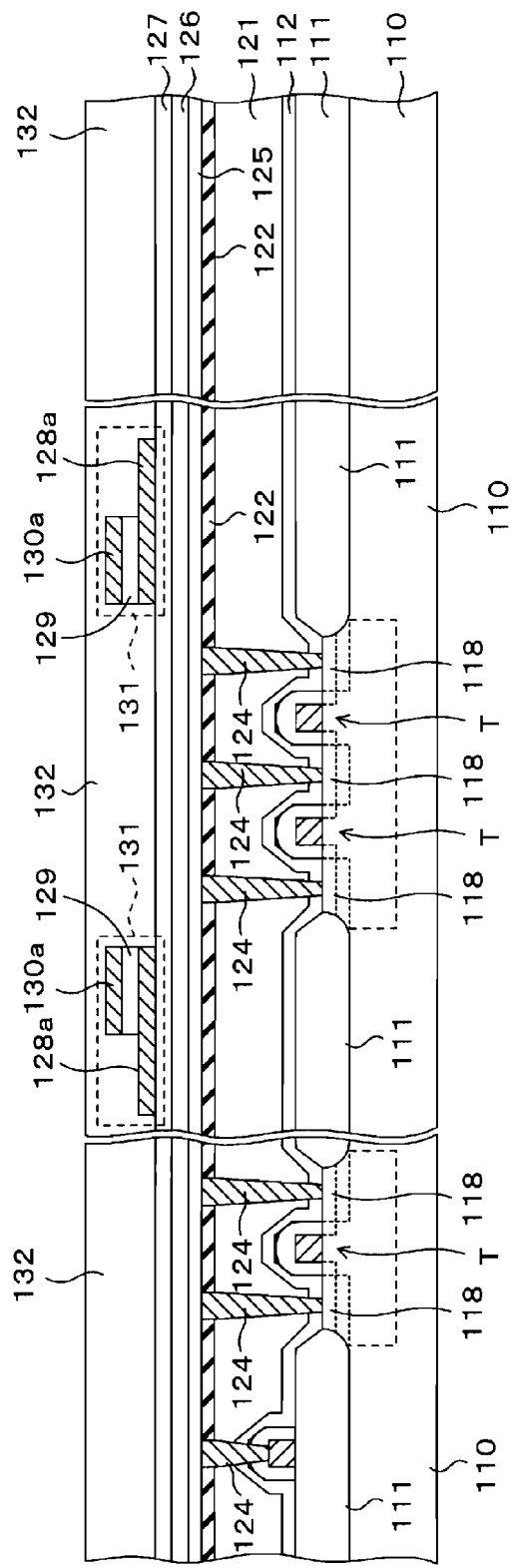
Figure 4H:
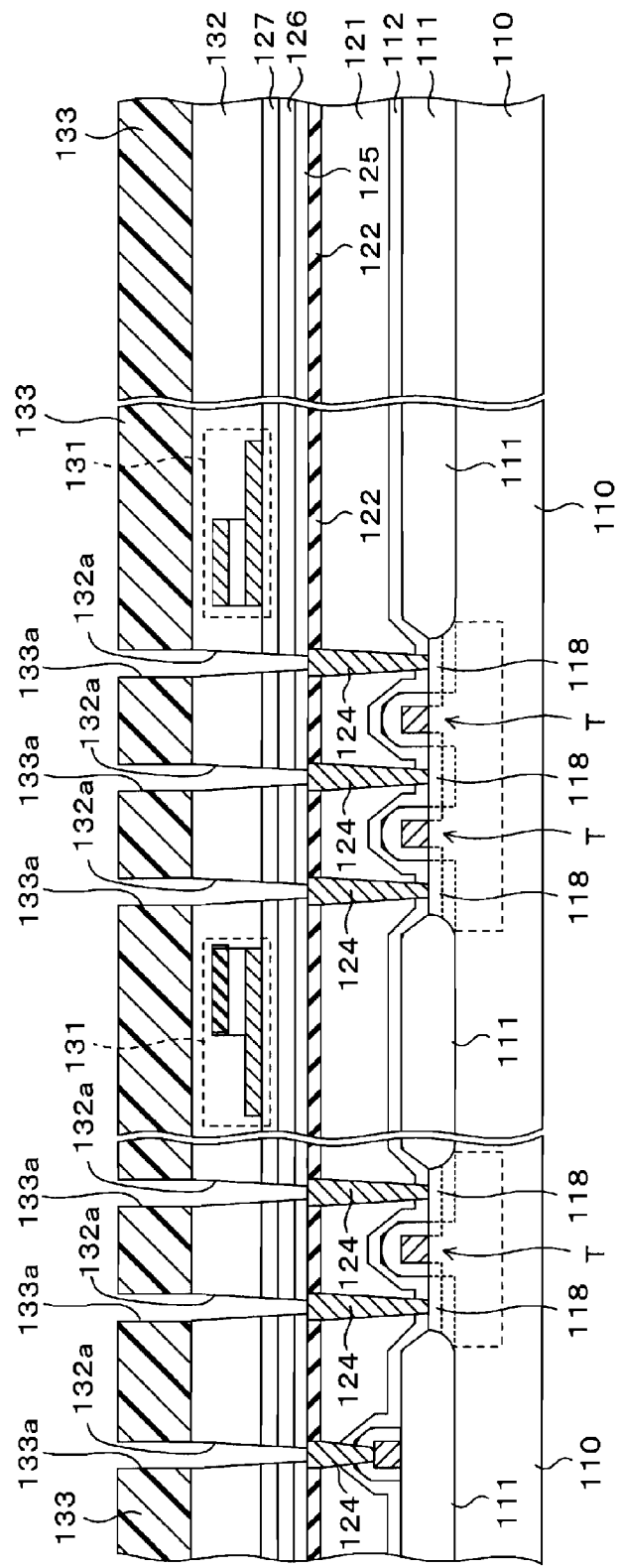
Figure 4J:
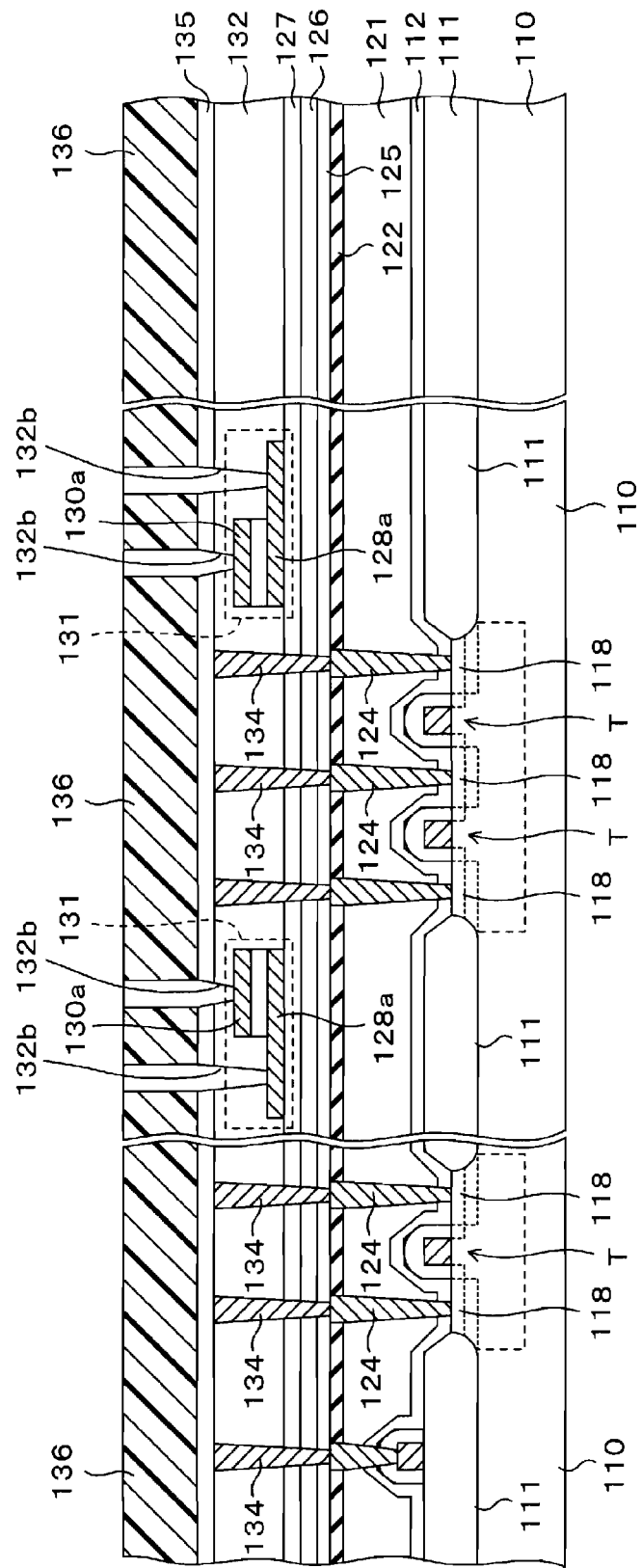
Figure 4K:
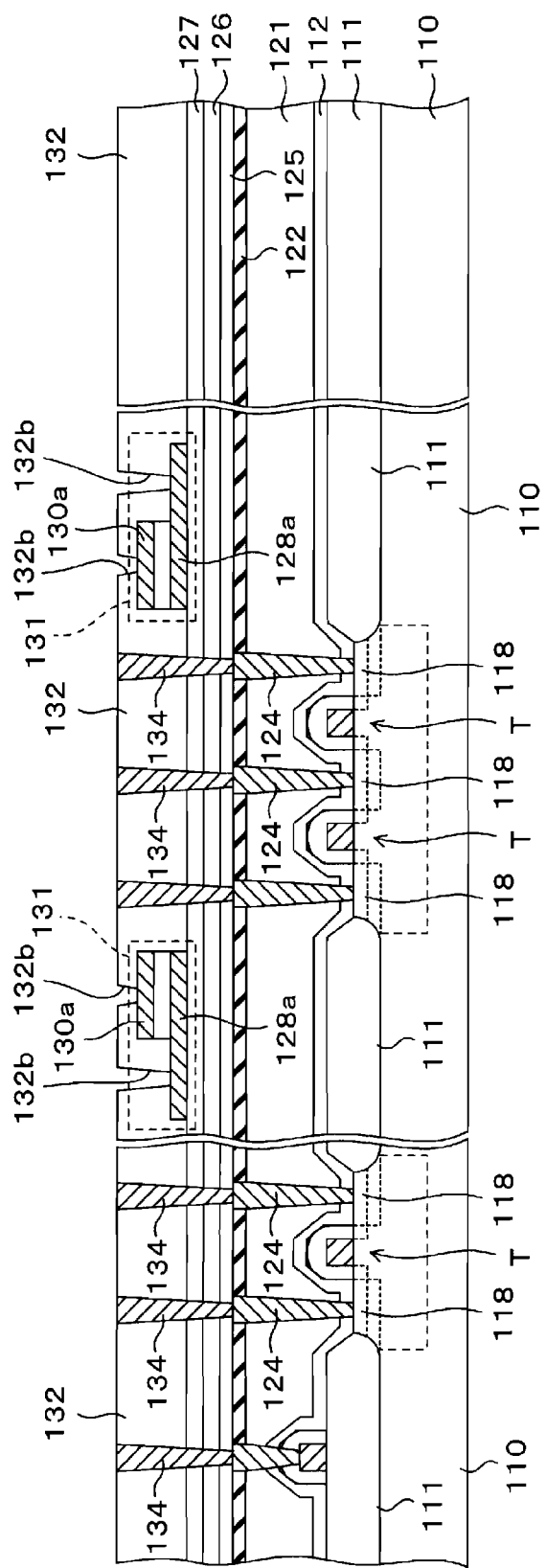
Figure 4L:
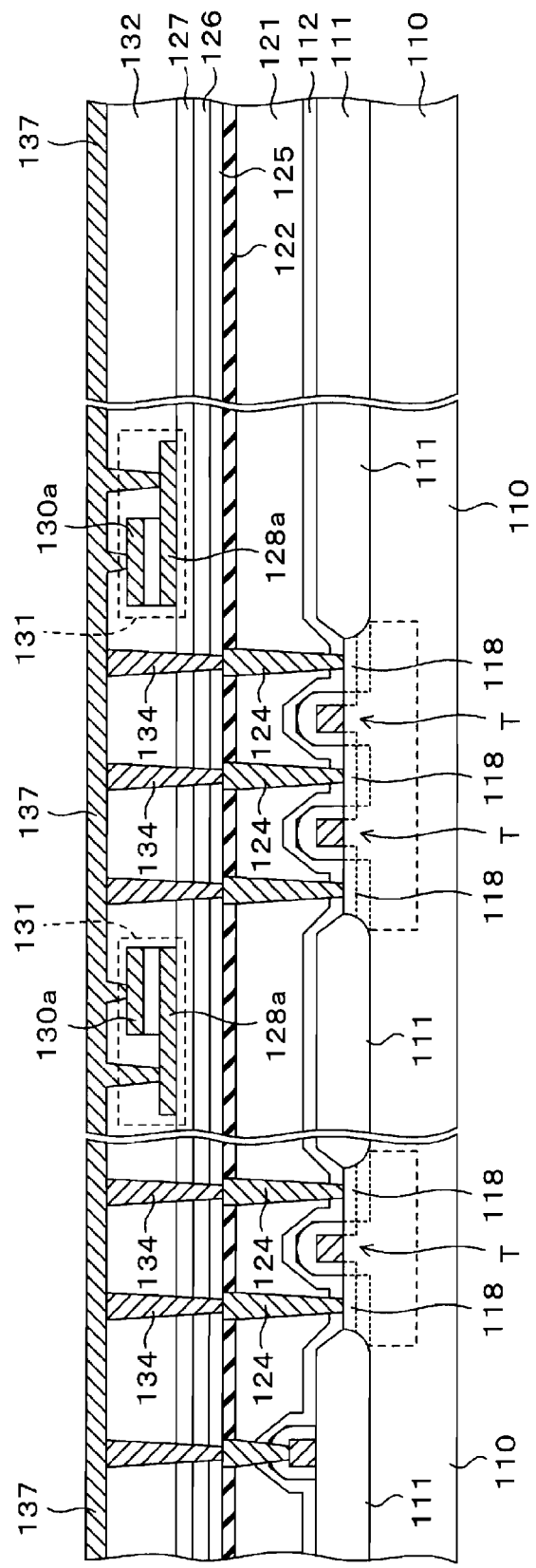
Figure 4M:
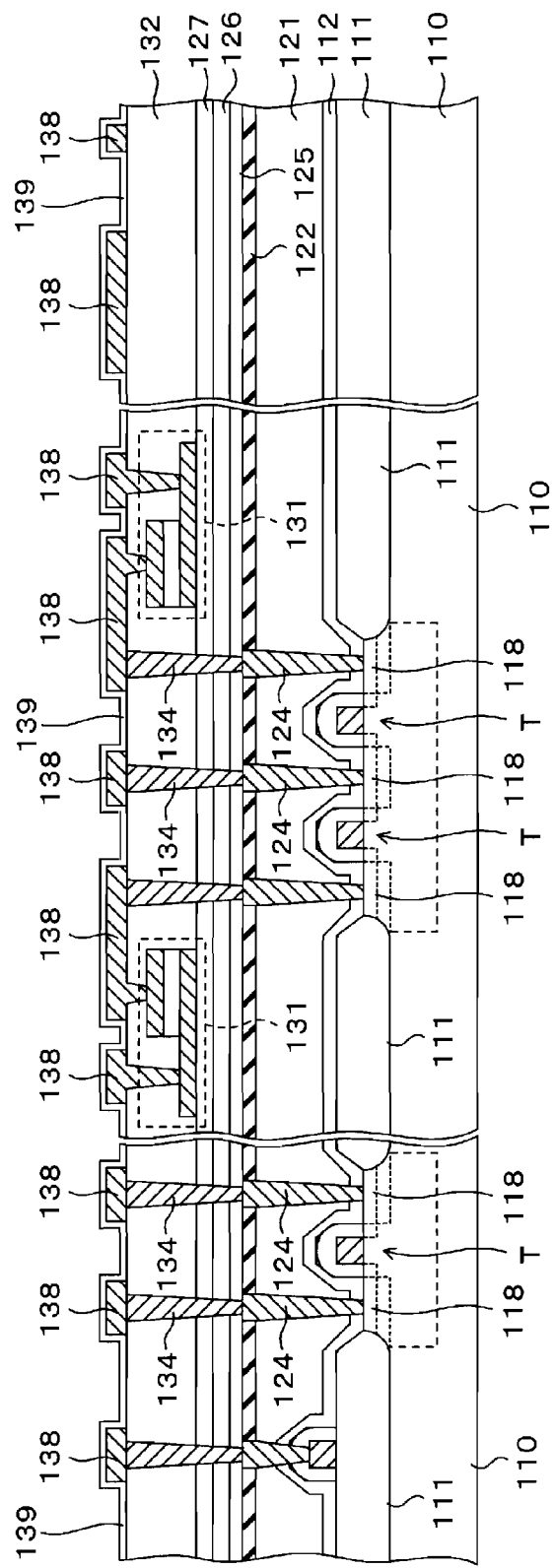
Figure 4N:
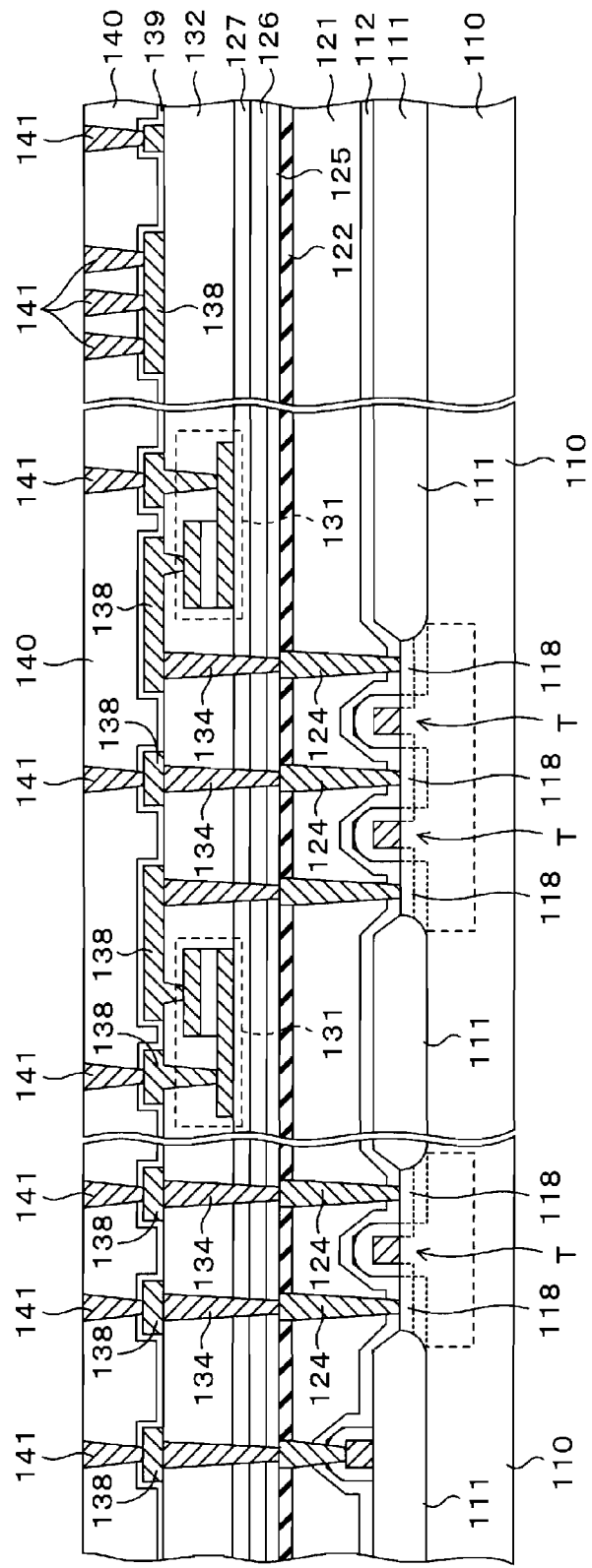
Figure 40:
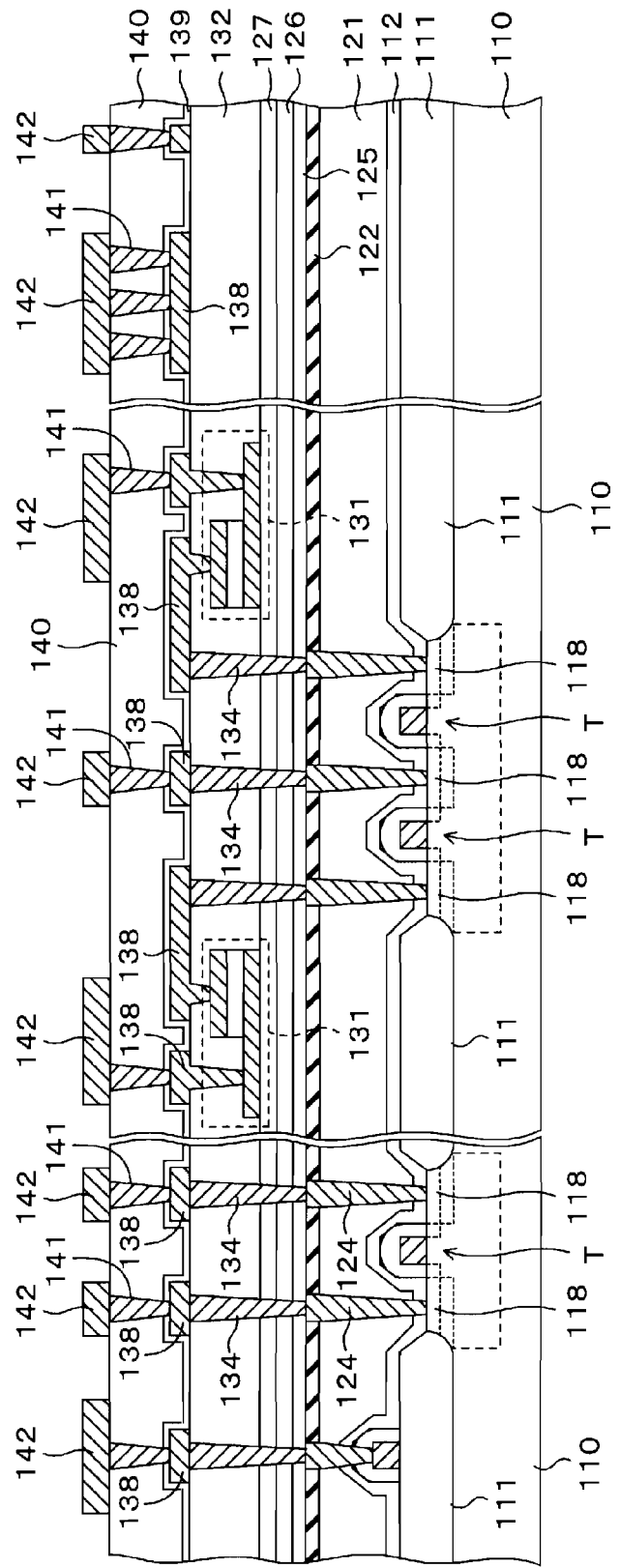
Figure 4P:
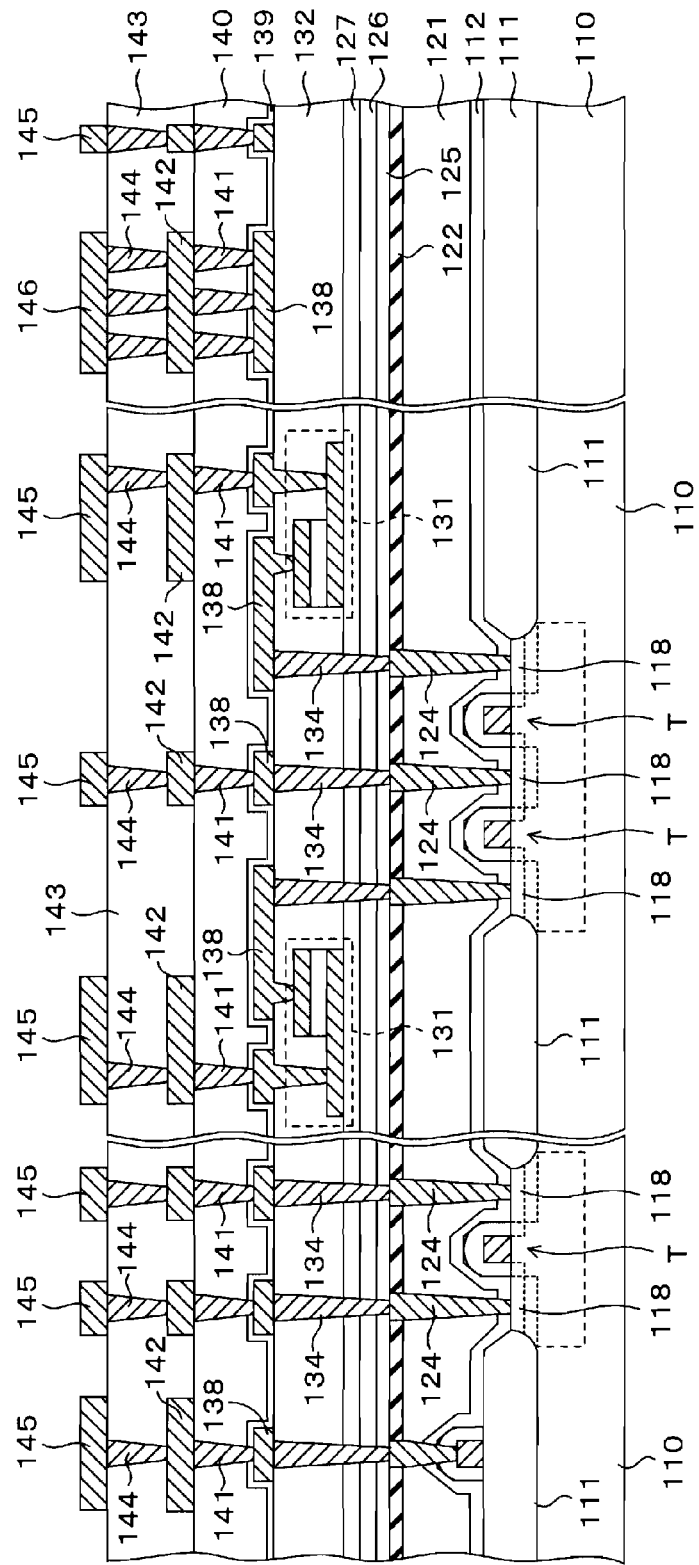
Figure 4Q:
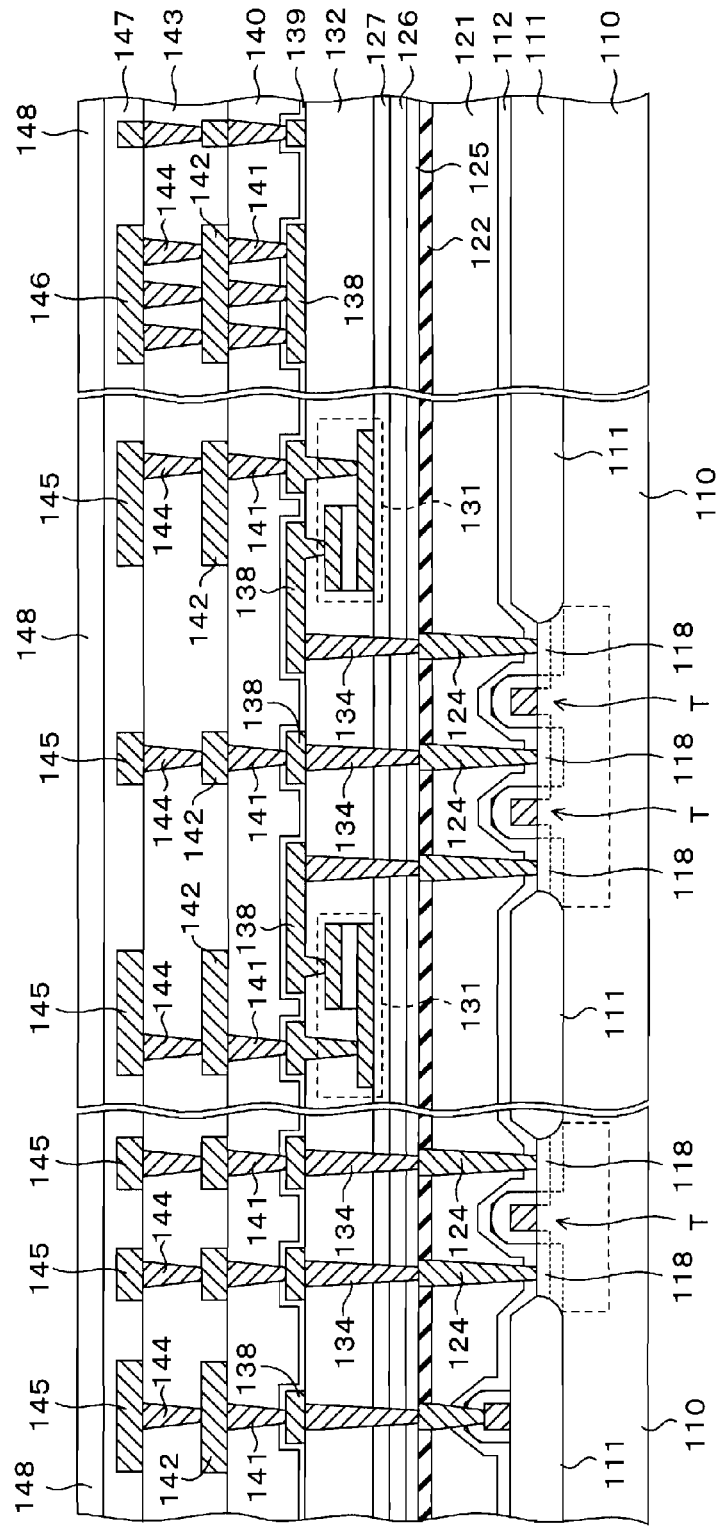
Figure 4R:
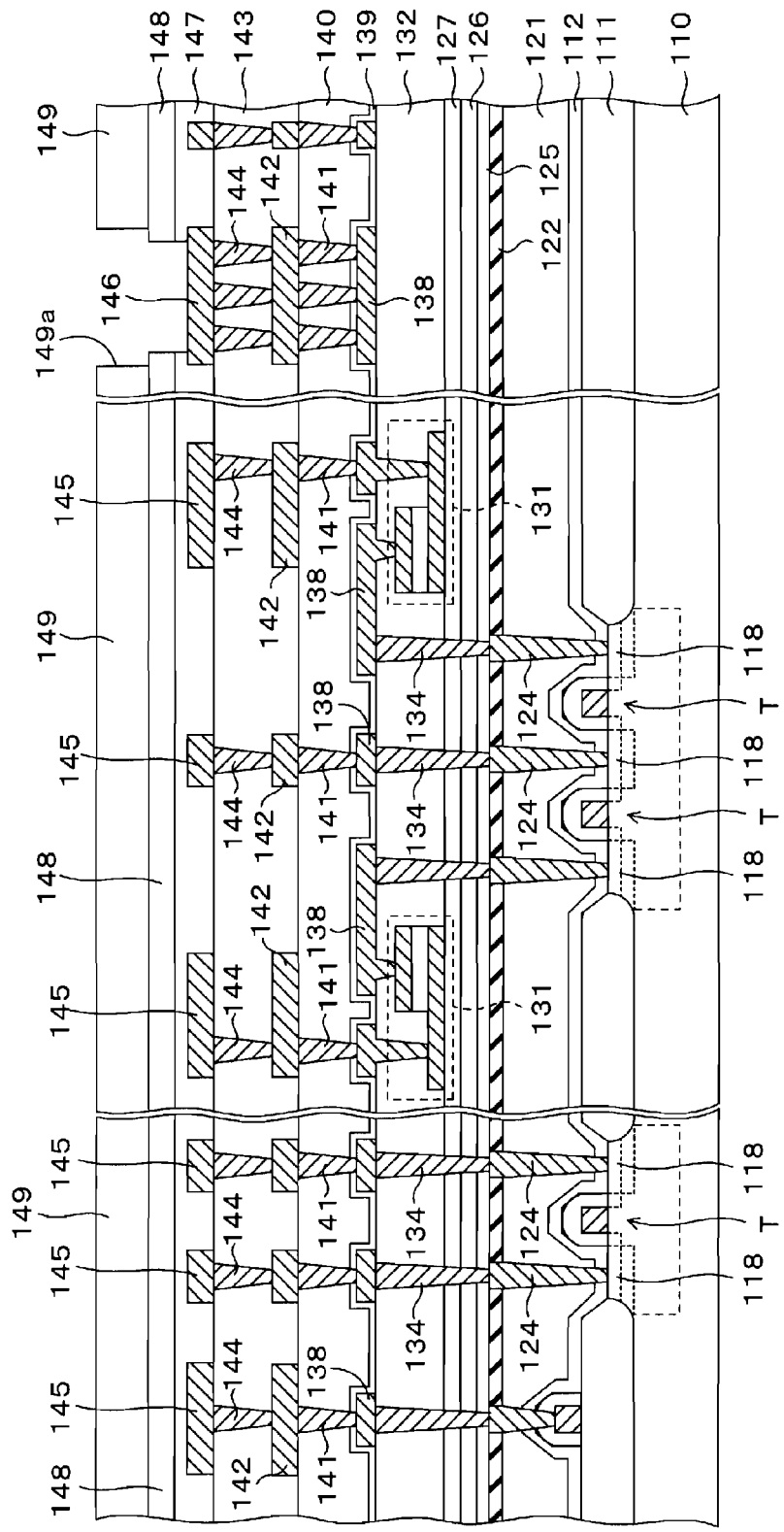

FIGS. 4A to 4R are cross-sectional views depicting a method for manufacturing a semiconductor device according to the first embodiment in the order of processes. Note that, the following description illustrates an example in which the embodiment is applied to the manufacture of a FeRAM having a planar-type ferroelectric capacitor. In addition, FIGS. 4A to 4R depict cross sections in a peripheral circuit forming region, a memory cell forming region, and a terminal forming region. Furthermore, it is assumed in the following description that a memory cell consists of an n-type transistor.

Firstly, the process to form the structure depicted in FIG. 4A will be described. An element isolation film 111 is formed in a predetermined region of a semiconductor substrate (silicon substrate) 110 by the well-known LOCOS (Local Oxidation of Silicon) method, so that this element isolation film 111 separates the semiconductor substrate 110 into multiple element regions. The element isolation film 111 may be formed by the well-known STI (Shallow Trench Isolation) method.

Subsequently, a p-type impurity such as boron (B) is introduced into an n-type transistor forming region (n-type transistor forming regions in the memory cell forming region and the peripheral circuit forming region; same goes for the following expression) in the semiconductor substrate 110 to form a p-well 112. In addition, an n-type impurity such as phosphorus (P) is introduced into a p-type transistor forming region (a p-type transistor forming region in the peripheral circuit forming region; same goes for the following expression) in the semiconductor substrate 110 to form an n-well (unillustrated).

Thereafter, the surfaces of the p-well 112 and the n-well (unillustrated) are thermally oxidized to form a gate insulating film (unillustrated). After that, a silicon film (a polysilicon film or an amorphous silicon film) is formed on the entire upper surface of the semiconductor substrate 110 by the CVD (Chemical Vapor Deposition) method. This silicon film is patterned by the photolithography method to form a gate electrode (silicon wiring) 114.

Note that it is preferable that a gate electrode into which an n-type impurity is introduced be formed above the p-well 122 and a gate electrode into which a p-type impurity is introduced be formed above the n-well (unillustrated). In addition, as depicted in FIG. 4A, in the memory cell forming region, two gate electrodes 114 are disposed so as to be parallel to each other on a single p-well 112.

After that, using the gate electrode 114 as a mask, an n-type impurity such as phosphorus (P) or arsenic (As) is shallowly ion-implanted into the p-well 112 in the n-type transistor forming region, so that an n-type low concentration impurity region 116 is formed. Similar to this, using the gate electrode 114 as a mask, a p-type impurity such as boron (B) is shallowly ion-implanted into the n-well (unillustrated) in the p-type transistor forming region, so that a p-type low concentration impurity region (unillustrated) is formed.

Subsequently, sidewalls 117 are formed on both sides of the gate electrode 114. These sidewalls 117 are formed in the following manner. An insulating film made of $SiO_2$, SiN, or the like is formed on the entire upper surface of the semiconductor substrate 110 by the CVD method. Thereafter, the insulating film is etched back to form the sidewalls 117.

After that, using the gate electrode 114 and the sidewall 117 as masks, an n-type impurity such as phosphorus (P) or arsenic (As) is ion-implanted into the p-well 112 in the n-type transistor forming region, so that an n-type high concentration impurity region 118 is formed. Similar to this, using the gate electrode in the p-type transistor forming region and the sidewall as masks, a p-type impurity such as boron (B) is ion-implanted into the n-well (unillustrated), so that a p-type high concentration impurity region (unillustrated) is formed. In this manner, the transistor T having source/drain with the LDD (Lightly Doped Drain) structure is formed in each transistor forming region.

Note that it is preferable to form a metal silicide layer made of a material such as cobalt silicide or titanium silicide, as a contact layer on the surfaces of the gate electrode 114 and the n-type high concentration impurity region 118.

Next, as the stopper layer 120, a SiON film, for example, is formed by the plasma CVD method to be 200 nm in thickness on the entire upper surface of the semiconductor substrate 110. In addition, as the first interlayer insulating film 121, a TEOS-NSG (Tetra-Ethyl-Ortho-Silicate-Nondoped Silicate Glass: SiO) film, for example, is formed by the plasma CVD method to be 600 nm in thickness on the stopper layer 120. After that, the interlayer insulating film 121 is polished by approximately 200 nm using the CMP (Chemical Mechanical Polishing) method, and thus the surface thereof is planarized.

After that, an etching stopper film 122 made of SiON is formed by the CVD method to be 100 nm in thickness on the interlayer insulating film 121. This etching stopper film 122 is formed in order to prevent the first interlayer insulating film 121 from being etched in the etching process for forming contact holes in the second interlayer insulating film 132, which will be described later. This etching stopper film 122 only needs to be formed of an insulating material having a lower etching rate than that of the TEOS-NSG film constituting the second interlayer insulating film 132. For example, the etching stopper film 122 may be formed of SiN. In the present embodiment, the thickness of the etching stopper film 122 is designed to be 20 nm to 150 nm.

The etching stopper film 122 may be formed of a metal oxide such as aluminum oxide (AlxOy), titanium oxide (TiOx), zirconium oxide (ZrOx), magnesium oxide (MgOx), or MgTiOx. If the etching stopper film 122 is formed of one of these metal oxides, the etching stopper film 122 functions also as a hydrogen barrier film to prevent moisture and hydrogen contained in the interlayer insulating film 121 from diffusing into an upper layer. As a result, the reliability of FeRAM can be further improved. However, if the etching stopper film 122 is formed of any one of the above-described metal oxides, it is preferable that the film thickness be equal to or less than 100 nm. When the thickness of the etching stopper film 122 made of a metal oxide exceeds 100 nm, it is difficult to make a hole in the etching stopper film 122 when a W plug 124 is formed in a later process.

Next, the process to form the structure depicted in FIG. 4B will be described. After the etching stopper film 122 is formed in the above-described process, a photoresist is applied onto the etching stopper film 122, so that a photoresist film 123 is formed. Subsequently, this photoresist film 123 is exposed to light and developed to form, in a predetermined position, an opening 123a in which the etching stopper film 122 is exposed. After that, etching is performed by using the photoresist film 123 as a mask to form a contact hole 121a extending from the upper surface of the etching stopper film 122 and reaching the high concentration impurity region 118 (source/drain of the transistor T). The diameter of this contact hole 121a is designed to be, for example, 0.55 μm.

Note that, in the present embodiment, as depicted in FIG. 4B, formed in the peripheral circuit forming region are the contact hole 121a continuing to the high concentration impurity region 118 and the contact hole 121a extending from the upper surface of the etching stopper film 122 and reaching the gate electrode (silicon wiring) 114 on the element isolation film 111.

Next, the process to form the structure depicted in FIG. 4C will be described. After removing the photoresist film 123 used for forming the contact holes 121a, a Ti film with the thickness of 20 nm and a TiN film with the thickness of 50 nm (both of which are unillustrated) are sequentially formed by, for example, the PVD (Physical Vapor Deposition) method on the entire upper surface of the semiconductor substrate 110. As a result, the wall surface of the contact holes 121a are covered with the Ti film and the TiN film. Thereafter, W (tungsten) is deposited by, for example, the CVD method on the entire upper surface of the semiconductor substrate 110, so that a W film is formed on the etching stopper film 122 and the contact holes 121a are filled with W.

Next, the W film, the TiN film, and the Ti film which are on the etching stopper film 122 are removed by the CMP method. In this manner, W plugs 124 are formed by filling the contact holes 121a with W. In this case, as depicted in FIG. 4C, the upper surfaces of the W plugs 124 and the upper surface of the etching stopper film 122 are positioned on the same plane.

Thereafter, plasma annealing is performed in an atmosphere containing nitrogen and oxygen at the temperature of 350° C. for 2 minutes. Then, by the plasma CVD method, a SiON film 125 is formed on the entire upper surface of the semiconductor substrate 110 to be 100 nm in thickness to prevent the W plug 124 from being oxidized. Note that a SiON film formed by the plasma CVD method generally has a characteristic of being hardly permeable to moisture, and, thus, the SiON film 125 also functions as a moisture barrier layer to prevent moisture from moving in the vertical direction.

Next, the process to form the structure depicted in FIG. 4D will be described. After the moisture barrier film 125 is formed in the above-described process, a TEOS (silicon oxide) film 126 is formed by the CVD method to be 100 nm in thickness on the SiON film 125. Subsequently, as a dewatering process, a heat treatment is performed in an atmosphere with the flow rate of nitrogen being 2 litters per minute at the temperature of 650° C. for 30 minutes. Thereafter, for example by the CVD method, aluminum oxide (for example, $Al_2O_3$) is deposited on the TEOS film 126 to be 20 nm in thickness, so that a hydrogen barrier film 127 is formed. After that, a heat treatment (RTA process) is performed in an atmosphere with the flow rate of oxygen being 2 litters per minute for 60 seconds.

Next, the process to form the structure depicted in FIG. 4E will be described. After the hydrogen barrier film 127 is formed in the above-described process, a conductive film 128 serving as a lower electrode of a ferroelectric capacitor is formed on the hydrogen barrier film 127. This conductive film 128 is formed of, for example, a metal, such as Pt (platinum), Ir (iridium), Ru (ruthenium), Rh (rhodium), Re (rhenium), Os (osmium), or Pd (palladium), or an oxide of one of those metals (conductive oxide). In the present embodiment, the conductive film 128 is designed to be formed by depositing Pt using the PVD method to be 155 nm in thickness on the hydrogen barrier film 127.

Subsequently, a ferroelectric film 129 is formed on the conductive film 128. The ferroelectric film 129 may be formed of PZT, PLZT, BLT, SBT, or the like. In the present embodiment, the ferroelectric film 129 is designed to be formed by depositing PZT to be 150 to 200 nm in thickness on the conductive film 128 using the PVD method.

After forming the ferroelectric film 129 as described above, the RTA process is performed in an atmosphere containing oxygen to crystallize the ferroelectric film 129. In the present embodiment, an oxygen gas is supplied into the RTA device with the flow rate of 0.025 litters per minute and a heat treatment is performed at the temperature of, for example, 565° C. for 90 seconds.

After that, a conductive film 130 serving as an upper electrode of the ferroelectric capacitor is formed on the ferroelectric film 129. The conductive film 130 is formed of, for example, a metal such as Pt, Ir, Ru, Rh, Re, Os, or Pd, or an oxide of one of these metals (conductive oxide). In the present embodiment, a first $IrO_2$ film is formed by depositing $IrO_2$ to be 50 nm in thickness on the ferroelectric film 129. After that, the semiconductor substrate 110 is placed inside the RTA device and the RTA process is performed under conditions of the supply amount of oxygen gas being 0.025 litters per minute, the temperature of 725° C., and the processing time of 20 seconds. Thereafter, a second $IrO_2$ film is formed by depositing $IrO_2$ to be 200 nm in thickness on the first $IrO_2$ film using the PVD method. In this manner, formed is the conductive film 130 with the structure in which the first and second $IrO_2$ films are stacked.

Next, the process to form the structure depicted in FIG. 4F will be described. After the conductive film 130 is formed in the above-described process, a resist film (unillustrated) covering an upper electrode forming region of the ferroelectric capacitor is formed by the photolithography method. After that, the conductive film 130 is etched by using the resist film as a mask to form an upper electrode 130a. Subsequently, the resist film on the upper electrode 130a is removed.

Thereafter, recovery annealing for the ferroelectric film 129 is performed. That is, the semiconductor substrate 110 is placed inside a heating furnace and a heat treatment is performed under conditions of the supply amount of oxygen being 20 litters per minute, the temperature of 650° C., and the processing time of 60 minutes.

After performing the recovery annealing for the ferroelectric film 129, a resist film (unillustrated) covering above a ferroelectric capacitor forming region is formed by the photolithography method. Then, the ferroelectric film 129 is etched by using the resist film as a mask to form the ferroelectric film 129 in a predetermined shape. After that, the resist film is removed.

Thereafter, the semiconductor substrate 110 is placed inside the heating furnace to perform the recovery annealing for the ferroelectric film 129. This recovery annealing is performed under conditions of, for example, the supply amount of oxygen into the heating furnace being 20 litters per minute, the temperature of 350° C., and the processing time of 60 minutes.

Next, the process to form the structure depicted in FIG. 4G will be described. After the ferroelectric film 129 is patterned in the above-described process, a resist film (unillustrated) covering above a lower electrode forming region of the ferroelectric capacitor is formed by the photolithography method. Then, the conductive film 128 is etched by using this resist film as a mask to form a lower electrode 128a. After that, the resist film is removed.

Thereafter, the semiconductor substrate 110 is placed inside the heating furnace to perform the recovery annealing for the ferroelectric film 129. This recovery annealing is performed under conditions of, for example, the supply amount of oxygen into the heating furnace being 20 litters per minute, the temperature of 650° C., and the processing time of 60 minutes. In this manner, a ferroelectric capacitor 131 is completed.

Next, an interlayer insulating film 132 is formed by depositing TEOS-NSG to be 1500 nm in thickness on the entire upper surface of the semiconductor substrate 110 using, for example, the plasma CVD method. This interlayer insulating film 132 covers the ferroelectric capacitor 131. After that, the upper surface of the interlayer insulating film 132 is planarized by the CMP method.

Note that, though unillustrated in FIG. 4G, it is preferable that a hydrogen barrier film (aluminum oxide film) be formed by the PVD method to be, for example, 20 nm in thickness on the entire upper surface of the substrate 110 after the ferroelectric capacitor 131 is formed. With this, the entrance of moisture and hydrogen into the ferroelectric capacitor 131 can be further securely prevented. If this hydrogen barrier film is formed, a heat treatment is performed in an atmosphere containing oxygen at the temperature of 550° C. for 60 minutes. Similar to this, in other embodiments of the present application, it is also preferable that a hydrogen barrier film be formed on the entire upper surface of a semiconductor substrate after a ferroelectric capacitor is formed.

Next, the process to form the structure depicted in FIG. 4H will be described. After the surface of the interlayer insulating film 132 is planarized in the above-described process, plasma annealing is performed in an atmosphere containing, for example, nitrogen and oxygen at the temperature of 350° C. for 2 minutes to nitride the surface of the interlayer insulating film 132. After that, a photoresist is applied onto the interlayer insulating film 132 to form a photoresist film 133. Then, this photoresist film 133 is exposed to light and developed to form an opening 133a in a predetermined position. After that, the etching process is performed by using this photoresist film 133 as a mask, so that a contact hole 132a extending from the upper surface of the interlayer insulating film 132 and reaching the W plug 124 is formed. It is preferable that the diameter of this contact hole 132a be slightly smaller than the diameter of the contact hole 121a (0.55 μm) when the W plug 124 is formed. In the present embodiment, the diameter of the contact hole 132a is designed to be 0.5 μm.

Even when misalignment occurs when this contact hole 132a is formed, the interlayer insulating film 121 is prevented from being etched because the etching stopper film 122 is formed around the W plug 124. As a result, problems are solved in that the interlayer insulating film is etched to generate a depression and that moisture or impurities, which accumulate(s) in the depression, deteriorates the characteristic of the ferroelectric capacitor (see, for example, FIG. 2).

Next, the process to form the structure depicted in FIG. 4I will be described. After removing the photoresist film 133 used for forming the contact hole 132a, a Ti film with the thickness of 20 nm and a TiN film with the thickness of 50 nm (both of which are unillustrated) are sequentially formed by, for example, the PVD method on the entire upper surface of the semiconductor substrate 110. Then, the wall surface of the contact hole 132a is covered with these Ti film and TiN film. Thereafter, W (tungsten) is deposited by, for example, the CVD method on the entire upper surface of the semiconductor substrate 110, so that a W film is formed on the interlayer insulating film 132 and the contact hole 132a is filled with W.

After that, the W film, the TiN film, and the Ti film which are on the interlayer insulating film 132 are removed by the CMP method. In this manner, a W plug 134 is formed by filling the contact hole 132a with W. Subsequently, plasma annealing is performed in an atmosphere containing, for example, nitrogen and oxygen at the temperature of 350° C. for 2 minutes to nitride the surface of the interlayer insulating film 132. After that a SiON film 135 is formed by the CVD method to be 100 nm in thickness on the interlayer insulating film 132 to prevent the W plug 134 from being oxidized.

Next, the processes to form the structures depicted in FIG. 4J, FIG. 4K, and FIG. 4L will be described. After the SiON film 135 is formed in the above-described process, as depicted in FIG. 4J, a photoresist is applied onto the SiON film 135 to form a photoresist film 136. Then, this photoresist film 136 is exposed to light and developed to form an opening in a predetermined position. After that, the etching process is performed by using this photoresist film 136 as a mask to form a contact hole 132b extending from the upper surface of the SiON film 135 and reaching the upper electrode 130a of the ferroelectric capacitor 131 and a contact hole 132b extending from the upper surface of the SiON film 135 and reaching the lower electrode 128a of the ferroelectric capacitor 131. Subsequently, after removing the photoresist film 136, recovery annealing for the ferroelectric film 129 is performed. This recovery annealing is performed by heating in, for example, an oxygen atmosphere at the temperature of 500° C. for 60 minutes.

Next, as depicted in FIG. 4K, the SiON film 135 is removed by etching. Subsequently, as depicted in FIG. 4L, TiN with the thickness of 150 nm, Al—Cu alloy with the thickness of 550 nm, Ti with the thickness of 5 nm, and TiN with the thickness of 150 nm are deposited in this order on the entire upper surface of the semiconductor substrate 110 by, for example, the PVD method, so that an aluminum film 137 is formed on the interlayer insulating film 132 and the contact holes 132b are filled with aluminum.

Next, the process to form the structure depicted in FIG. 4M will be described. After the aluminum film 137 is formed in the above-described process, the aluminum film 137 is patterned by using the photolithography method and the etching method, so that a wiring 138 of a first wiring layer is formed. In the present embodiment, the upper electrode 130a of the ferroelectric capacitor 131 is electrically connected to the high concentration impurity region 118 of the transistor T through the wiring 138, the W plug 134, and the W plug 124. In this manner, the wiring 138 of the first wiring layer is formed. Thereafter, a heat treatment is performed under conditions of, for example, the supply amount of nitrogen being 20 litters per minute, the temperature of 350° C., and the processing time of 30 minutes. Thereafter, an aluminum oxide (for example, $Al_2O_3$) film as the hydrogen barrier film 139 is formed by the PVD method to be 20 nm in thickness on the entire upper surface of the semiconductor substrate 110.

Next, the processes to form the structures depicted in FIG. 4N and FIG. 4O will be described. After the hydrogen barrier film 139 is formed in the above-described process, TEOS-NSG is deposited by, for example, the plasma CVD method with a thickness of approximately 2600 nm, so that an interlayer insulating film 140 is formed as depicted in FIG. 4N. Thereafter, the surface of the interlayer insulating film 140 is polished by the CMP method, and thus planarized. Subsequently, the photolithography method and the etching method are used to form a contact hole extending from the upper surface of the interlayer insulating film 140 and reaching the wiring 138 of the first wiring layer. Then, a Ti film with the thickness of 20 nm and a TiN film with the thickness of 50 nm are formed on the entire upper surface of the semiconductor substrate 110. After that, W (tungsten) is deposited by the CVD method on the entire upper surface of the semiconductor substrate 110, so that the contact hole is filled with W. Thereafter, the CMP polishing is performed until the interlayer insulating film 140 is exposed to form a W plug 141.

Next, by a method similar to the method for forming the wiring of the first wiring layer, an aluminum film is formed on the entire upper surface of the semiconductor substrate 110. Then, this aluminum film is patterned to form wirings 142 of a second wiring layer as depicted in FIG. 4O. As depicted in this FIG. 4O, a predetermined wiring of the wirings 142 of the second wiring layer is electrically connected to the transistor T (high concentration impurity layer 118) through the W plug 141, the wiring 138 of the first wiring layer, the W plug 134, and the W plug 124.

Next, the process to form the structure depicted in FIG. 4P will be described. After the wiring 142 of the second wiring layer is formed in the above-described process, TEOS-NSG is deposited by, for example, the plasma CVD method to be approximately 2200 nm in thickness to form an interlayer insulating film 143 covering the wiring 142 of the second wiring layer. Thereafter, the surface of the interlayer insulating film 143 is planarized by the CMP method. Subsequently, the photolithography method and the etching method are used to form a contact hole extending from the upper surface of the interlayer insulating film 143 and reaching the wiring 142 of the second wiring layer and W (tungsten) is filled into the contact hole to form a W plug 144. After that, an aluminum film is formed on the entire upper surface of the semiconductor substrate 110. Then, this aluminum film is patterned to form a wiring 145 of a third wiring layer and a terminal 146.

Next, the process to form the structure depicted in FIG. 4Q will be described. After the wiring 145 of the third wiring layer and the terminal 146 are formed in the above-described process, TEOS-NSG is deposited by the plasma CVD method to be approximately 100 nm in thickness on the entire upper surface of the semiconductor substrate 110, so that a first passivation film 147 covering the wiring 145 and the terminal 146 is formed. Then, plasma annealing is performed on the first passivation film 147 in a nitrogen atmosphere. The temperature in the annealing is designed to be, for example, 350° C. and the processing time is designed to be, for example, 2 minutes.

Thereafter, SiN is deposited by, for example, the plasma CVD method to be 350 nm in thickness on the first passivation film 147, so that a second passivation film 148 is formed.

Next, the process to form the structure depicted in FIG. 4R will be described. After the first and second passivation films 147 and 148 are formed in the above-described process, the first and second passivation films 147 and 148 on the terminal 146 are removed by using the photolithography method and the etching method. After that, photosensitive polyimide is applied onto the entire upper surface of the semiconductor substrate 110 to be approximately 3.6 μm in thickness, so that a protection film 149 is formed. Then, the protection film 149 is exposed to light and developed to form an opening 149a in which the terminal 146 is exposed. Subsequently, a heat treatment is performed in, for example, a nitrogen atmosphere at the temperature of 310° C. for 40 minutes to cure polyimide constituting the protection film 149. In this manner, a semiconductor device (FeRAM) according to the present embodiment is completed. Note that the protective film 149 may be formed of nonphotosensitive polyimide.

Figure 1:
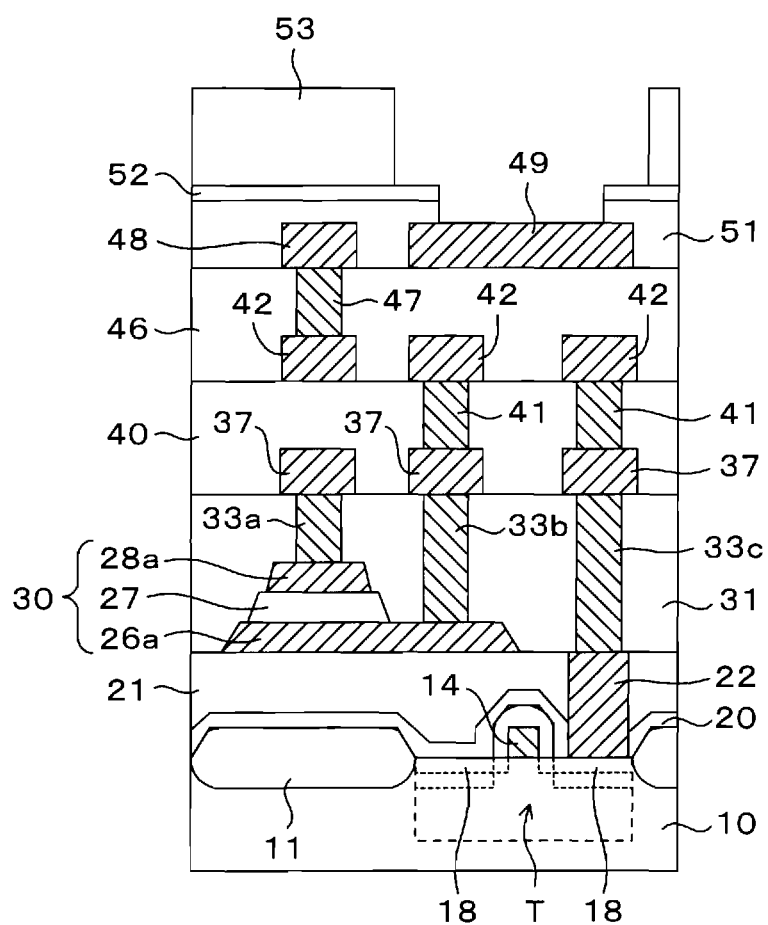
FIG. 1 is a schematic view depicting an example of a semiconductor device having a conventional ferroelectric capacitor.
Figure 2A:
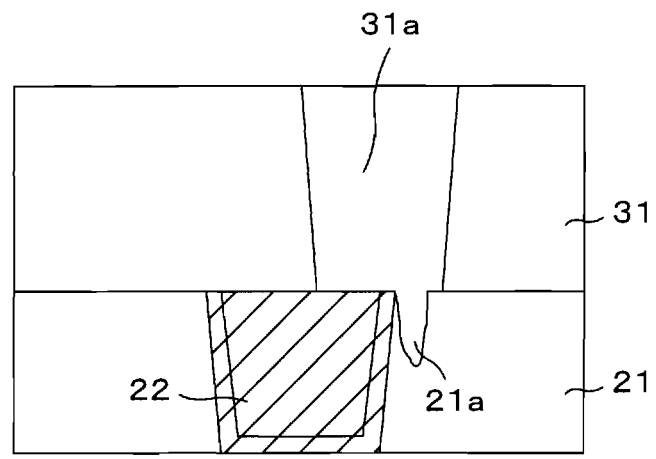
FIGS. 2A and 2B are schematic views, depicting a problem of a conventional art.
Figure 2B:
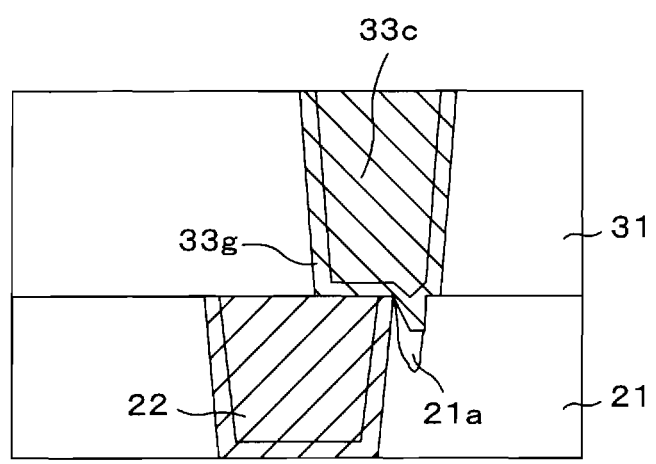

In the present embodiment, as depicted in FIG. 4H, the etching stopper film 122 is formed on the first interlayer insulating film 121. Accordingly, even when misalignment occurs when the contact hole 132a continuing to the plug 124 is formed in the second interlayer insulating film 132, the first interlayer insulating film 121 is not etched. Thus, a depression 21a as depicted in FIG. 2 is not generated. Accordingly, the deterioration of the characteristic caused by moisture or impurities which accumulate(s) in the depression 21a is prevented. Thus, the reliability of the semiconductor device (FeRAM) can be ensured over a long period.

In addition, in the present invention, the hydrogen barrier films 127 and 139 are formed below and above the ferroelectric capacitor 131. Accordingly, the entrance of moisture and hydrogen into the ferroelectric capacitor 131 can be more securely prevented. With this, the deterioration of the characteristic of the ferroelectric capacitor 131 can be suppressed, so that the reliability of the semiconductor device can be further improved.

(Second Embodiment)

Figure 5:
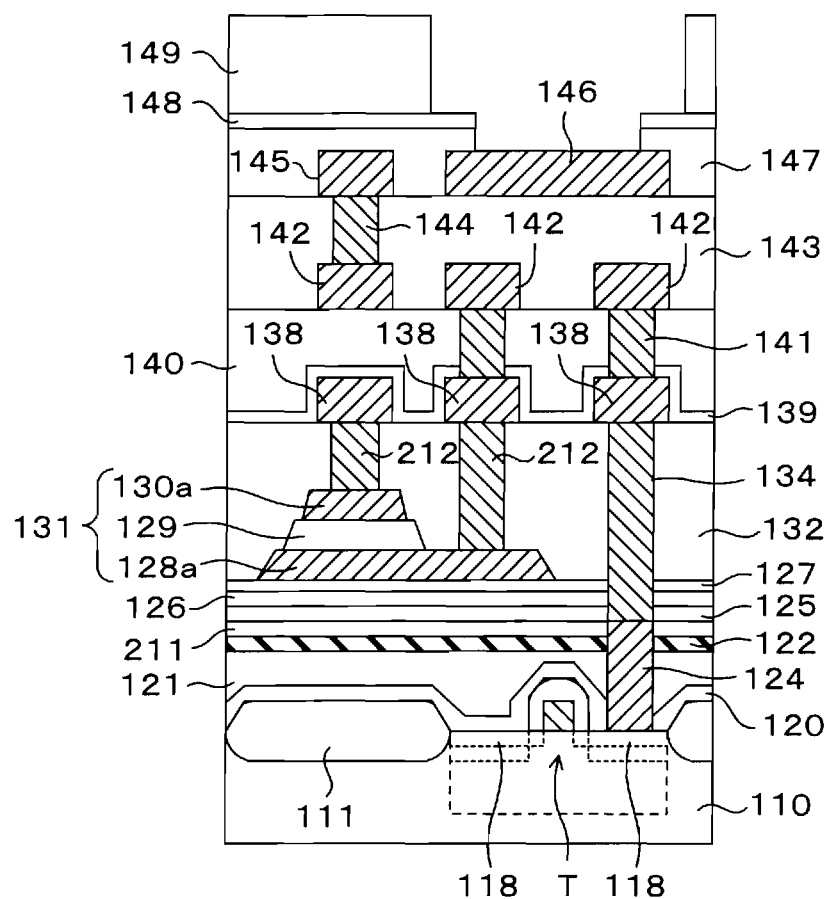
FIG. 5 is a schematic view depicting the structure of a semiconductor device according to a second embodiment.

FIG. 5 is a schematic view depicting the structure of a semiconductor device according to a second embodiment. The present embodiment is different from the first embodiment in that a TEOS (silicon oxide) film 211 is formed on an etching stopper film 122, a connected portion of a plug 124 and a plug 134 is positioned on the same plane as the upper surface of the TEOS film 211, and between a wiring 138 of a first wiring layer and an upper electrode 130a of a ferroelectric capacitor 131 and between the wiring 138 of the first wiring layer and a lower electrode 128a of the ferroelectric capacitor 131 are respectively connected by W plugs 212. Other components are basically the same as those of the first embodiment. Accordingly, in FIG. 5, the same reference numerals are given to denote the components same as those in FIG. 3, and the description of the same components is omitted.

In the present embodiment, after an etching stopper film 122 is formed, a TEOS film 211 is formed by the CVD method to be 50 to 100 nm in thickness on the etching stopper film 122. Subsequently, the photolithography method and the etching method are used to form a contact hole extending from the upper surface of the TEOS film 211 and reaching a high concentration impurity region 118. Then, this contact hole is filled with W (tungsten), so that a W plug 124 is formed. After that, similar to the first embodiment, a SiON film 125, a TEOS film 126, and a hydrogen barrier film 127 are formed. Furthermore, a ferroelectric capacitor 131 and an interlayer insulating film 132 are formed.

Next, a photoresist film is formed on the interlayer insulating film 132, and is exposed to light and developed, so that an opening is formed in the photoresist film in a portion above the plug 124. Then, the etching is performed by using this photoresist film as a mask to form a contact hole extending from the upper surface of the interlayer insulating film 132 and reaching the plug 124. Subsequently, the photoresist film is removed, and, thereafter, the contact hole is filled with W (tungsten) to form a W plug 134 to be electrically connected to the W plug 124.

Note that the TEOS film 211 could be etched due to misalignment occurred when the contact hole is formed. However, the thickness of the TEOS film 211 is 50 to 100 nm, which is extremely thin, and the etching stopper film 122 is also formed thereunder. Accordingly, the occurrence of a large depression as depicted in FIG. 2 is prevented.

Next, a SiON film (unillustrated) is formed on the entire upper surface of the semiconductor substrate 110. Subsequently, a photoresist film is formed on this SiON film and is exposed to light and developed, so that openings are formed in the photoresist film in portions above the upper electrode 130a and lower electrode 128a of the ferroelectric capacitor 131. After that, the etching process is performed by using the photoresist film as a mask to form a contact hole extending from the upper surface of the interlayer insulating film 132 and reaching the upper electrode 130a of the ferroelectric capacitor 131 and a contact hole extending from the upper surface of interlayer insulating film 132 and reaching the lower electrode 128a of the ferroelectric capacitor 131. Then, the photoresist film and the SiON film are removed, and, thereafter, the contact holes are filled with W (tungsten), so that W plugs 212, which are respectively connected to the upper electrode 130a and lower electrode 128a of the ferroelectric capacitor 131, are formed.

The processes thereafter are the same as those of the first embodiment, and the description thereof is omitted here. In the present embodiment as well, effects similar to those of the first embodiment can be obtained.

(Third Embodiment)

Figure 6:
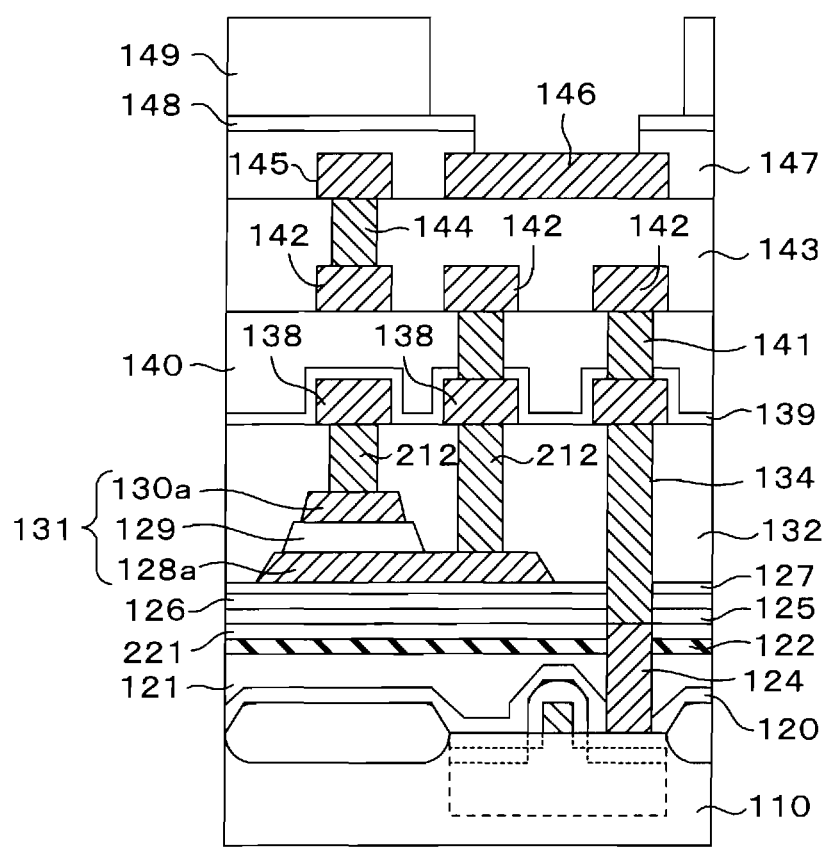
FIG. 6 is a schematic view depicting the structure of a semiconductor device according to a third embodiment.

FIG. 6 is a schematic view depicting the structure of a semiconductor device according to a third embodiment. The present embodiment is different from the first embodiment in that a SiON film 221 is formed on an etching stopper film 122, a connected portion of a plug 124 and a plug 134 is positioned on the same plane as the upper surface of the SiON film 221, and between a wiring 138 of a first wiring layer and an upper electrode 130a of a ferroelectric capacitor 131 and between the wiring 138 of the first wiring layer and a lower electrode 128a of the ferroelectric capacitor 131 are respectively connected by W plugs 212. Other components are basically the same as those of the first embodiment. Accordingly, in FIG. 6, the same reference numerals are given to denote the components same as those in FIG. 3, and the description of the same components is omitted.

In the present embodiment, after an etching stopper film 122 is formed, a SiON film 221 is formed by the CVD method to be 50 to 100 nm in thickness on the etching stopper film 122. Subsequently, the photolithography method and the etching method are used to form a contact hole extending from the upper surface of the SiON film 221 and reaching a high concentration impurity region 118. Then, this contact hole is filled with W (tungsten) to form a W plug 124. After that, similar to the first embodiment, a SiON film 125, a TEOS film 126, and a hydrogen barrier film 127 are formed, and a ferroelectric capacitor 131 and an interlayer insulating film 132 are formed.

Next, a photoresist film is formed on the interlayer insulating film 132, and is exposed to light and developed, so that an opening is formed in the photoresist film in a portion above the plug 124. Subsequently, the etching is performed by using this photoresist film as a mask to form a contact hole extending from the upper surface of the interlayer insulating film 132 and reaching the plug 124. After that, the photoresist film is removed, and, thereafter, the contact hole is filled with W (tungsten) to form a W plug 134, which is electrically connected to the plug 124.

Thereafter, a SiON film (unillustrated) is formed on the entire upper surface of the semiconductor substrate 110. Subsequently, a photoresist film is formed on this SiON film and is exposed to light and developed, so that openings are formed in the photoresist film in portions above the upper electrode 130a and lower electrode 128a of the ferroelectric capacitor 131. After that, the etching is performed by using the photoresist film as a mask to form a contact hole extending from the upper surface of the interlayer insulating film 132 and reaching the upper electrode 130a of the ferroelectric capacitor 131, and a contact hole extending from the upper surface of the interlayer insulating film 132 and reaching the lower electrode 128a of the ferroelectric capacitor 131. Then, the photoresist film and the SiON film are removed. Thereafter, the contact holes are filled with W (tungsten), so that W plugs 212, which are respectively connected to the upper electrode 130a and lower electrode 128a of the ferroelectric capacitor 131, are formed.

The processes thereafter are the same as those of the first embodiment, and the description thereof is omitted here. In the present embodiment, effects similar to those of the first embodiment can be also obtained.

(Fourth Embodiment)

Figure 7:
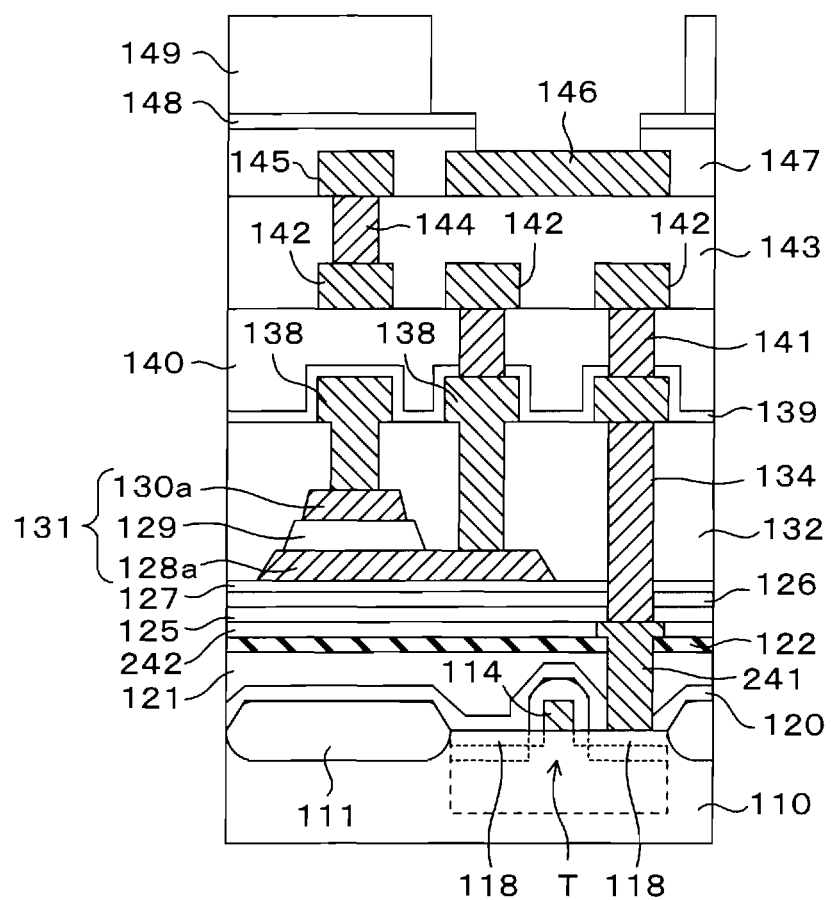
FIG. 7 is a schematic view depicting the structure of a semiconductor device according to a fourth embodiment.

FIG. 7 is a schematic view depicting the structure of a semiconductor device according to a fourth embodiment. The present embodiment is different from the first embodiment in the shape of the upper portion of a plug which is to be electrically connected to a high concentration impurity region 118 of a transistor T. Other components are basically the same as those of the first embodiment. Accordingly, in FIG. 7, the same reference numerals are given to denote the components same as those in FIG. 3.

In the present embodiment, as depicted in FIG. 7, a TEOS (silicon oxide) film 242 is formed on an etching stopper film 122, and a SiON film 125, a TEOS film 126, and a hydrogen barrier film 127 are formed thereon. A plug 241 is formed by filling W (tungsten) into the contact hole extending from the upper surface of the TEOS film 242 and reaching the high concentration impurity region 118 of the transistor T. The head portion of this plug 241 (a portion higher than the etching stopper film 122) has the diameter larger than that of another portion (axis portion). For example, the diameter of the axis portion is 0.55 μm and the diameter of the head portion is 0.7 μm.

In the present embodiment, effects similar to those of the first embodiment can be obtained. In addition, since the diameter of the head portion of the plug 241 is largely formed, even when misalignment occurs between the plug 241 and the plug 134 to be formed thereon, the electrical connection between the plugs 241 and 134 can be preferably maintained.

Three methods for manufacturing a semiconductor device according to the present embodiment will be described below. Note that, in the following description, the description will be given of an example in which the present invention is applied to a FeRAM having a planar-type ferroelectric capacitor.

(First Manufacturing Method)

FIGS. 8A to FIG. 8F are cross-sectional views depicting a first method for manufacturing a semiconductor device according to the present embodiment in the order of processes.

Firstly, by a method similar to that of the first embodiment, as depicted in FIG. 8A, formed on and in a semiconductor substrate 110 are an element isolation film 111, a p-well 112, a gate electrode 114, a low concentration impurity region 116, a sidewall 117, a high concentration impurity region 118, a stopper layer 120, and a first interlayer insulating film 121. Thereafter, a SiON film as an etching stopper film 122 is formed by the CVD method to be 100 nm in thickness on the interlayer insulating film 121. Furthermore, a TEOS film 242 is formed thereon by the CVD method to be 100 nm in thickness.

Figure 8B:
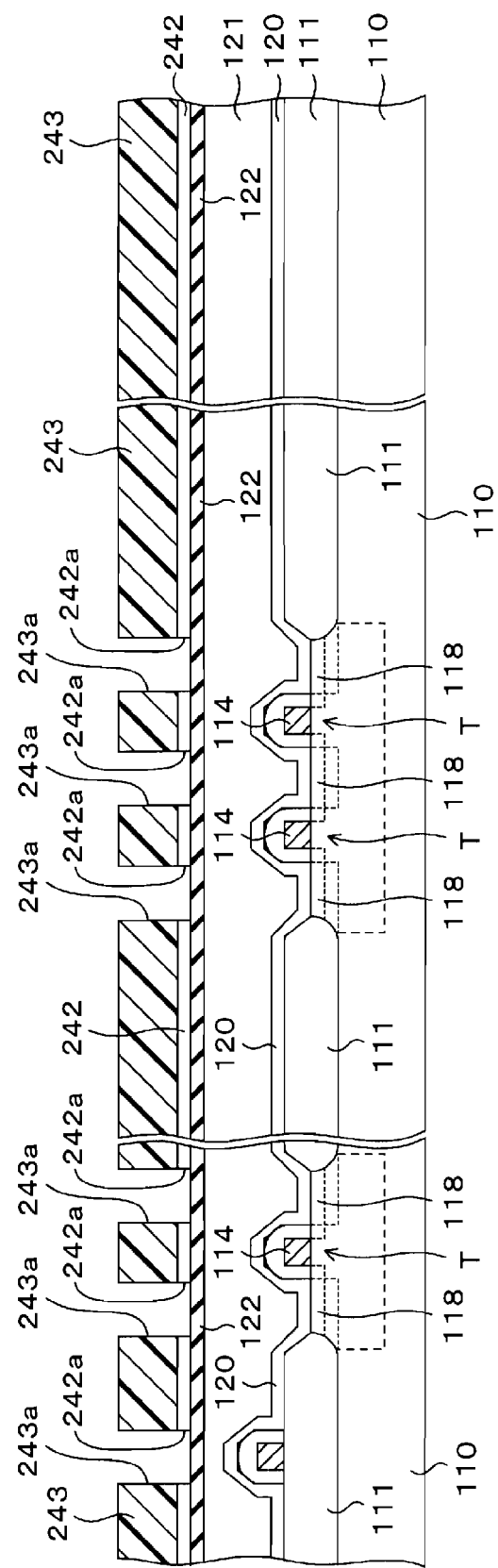

Next, as depicted in FIG. 8B, a photoresist is applied onto the TEOS film 242 to form a photoresist film 243. Then, this photoresist film 243 is exposed to light and developed to form an opening 243a in a predetermined region. After that, the TEOS film 242 is etched by using the photoresist film 243 as a mask to form an opening 242a.

Figure 8C:
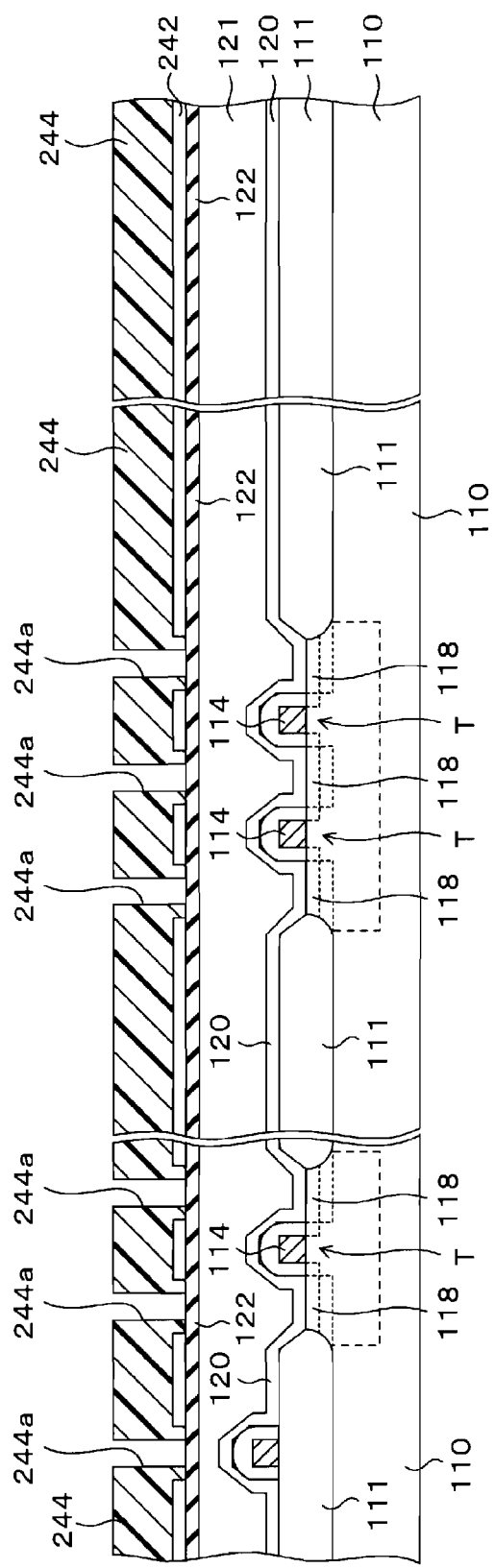

Next, after the photoresist film 243 is removed, as depicted in FIG. 8C, a photoresist is applied onto the entire upper surface of the semiconductor substrate 110 to form a photoresist film 244. Then, this photoresist film 244 is exposed to light and developed to form an opening 244a. This opening 244a is formed in a position aligned with the opening 242a in the TEOS film 242 with a diameter slightly smaller than that of the opening 242a. In the present embodiment, the diameter of the opening 242a is designed to be 0.7 μm and the diameter of the opening 244a is designed to be 0.55 μm. Note that, here, since a base has a stepped portion, it is better to form the photoresist film after an antireflection film (BARC) is applied in order to precisely form a pattern. Both approaches may be used.

Figure 8D:
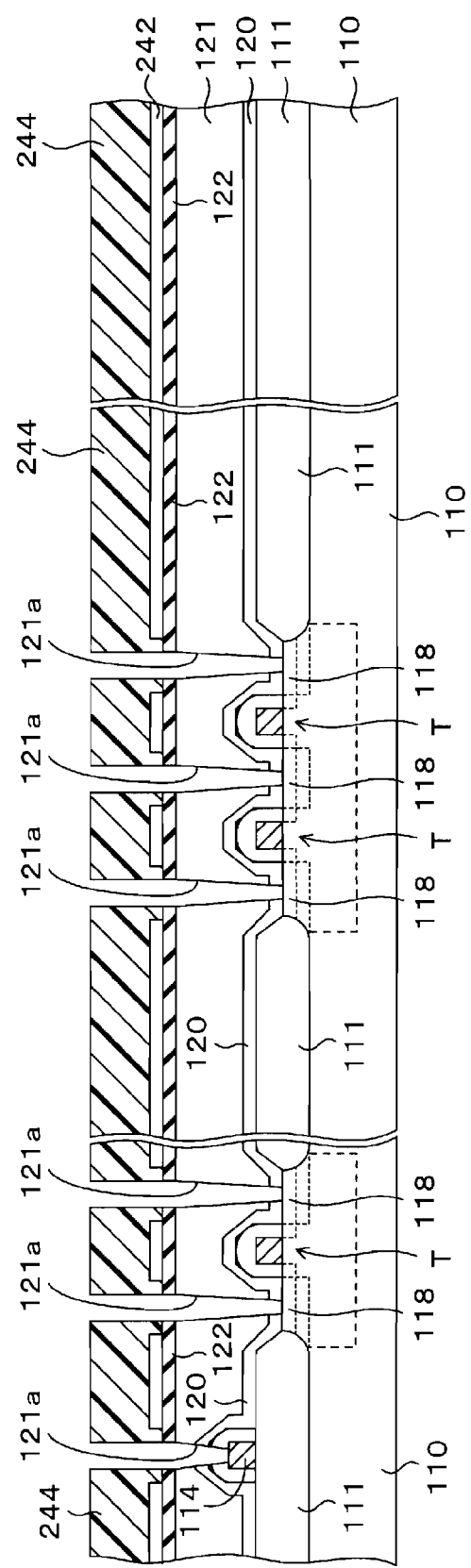

Subsequently, as depicted in FIG. 8D, the etching is performed by using the photoresist film 244 as a mask to form a contact hole 121a extending from the upper surface of the etching stopper film 122 and reaching the high concentration impurity region 118 (source/drain of the transistor T). Here, not only the contact hole 121a extending from the upper surface of the etching stopper film 122 and reaching the high concentration impurity region 118, but also formed is the contact hole 121a extending from the upper surface of the etching stopper film 122 and reaching the gate electrode (silicon wiring) 114 on the element isolation film 111 in the peripheral circuit forming region.

Figure 8E:
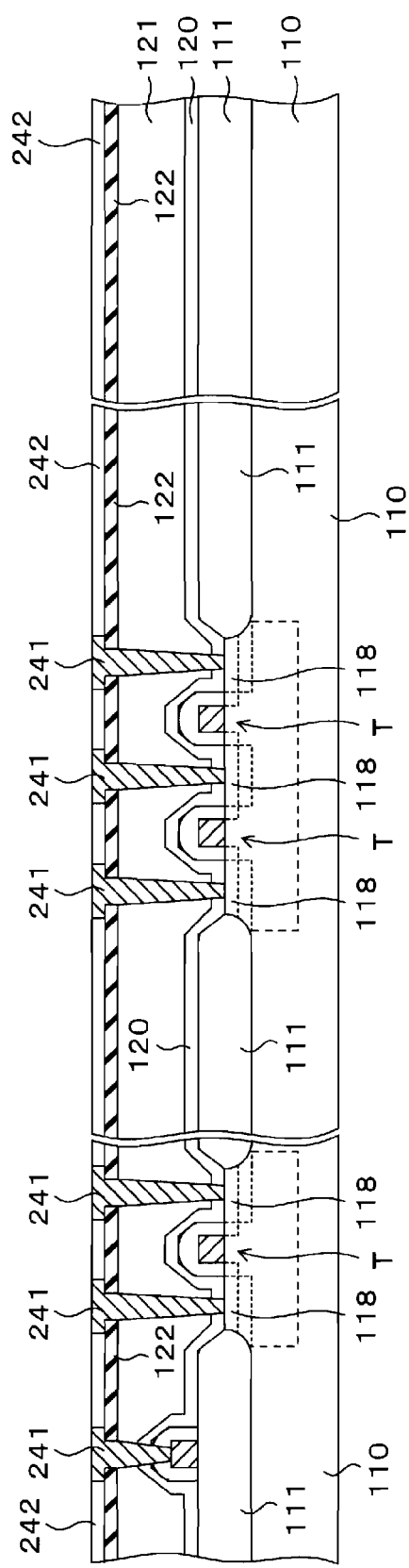

Next, after the photoresist film 244 is removed, a Ti film with the thickness of 20 nm and a TiN film with the thickness of 50 nm (both of which are unillustrated) are formed by, for example, the PVD method on the entire upper surface of the semiconductor substrate 110. Then, the wall surface of the contact hole 121a is covered with these Ti film and TiN film. Thereafter, W (tungsten) is deposited by, for example, the CVD method on the entire upper surface of the semiconductor substrate 110, so that a W film is formed on the TEOS film 242 and the contact hole 121a is filled with W. After that, the W film, the TiN film, and the Ti film which are on the TEOS film 24 are removed by the CMP method. With this, as depicted in FIG. 8E, a W plug 241 is formed by filling the contact hole 121a with W. This W plug 241 has the shape (a rivet-like shape) in which the diameter of the upper (head) portion thereof is larger than that of another portion (axis portion). After the CMP process, the plasma annealing is performed in an atmosphere containing nitrogen and oxygen at the temperature of 350° C. for 2 minutes.

Figure 8F:
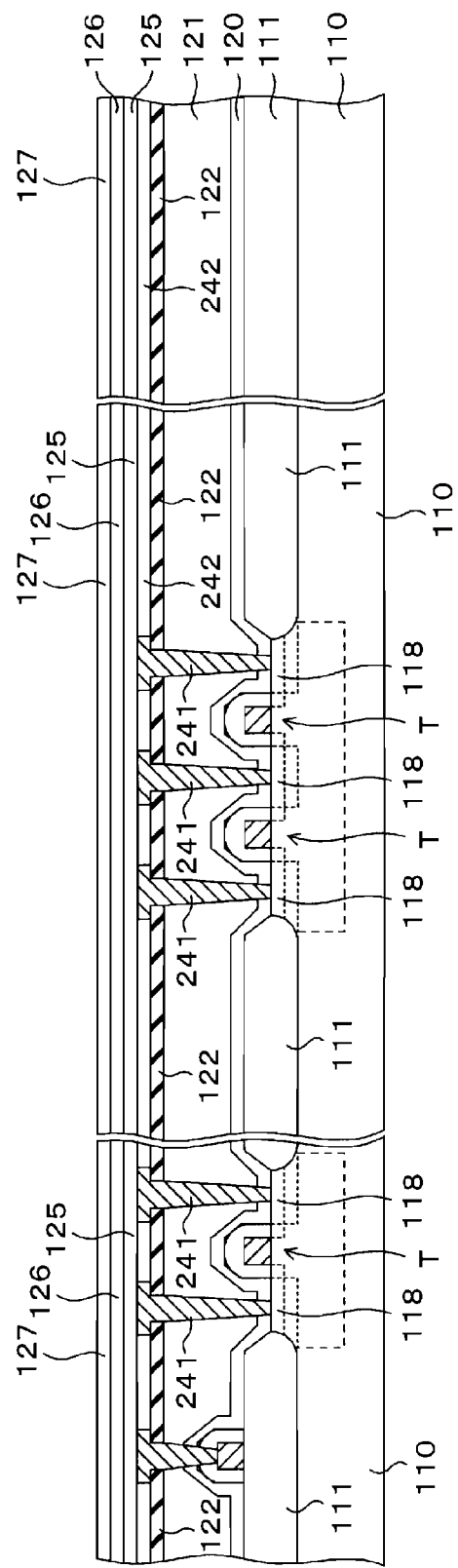

Next, as depicted in FIG. 8F, a SiON film 125 is formed by the plasma CVD method to be 100 nm in thickness on the entire upper surface of the semiconductor substrate 110. Subsequently, a TEOS film 126 is formed by the CVD method to be 100 nm in thickness on the SiON film 125. Then, the dewatering process is performed by heating under conditions of the flow rate of nitrogen being 2 litters per minute and the temperature of 650° C. for 30 minutes. Thereafter, a hydrogen barrier film 127 made of aluminum oxide (for example, $Al_2O_3$) is formed by the PVD method on the TEOS film 126. The processes thereafter are the same as those of the first embodiment, and the description thereof is omitted here.

(Second Manufacturing Method)

FIGS. 9A to 9F are cross-sectional views depicting a second method for manufacturing a semiconductor device according to the present embodiment in the order of processes.

Figure 9A:
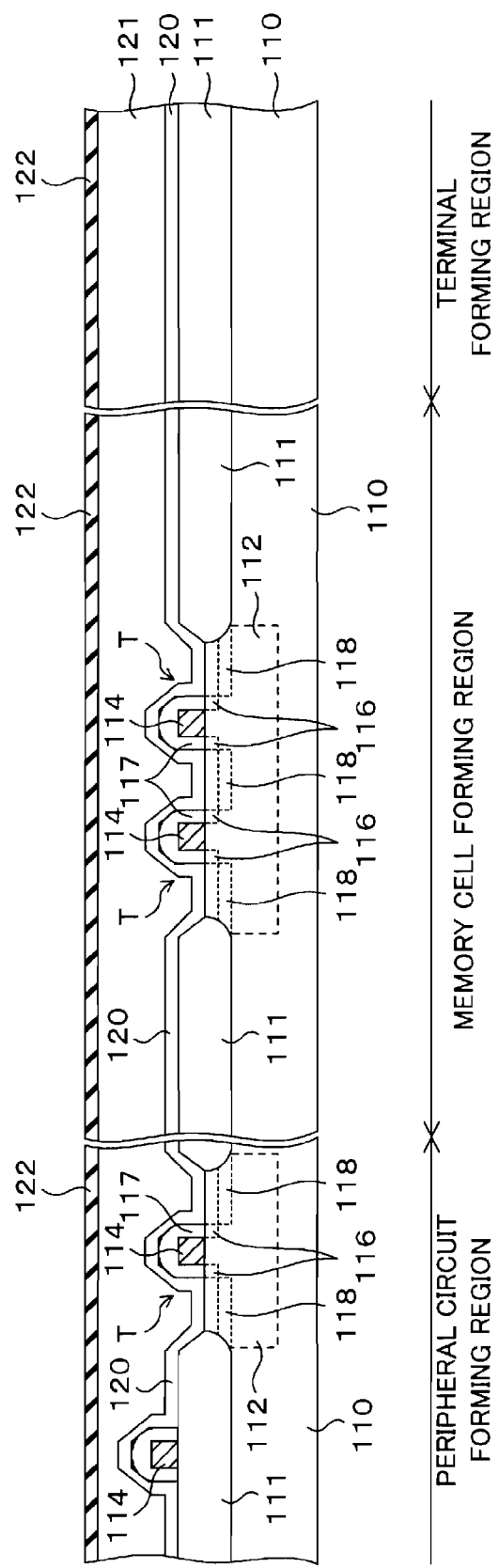
FIGS. 9A to 9F are cross-sectional views depicting a second method for manufacturing a semiconductor device according to the fourth embodiment.

Firstly, by a method similar to that of the first embodiment, as depicted in FIG. 9A, formed on and in a semiconductor substrate 110 are an element isolation film 111, a p-well 112, a gate electrode 114, a low concentration impurity region 116, a sidewall 117, a high concentration impurity region 118, a stopper layer 120, a first interlayer insulating film 121, and the like. After that, a SiON film as an etching stopper film 122 is formed by the CVD method to be in thickness 100 nm on the interlayer insulating film 121.

Figure 9B:
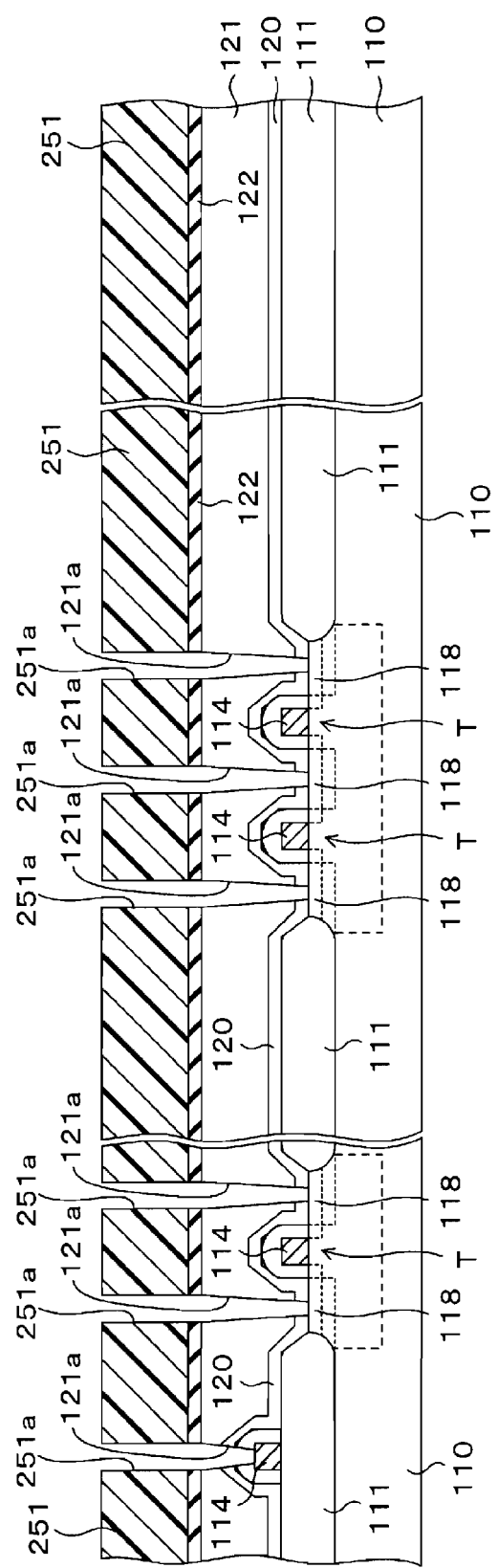

Subsequently, as depicted in FIG. 9B, a photoresist is applied onto the etching stopper film 122 to form a photoresist film 251. Then, this photoresist film 251 is exposed to light and developed to form an opening 251a having the diameter of 0.55 μm in a predetermined region. After that, the etching is performed by using the photoresist film 251 as a mask to form a contact hole 121a extending from the upper surface of the etching stopper film 122 and reaching the high concentration impurity region 118. Here, formed are not only the contact hole 121a extending from the upper surface of the etching stopper film 122 and reaching the high concentration impurity region 118 but also the contact hole 121a extending from the upper surface of the etching stopper film 122 and reaching the gate electrode (silicon wiring) 114 on the element isolation film 111 in the peripheral circuit forming region.

Figure 9C:
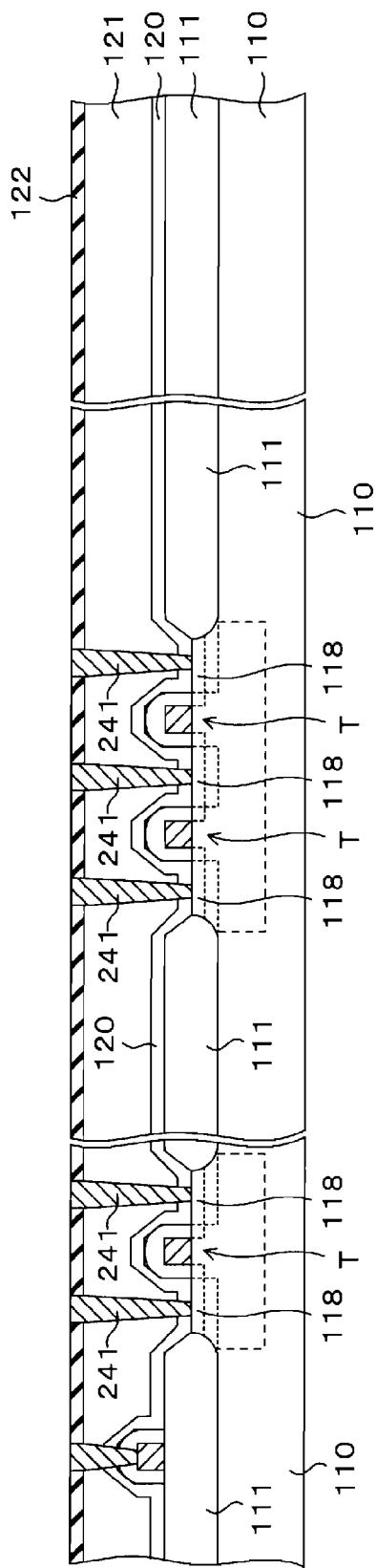

Next, after the photoresist film 251 is removed, a Ti film with the thickness of 20 nm and a TiN film with the thickness of 50 nm (both of which are unillustrated) are formed by, for example, the PVD method on the entire upper surface of the semiconductor substrate 110. Then, the wall surface of the contact hole 121a is covered with these Ti film and TiN film. Thereafter, W (tungsten) is deposited by, for example, the CVD method on the entire upper surface of the semiconductor substrate 110, so that a W film is formed on the etching stopper film 122 and the contact hole 121a is filled with W. After that, the W film, the TiN film, and the Ti film which are on the etching stopper film 122 are removed by the CMP method. With this, as depicted in FIG. 9C, a W plug 241 (however, the head portion is excluded) is formed by filling the contact hole 121a with W.

Figure 9D:
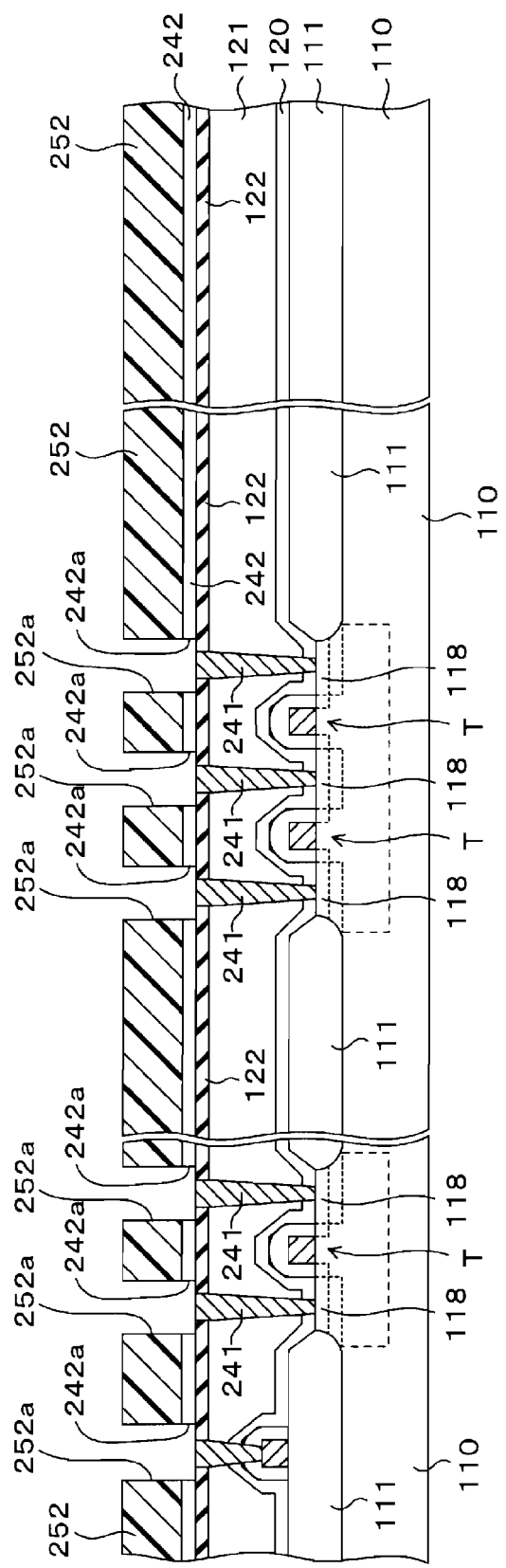

Next, as depicted in FIG. 9D, a TEOS film 242 is formed by the CVD method to be 100 nm in thickness on the entire upper surface of the semiconductor substrate 110. Subsequently, a photoresist film 252 is formed on the TEOS film 242. This photoresist film 252 is exposed to light and developed, so that an opening 252a having the diameter of 0.7 μm is formed in a position aligned with the W plug 214. After that, the TEOS film 242 is etched by using the photoresist film 252 as a mask to form an opening 242a in which the W plug 241 is exposed. After that, the photoresist film 252 is removed.

Figure 9E:
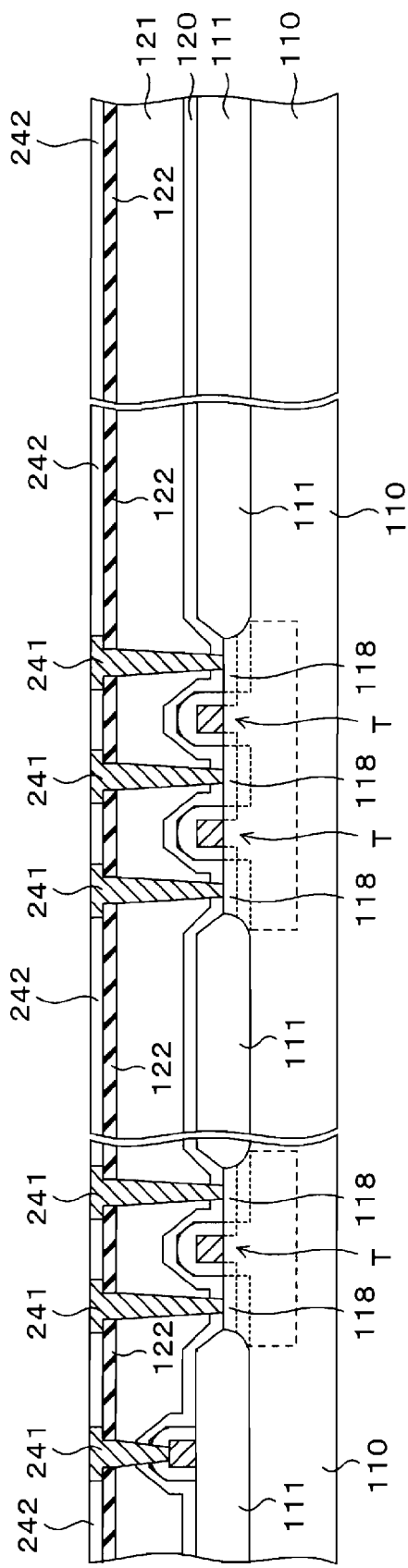

Next, a Ti film with the thickness of 20 nm and a TiN film with the thickness of 50 nm (both of which are unillustrated) are formed on the entire upper surface of the semiconductor substrate 110. Thereafter, W (tungsten) is deposited by the CVD method on the entire upper surface of the semiconductor substrate 110, so that a W film is formed on the TEOS film 242 and the openings 242a are filled with W. After that, the W film, the TiN film, and the Ti film which are on the TEOS film 242 are removed by the CMP method. With this, as depicted in FIG. 9E, the head portion of the W plug 241 is formed and the shape of the W plug 241 becomes a rivet-like shape. After that, the plasma annealing is performed in an atmosphere containing nitrogen and oxygen at the temperature of 350° C. for 2 minutes.

Figure 9F:
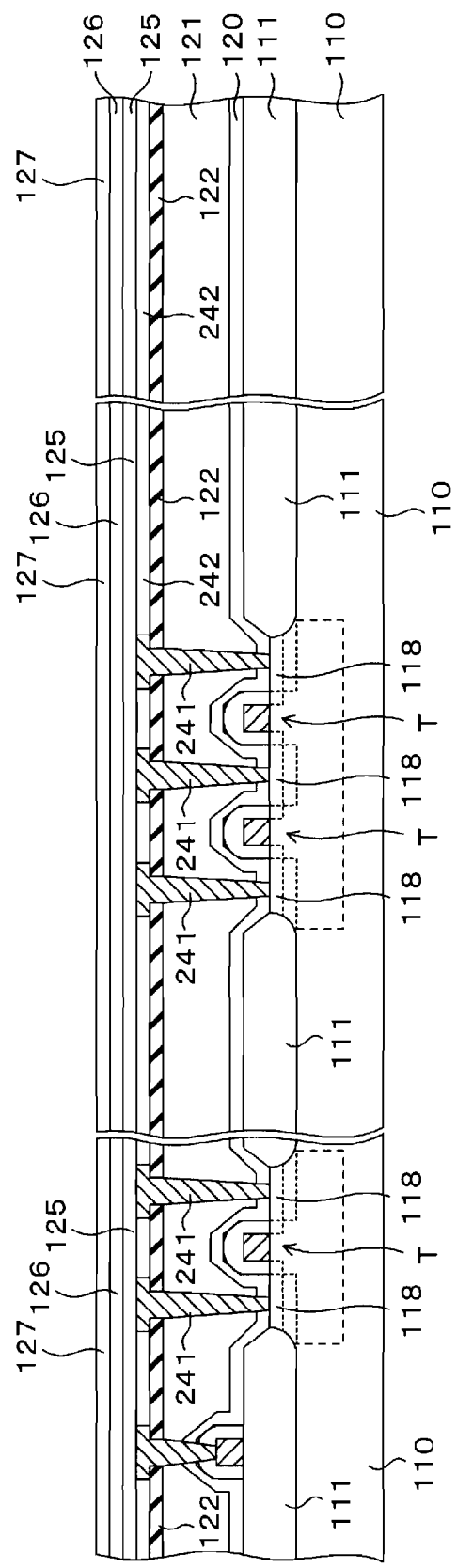

Next, as depicted in FIG. 9F, a SiON film 125 is formed by the plasma CVD method to be 100 nm in thickness on the entire upper surface of the semiconductor substrate 110. Subsequently, a TEOS film 126 is formed by the CVD method to be 100 nm in thickness on the SiON film 125. Then, a dewatering process is performed by heating under conditions of the flow rate of nitrogen being 2 litters per minute and the temperature of 650° C. for 30 minutes. Thereafter, a hydrogen barrier film 127 made of aluminum oxide (for example, Al$_2$O$_3$) is formed by the PVD method on the TEOS film 126. The processes thereafter are the same as those of the first embodiment, and the description thereof is omitted here.

(Third Manufacturing Method)

FIGS. 10A to 10F are cross-sectional views depicting a third method for manufacturing a semiconductor device according to the present embodiment in the order of processes. Note that, in place of the TEOS film 242, an insulating film made of SiON, SiN, or aluminum oxide is formed here.

Figure 10A:
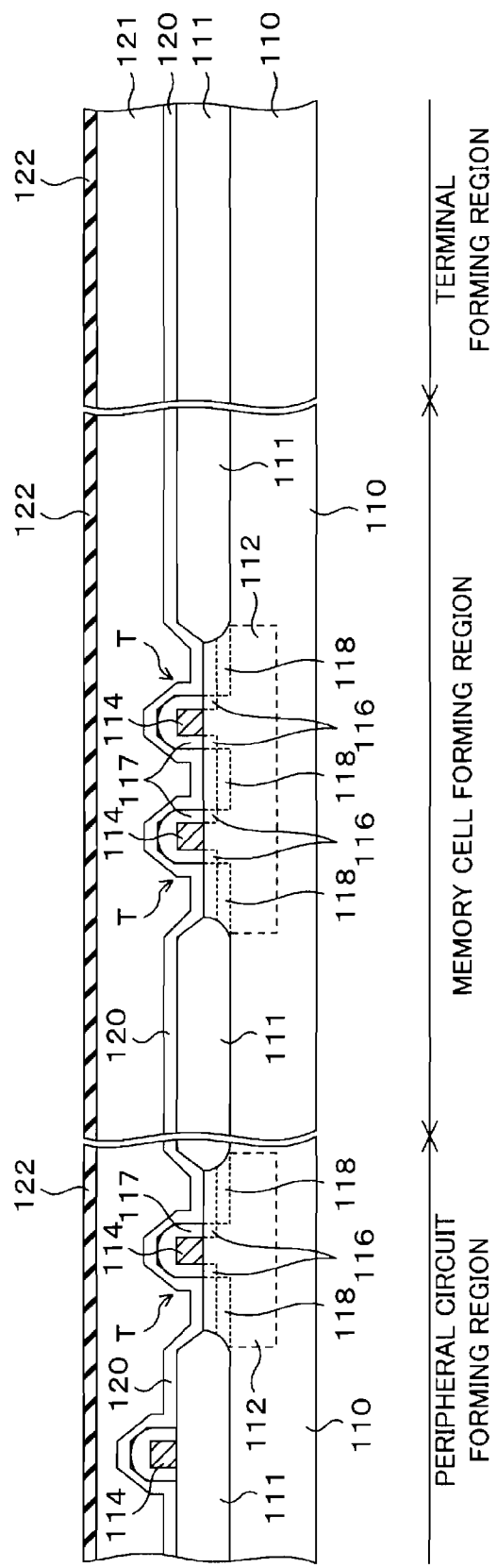
FIGS. 10A to 10F are cross-sectional views depicting a third method for manufacturing a semiconductor device according to the fourth embodiment.

Firstly, by a method similar to that of the first embodiment, as depicted in FIG. 10A, formed on and in a semiconductor substrate 110 are an element isolation film 111, a p-well 112, a gate electrode 114, a low concentration impurity region 116, a sidewall 117, a high concentration impurity region 118, a stopper layer 120, a first interlayer insulating film 121, and the like. After that, a SiON film as an etching stopper film 122 is formed by the CVD method to be 100 nm in thickness on the interlayer insulating film 121.

Figure 10B:
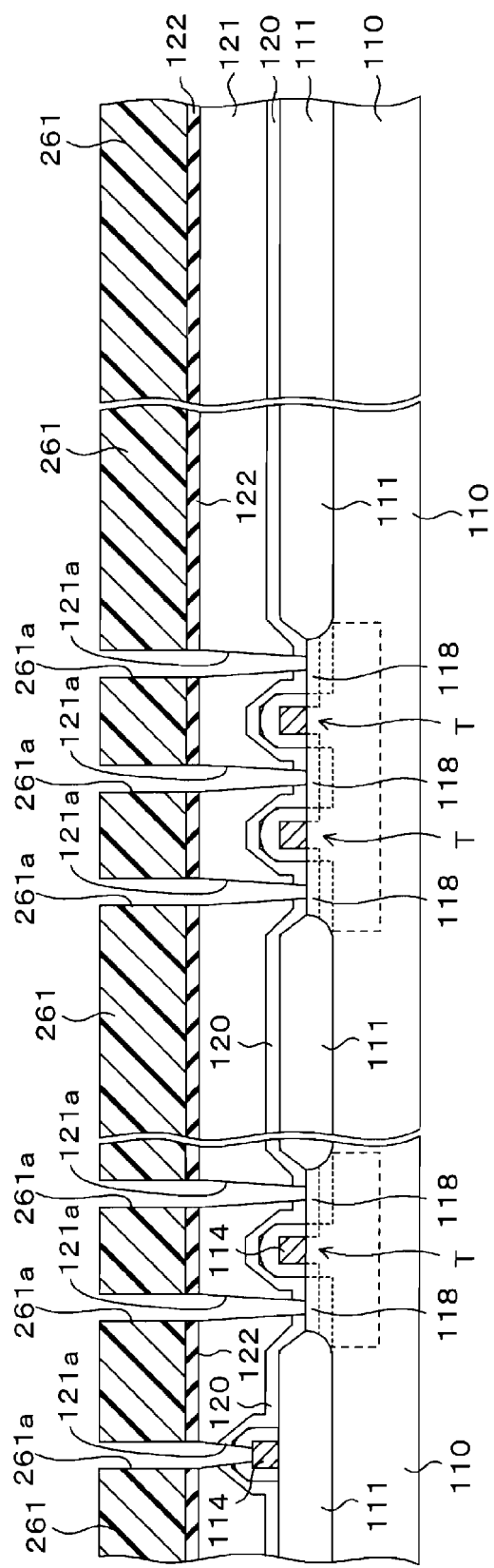

Subsequently, as depicted in FIG. 10B, a photoresist film 261 is formed on the etching stopper film 122. This photoresist film 261 is exposed to light and developed to form an opening 261a having the diameter of 0.55 μm in a predetermined region. After that, the etching is performed by using this photoresist film 261 as a mask to form a contact hole 121a extending from the upper surface of the etching stopper film 122 and reaching the high concentration impurity region 118. Here, formed are not only the contact hole 121a extending from the upper surface of the etching stopper film 122 and reaching the high concentration impurity region 118 but also the contact hole 121a extending from the upper surface of the etching stopper film 122 and reaching the gate electrode (silicon wiring) 114 on the element isolation film 111 in the peripheral circuit forming region.

Figure 10C:
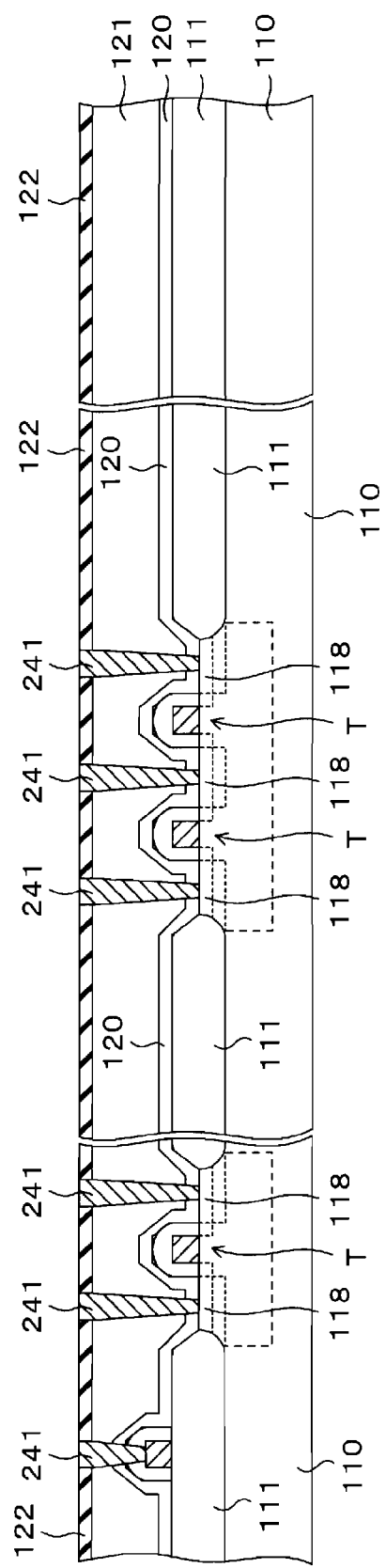

Next, after the photoresist film 261 is removed, a Ti film with the thickness of 20 nm and a TiN film with the thickness of 50 nm (both of which are unillustrated) are formed by, for example, the PVD method on the entire upper surface of the semiconductor substrate 110. Then, the wall surface of the contact hole 121a is covered with these Ti film and TiN film. Thereafter, W (tungsten) is deposited by, for example, the CVD method on the entire upper surface of the semiconductor substrate 110, so that a W film is formed on the etching stopper film 122 and the contact hole 121a is filled with W. After that, the W film, the TiN film, and the Ti film which are on the etching stopper film 122 are removed by the CMP method. With this, as depicted in FIG. 10C, a W plug 241 (however, the head portion is excluded) is formed by filling the contact hole 121a with W.

Figure 10D:
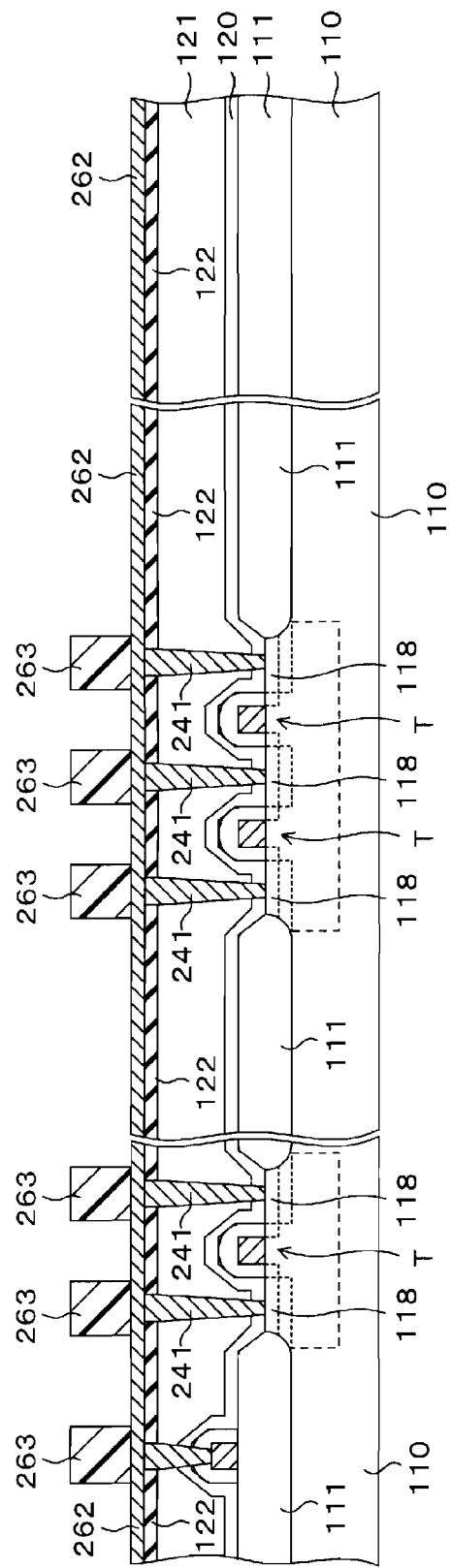

Next, a TiN film (unillustrated) is formed by, for example, the PVD method to be 50 nm in thickness on the entire upper surface of the semiconductor substrate 110. Subsequently, as depicted in FIG. 10D, a W (tungsten) film 262 is formed by, for example, the CVD method to be 200 nm in thickness on the entire upper surface of the semiconductor substrate 110. Thereafter, a photoresist is applied onto the W film 262 and is exposed to light and developed to form a photoresist film 263 covering a predetermined region on the W film 262. This photoresist film 263 is formed, above the W plug 241, to have the diameter of 0.7 μm in size.

Figure 10E:
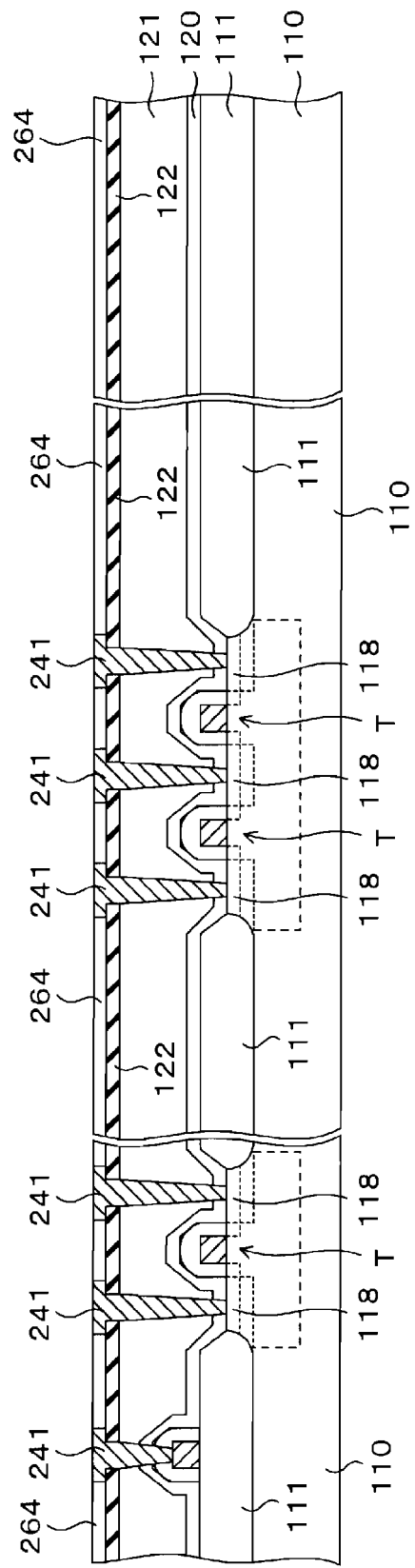

Next, the W film 262 is etched by using the photoresist film 263 as a mask. With this, as depicted in FIG. 10E, the head portion of the W plug 241 is formed and the shape of the W plug becomes a rivet-like shape. After that, the photoresist film 263 is removed.

Next, an insulating film 264 for preventing the W plug from being oxidized is formed on the entire upper surface of the semiconductor substrate 110. The insulating film 264 is formed of SiON, SiN, or aluminum oxide (such as Al$_2$O$_3$). Here, the insulating film 264 is designed to be formed of aluminum oxide. The insulating film 264 is formed on the entire upper surface of the semiconductor substrate 110, and, thereafter, the insulating film 264 is polished until the W plug 241 is exposed, and thus the surface thereof is planarized.

Figure 10F:
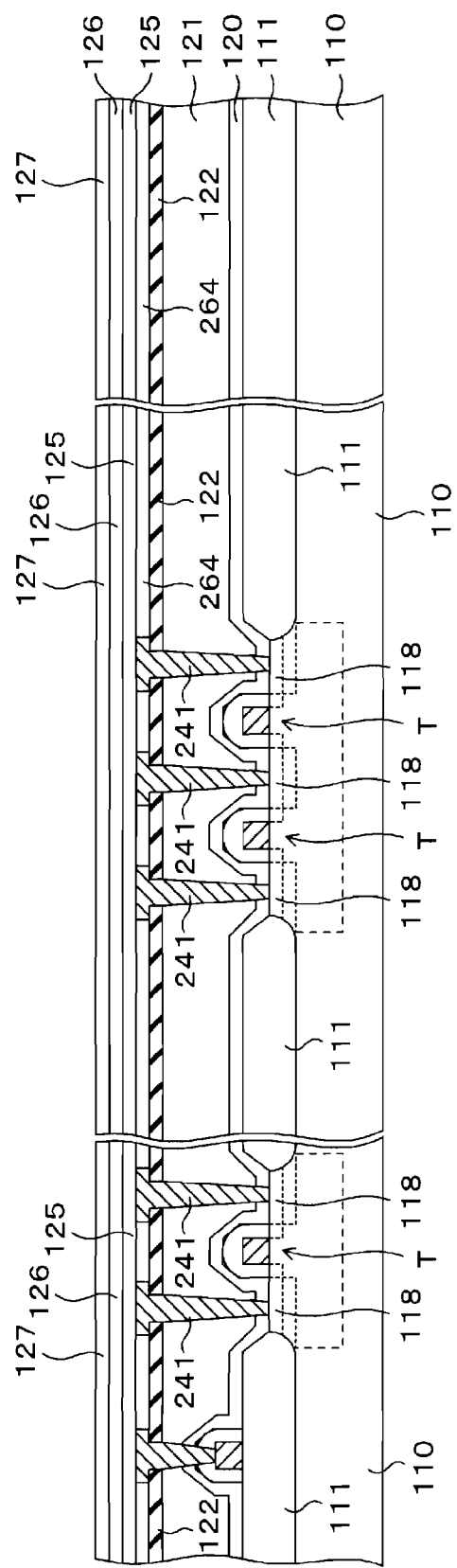

Next, as depicted in FIG. 10F, a SiON film 125 is formed by the plasma CVD method to be 100 nm in thickness on the entire upper surface of the semiconductor substrate 110. Subsequently, a TEOS film 126 is formed by the CVD method to be 100 nm in thickness on the SiON film 125. Then, the dewatering process is performed by heating under conditions of the flow rate of nitrogen being 2 litters per minute and the temperature of 650° C. for 30 minutes. Thereafter, a hydrogen barrier film 127 made of aluminum oxide (for example, Al$_2$O$_3$) is formed by the PVD method on the TEOS film 126. The processes thereafter are the same as those of the first embodiment, and the description thereof is omitted here.

(Fifth Embodiment)

Figure 11:
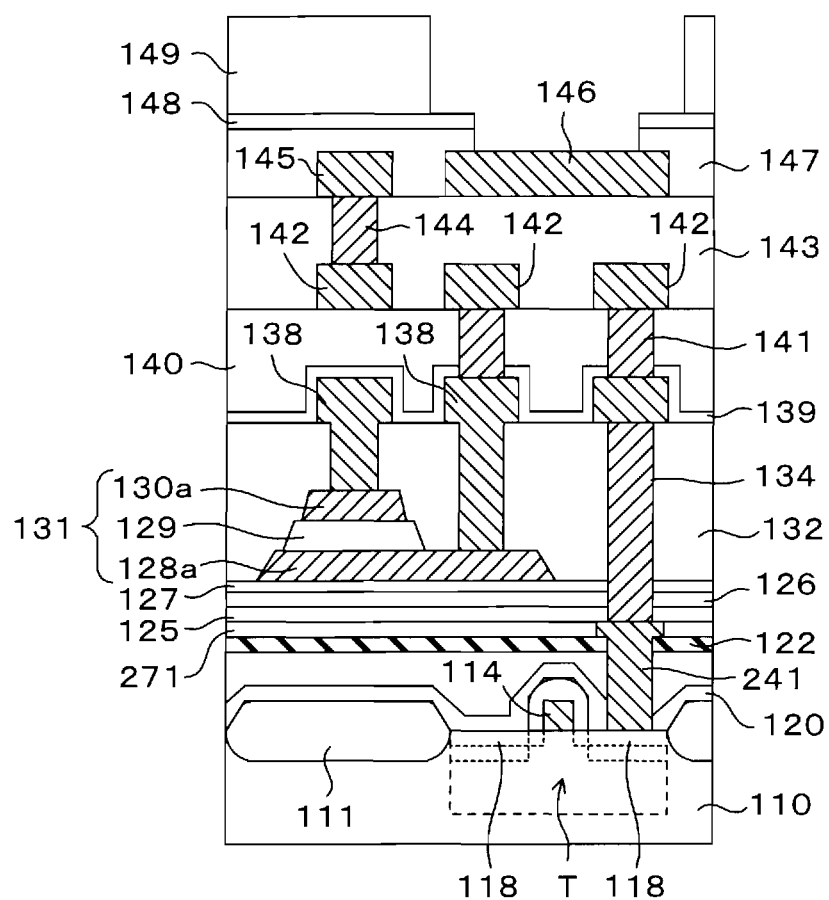
FIG. 11 is a schematic view depicting the structure of a semiconductor device according to a fifth embodiment.

FIG. 11 is a schematic view depicting the structure of a semiconductor device according to a fifth embodiment. The present embodiment is different from the fourth embodiment in that a SiON film 217 is formed on an etching stopper film 122. Other components are basically the same as those of the fourth embodiment. Accordingly, in FIG. 11, the same reference numerals are given to denote the components same as those in FIG. 7, and the detailed description thereof is omitted.

In the present embodiment, after an etching stopper film 122 is formed, a SiON film 271 is formed on the etching stopper film 122. Thereafter, the SiON film 271 is processed by the photolithography method and the etching method to form, in a predetermined region, an opening in which the etching stopper film 122 is exposed. After that, the photolithography method and the etching method are used to form a contact hole extending from the upper surface of the etching stopper film 122 exposed in the opening and reaching a high concentration impurity region 118.

Subsequently, a TiN film and a Ti film are formed on the entire upper surface of the semiconductor substrate 110 and the wall surface of the contact hole is covered with these TiN film and Ti film. Thereafter, W (tungsten) is deposited on the entire upper surface of the semiconductor substrate 110 and the contact hole is filled with W. After that, polishing is performed by the CMP method until the SiON film 271 is exposed. In this manner, formed is a W plug 241 in a rivet shape with the upper portion thereof wide.

The processes thereafter are the same as those of the fourth embodiment, and the description thereof is omitted here. In the present embodiment, effects similar to those of the fourth embodiment can be also obtained.

Note that the semiconductor device according to the present embodiment can be manufactured by the second manufacturing method or the third manufacturing method described in the fourth embodiment.

(Sixth Embodiment)

Figure 12:
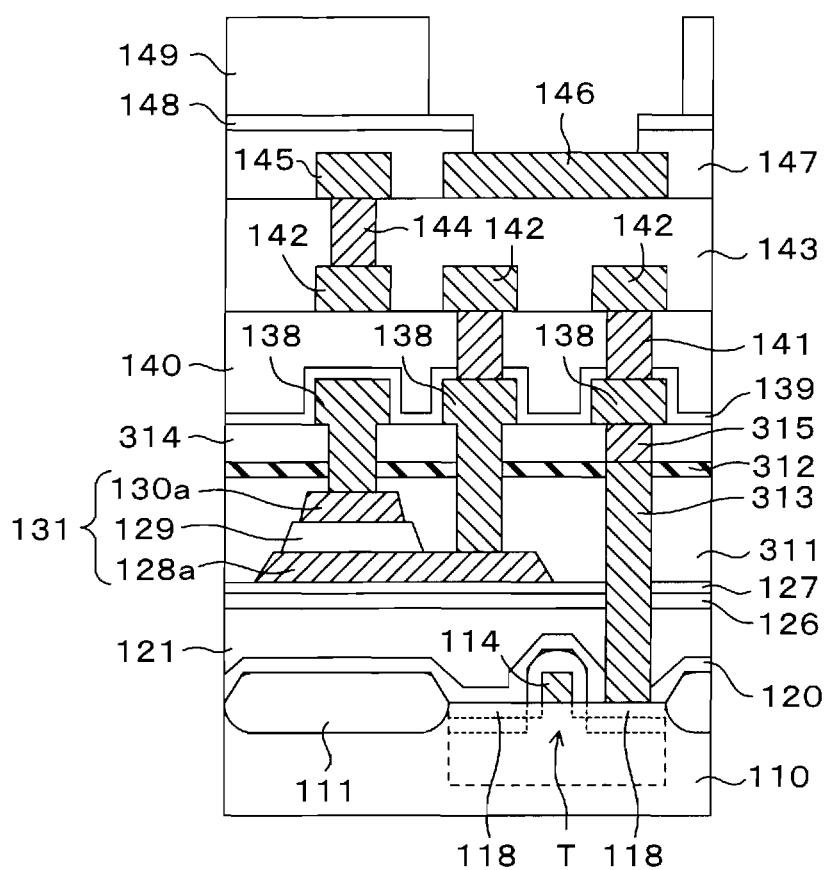
FIG. 12 is a schematic view depicting the structure of a semiconductor device according to a sixth embodiment.

FIG. 12 is a schematic view depicting the structure of a semiconductor device according to a sixth embodiment. The present embodiment is different from the first embodiment in that an etching stopper film is disposed on an upper side of a ferroelectric capacitor 131. Other components are basically the same as those of the first embodiment. Accordingly, in FIG. 12, the same reference numerals are given to denote the components same as those in FIG. 3, and the detailed description thereof is omitted.

As depicted in FIG. 12, in the present embodiment, a method similar to that of the first embodiment is used to form, on and in a semiconductor substrate 110, an element isolation film 111, a transistor T, a stopper layer 120, and a first interlayer insulating film 121. After that, the upper surface of the interlayer insulating film 121 is planarized by the CMP method, and, thereafter, a TEOS film 126 and a hydrogen barrier film 127 are formed.

Subsequently, formed on the hydrogen barrier film 127 is a ferroelectric capacitor 131 constituted of a lower electrode 128a, a ferroelectric film 129, and an upper electrode 130a. Thereafter, if needed, an aluminum oxide ($Al_2O_3$) film (unillustrated) is formed on the entire upper surface of the semiconductor substrate 110, so that the ferroelectric capacitor 131 is covered with the aluminum oxide film.

Thereafter, an interlayer insulating film 311 made of TEOS-NSG is formed on the entire upper surface of the semiconductor substrate 110. After that, the surface of the interlayer insulating film 311 is polished and planarized by the CMP method. Then, an etching stopper film 312 made of SiON is formed on this interlayer insulating film 311 to be, for example, 100 nm in thickness.

Next, a photoresist film is formed on the etching stopper film 312. Then, this photoresist film is exposed to light and developed to form an opening in a predetermined position. After that, the etching is performed by using this photoresist film as a mask to form a contact hole extending from the upper surface of the etching stopper film 312 and reaching the high concentration impurity region 118. Subsequently, the wall surface of this contact hole is covered with a Ti film and a TiN film, and the contact hole is filled with W (tungsten) to form a plug 313 to be electrically connected to the high concentration impurity region 118. After that, an interlayer insulating film 314 made of TEOS-NSG is formed on the etching stopper film 312 by the plasma CVD method.

Next, the photolithography method and the etching method are used to form a contact hole extending from the upper surface of the interlayer insulating film 314 and reaching the plug 313. Then, the contact hole is filled with W (tungsten) to form a plug 315 to be electrically connected to the plug 313. After that, a TiN film (unillustrated) is formed as a barrier metal on the entire upper surface of the substrate 110.

Next, the photolithography method and the etching method are used to form a contact hole extending from the upper surface of the interlayer insulating film 314 and reaching the upper electrode 130a of the ferroelectric capacitor 131, and a contact hole extending from the upper surface of the interlayer insulating film 314 and reaching the lower electrode 128a of the ferroelectric capacitor 131. Thereafter, an aluminum (aluminum alloy) film is formed on the entire upper surface of the semiconductor substrate 110 and aluminum is filled in the contact holes. Then, by the photolithography method and the etching method, the aluminum film is patterned to form a wiring 138 of a first wiring layer.

The processes thereafter are the same as those of the first embodiment, and the description thereof is omitted here. In the present embodiment, effects similar to those of the first embodiment can be also obtained.

Figure 13:
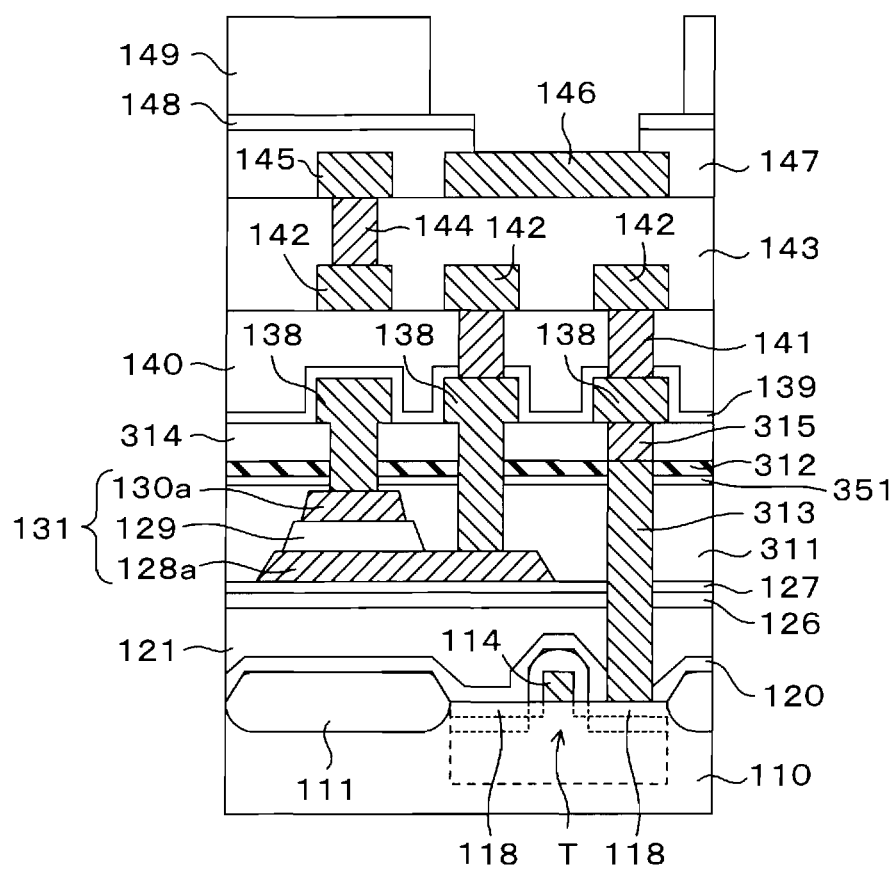
FIG. 13 is a schematic view depicting the structure of a semiconductor device according to a modified example of the sixth embodiment.

FIG. 13 is a schematic view depicting a modified example of the sixth embodiment. As depicted in this FIG. 13, an oxide film with a thickness of 50 to 100 nm may be formed as a cap layer 351 under the etching stopper film 312. When the interlayer insulating film 311 formed on the ferroelectric capacitor 131 is polished by the CMP method, a void (space) is generated in the interlayer insulating film 311. This may cause moisture or hydrogen to penetrate into the space, and thus cause the characteristic of the ferroelectric capacitor 131 to be deteriorated. As depicted in FIG. 13, the cap layer 351 is formed on the interlayer insulating film 311 to fill the void, and, thereafter, the etching stopper film 312 is formed. As a result, the characteristic of the ferroelectric capacitor 131 can be more securely prevented from being deteriorated.

In addition, a hydrogen barrier film (unillustrated) may be formed above the etching stopper film 312. With this, the penetration of moisture and hydrogen into the ferroelectric capacitor 131 can be further securely prevented. Thus, the characteristic of the ferroelectric capacitor 131 can be more securely prevented from being deteriorated.

(Seventh Embodiment)

Figure 14:
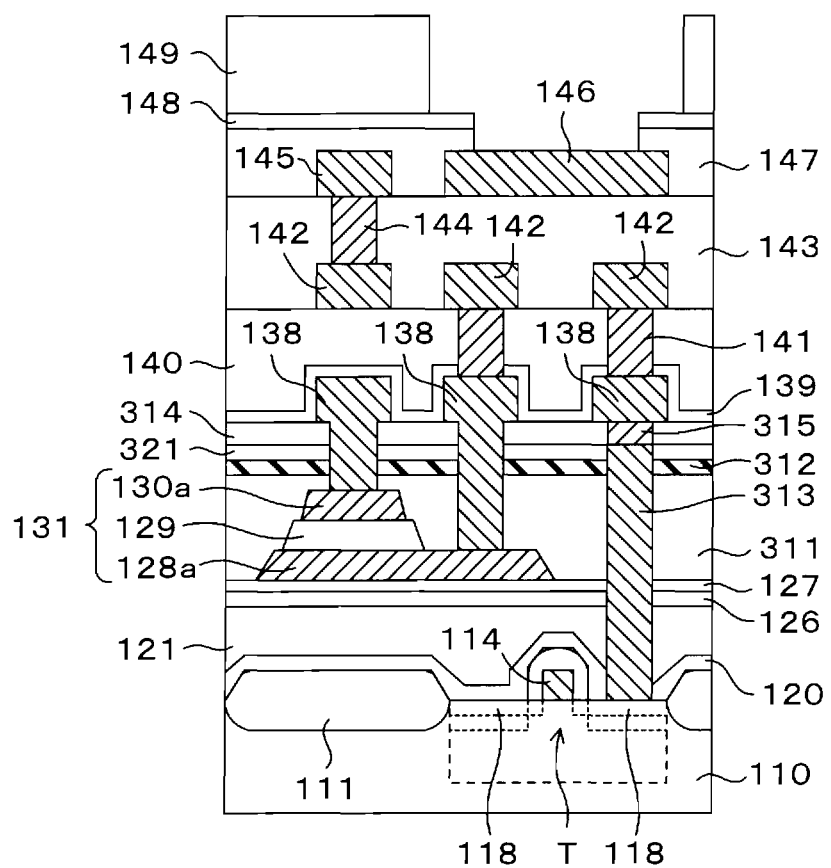
FIG. 14 is a schematic view depicting the structure of a semiconductor device according to a seventh embodiment.

FIG. 14 is a schematic view depicting the structure of a semiconductor device according to a seventh embodiment. The present embodiment is different from the sixth embodiment in that a TEOS (silicon oxide) film 321 is formed on an etching stopper film 312. Other components are basically the same as those of the sixth embodiment. Accordingly, in FIG. 14, the same reference numerals are given to denote the components same as those in FIG. 12, and the detailed description thereof is omitted.

In the present embodiment, after an etching stopper film 312 is formed, a TEOS film 321 is formed by the CVD method to be, for example, 100 nm in thickness on the etching stopper film 312. Subsequently, by the photolithography method and the etching method, formed is a contact hole extending from the upper surface of the TEOS film 321 and reaching a high concentration impurity region 118. Then, this contact hole is filled with W (tungsten) to form a plug 313.

Thereafter, an interlayer insulating film 314 made of TEOS-NSG is formed by the plasma CVD method on the entire upper surface of a semiconductor substrate 110. After that, the photolithography method and the etching method are used to form a contact hole extending from the upper surface of the interlayer insulating film 314 and reaching the plug 313. Then, this contact hole is filled with W (tungsten) to form a plug 315 which is electrically connected to the plug 313.

Subsequently, by the photolithography method and the etching method, formed are a contact hole extending from the upper surface of the interlayer insulating film 314 and reaching an upper electrode 130a of a ferroelectric capacitor 131 and a contact hole extending from the upper surface of the interlayer insulating film 314 and reaching a lower electrode 128a of the ferroelectric capacitor 131. Thereafter, an aluminum (aluminum alloy) film is formed on the entire upper surface of the semiconductor substrate 110 and aluminum is filled into the contact holes. Then, by the photolithography method and the etching method, the aluminum film is patterned to form a wiring 138 of a first wiring layer.

The processes thereafter are the same as those of the first embodiment, and the description thereof is omitted here. In the present embodiment, effects similar to those of the first embodiment can be also obtained.

Figure 15:
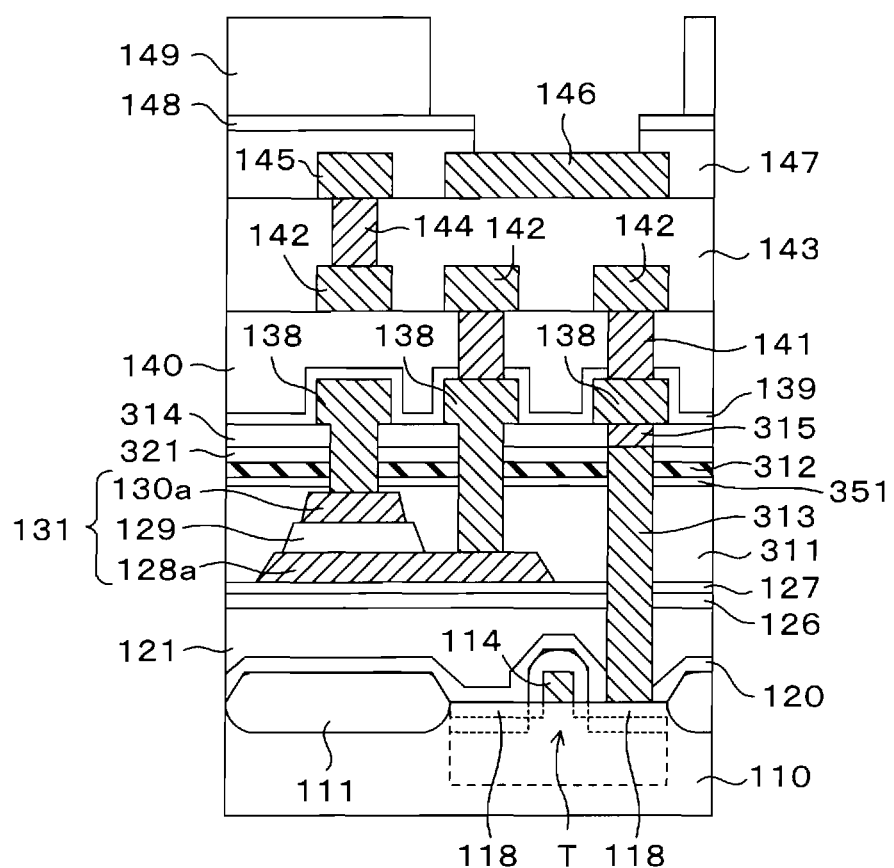
FIG. 15 is a schematic view depicting the structure of a semiconductor device according to a modified example of the seventh embodiment.

FIG. 15 is a schematic view depicting a modified example of the seventh embodiment. As depicted in this FIG. 15, an oxide film with the thickness of 50 to 100 nm may be formed as a cap layer 351 under the etching stopper film 312. With this, a void which is generated in the interlayer insulating film 311 at the time of the CMP processing can be filled. Accordingly, the characteristic of the ferroelectric capacitor 131 can be more securely prevented from being deteriorated.

In addition, a hydrogen barrier film (unillustrated) may be formed above the etching stopper film 312. With this, the penetration of moisture and hydrogen into the ferroelectric capacitor 131 can be further securely prevented. Thus, the characteristic of the ferroelectric capacitor 131 can be more securely prevented from being deteriorated.

(Eighth Embodiment)

Figure 16:
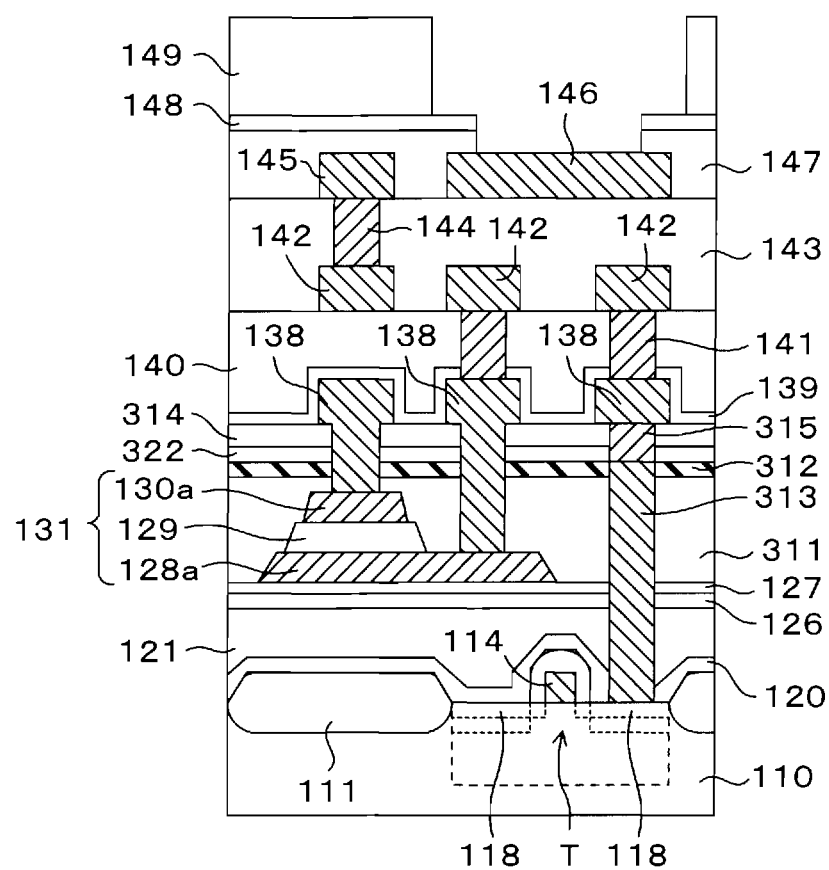
FIG. 16 is a schematic view depicting the structure of a semiconductor device according to an eighth embodiment.

FIG. 16 is a schematic view depicting the structure of a semiconductor device according to an eighth embodiment. The present embodiment is different from the sixth embodiment in that a moisture barrier film 322 made of SiON is formed on an etching stopper film 312. Other components are basically the same as those of the sixth embodiment. Accordingly, in FIG. 16, the same reference numerals are given to denote the components same as those in FIG. 12, and the detailed description thereof is omitted.

In the present embodiment, after an etching stopper film 312 and a W plug 313 are formed, a SiON film 322 is formed by the plasma CVD method to be, for example, 100 nm in thickness on the etching stopper film 312. After that, an interlayer insulating film 314 made of TEOS-NSG is formed on the SiON film 322 by the plasma CVD method.

After that, the photolithography method and the etching method are used to form a contact hole extending from the upper surface of the interlayer insulating film 314 and reaching the plug 313. Then, this contact hole is filled with W (tungsten) to form a plug 315 which is electrically connected to the plug 313. Thereafter, a TiN film (unillustrated) is formed as a barrier metal on the entire upper surface of the substrate 110.

Subsequently, by the photolithography method and the etching method, formed are a contact hole extending from the upper surface of the interlayer insulating film 314 and reaching an upper electrode 130a of a ferroelectric capacitor 131 and a contact hole extending from the upper surface of the interlayer insulating film 314 and reaching a lower electrode 128a of the ferroelectric capacitor 131. Thereafter, an aluminum (aluminum alloy) film is formed on the entire upper surface of the semiconductor substrate 110 and aluminum is filled into the contact holes. Then, by the photolithography method and the etching method, the aluminum film is patterned to form a wiring 138 of a first wiring layer.

The processes thereafter are the same as those of the first embodiment, and the description thereof is omitted here. In the present embodiment, effects similar to those of the first embodiment can be also obtained.

Figure 17:
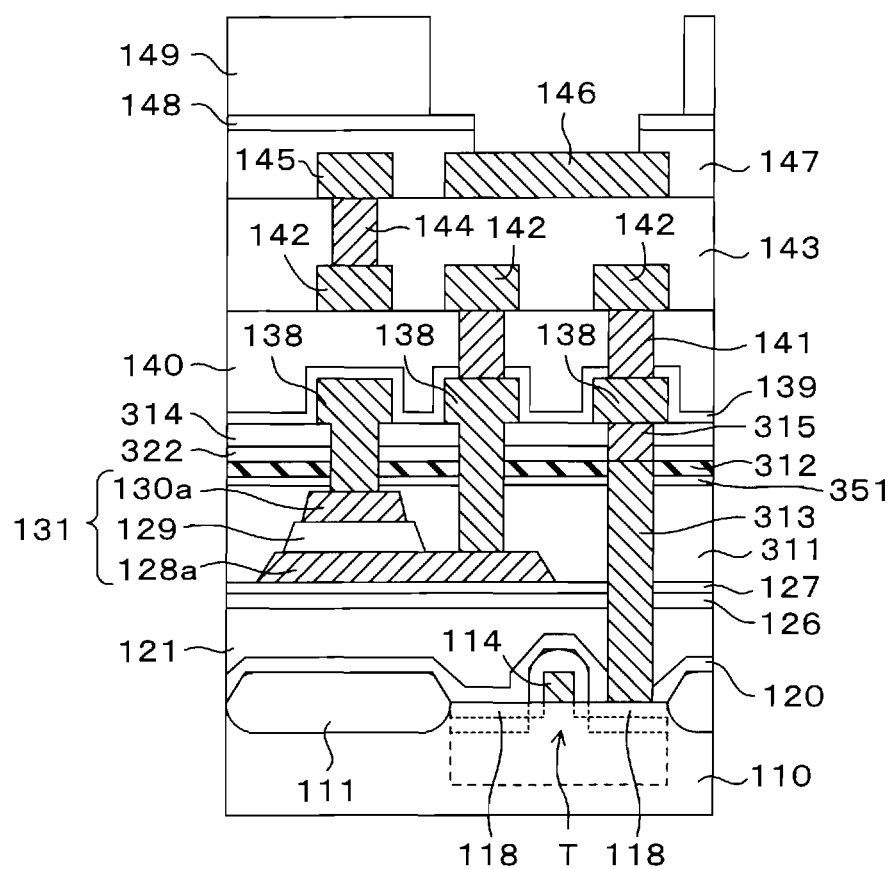
FIG. 17 is a schematic view depicting the structure of a semiconductor device according to a modified example of the eighth embodiment.

FIG. 17 is a schematic view depicting a modified example of the eighth embodiment. As depicted in this FIG. 17, an oxide film with the thickness of 50 to 100 nm may be formed as a cap layer 351 under the etching stopper film 312. With this, a void which is generated in the interlayer insulating film 311 at the time of the CMP processing can be filled. Accordingly, the characteristic of the ferroelectric capacitor 131 can be more securely prevented from being deteriorated.

In addition, a hydrogen barrier film (unillustrated) may be formed above the etching stopper film 312. With this, the penetration of moisture and hydrogen into the ferroelectric capacitor 131 can be further securely prevented. Thus, the characteristic of the ferroelectric capacitor 131 can be more securely prevented from being deteriorated.

(Ninth Embodiment)

Figure 18:
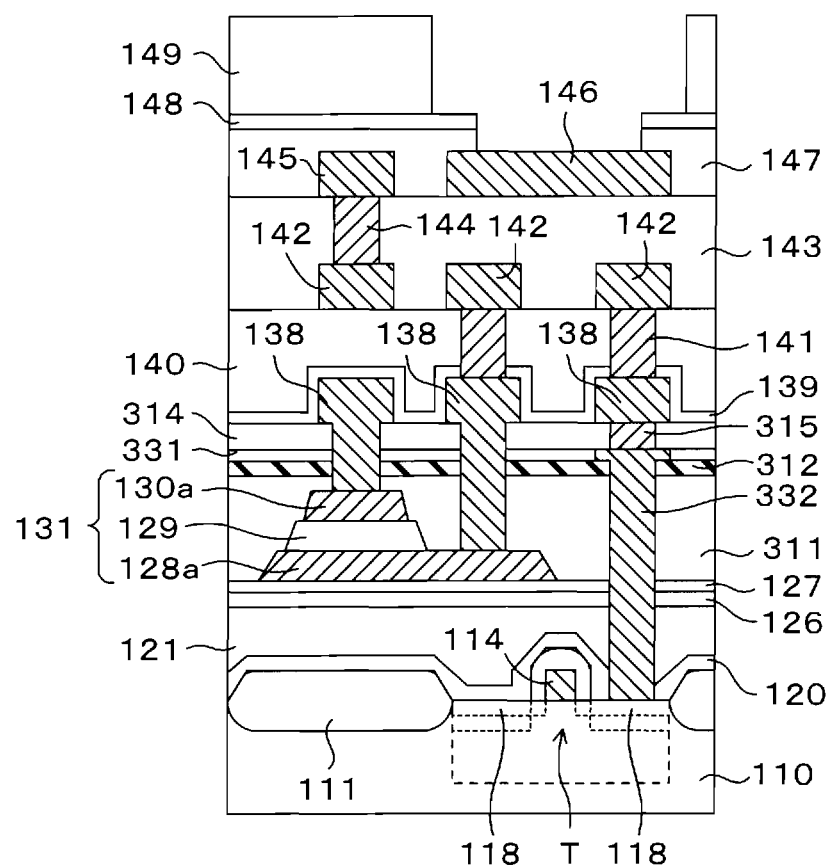
FIG. 18 is a schematic view depicting the structure of a semiconductor device according to a ninth embodiment.

FIG. 18 is a schematic view depicting the structure of a semiconductor device according to a ninth embodiment. The present embodiment is different from the sixth embodiment in the shape of the cross section of a plug to be connected to a high concentration impurity region 118. Other components are basically the same as those of the sixth embodiment. Accordingly, in FIG. 18, the same reference numerals are given to denote the components same as those in FIG. 12, and the detailed description thereof is omitted.

In the present embodiment, after an etching stopper film 312 is formed, a TEOS film 331 is formed on the etching stopper film 312. Then, an opening is formed in the TEOS film 311 by using a method depicted in, for example, FIGS. 8B to 8D. Thereafter, a contact hole extending from the upper surface of the etching stopper film 312 exposed inside the opening and reaching the high concentration impurity region 118 is formed, and the contact hole is filled with W (tungsten). In this manner, a rivet-like W plug 332 with a diameter in an upper portion being larger than those in other portions is formed.

Thereafter, an interlayer insulating film 314 made of TEOS-NSG is formed by the plasma CVD method on the TEOS film 331. After that, a contact hole extending from the upper surface of this interlayer insulating film 314 and reaching the plug 332 is formed. Then, this contact hole is filled with W (tungsten) to form a plug 315 which is electrically connected to the plug 332.

Subsequently, by the photolithography method and the etching method, formed are a contact hole extending from the upper surface of the interlayer insulating film 314 and reaching an upper electrode 130a of a ferroelectric capacitor 131 and a contact hole extending from the upper surface of the interlayer insulating film 314 and reaching a lower electrode 128a of the ferroelectric capacitor 131. Thereafter, an aluminum (aluminum alloy) film is formed on the entire upper surface of a semiconductor substrate 110 and aluminum is filled into the contact holes. Then, by the photolithography method and the etching method, the aluminum film is patterned to form a wiring 138 of a first wiring layer.

The processes thereafter are the same as those of the first embodiment, and the description thereof is omitted here. In the present embodiment, effects similar to those of the first embodiment can be also obtained. Note that the rivet-like W plug 332 may be formed by the second manufacturing method or the third manufacturing method described in the fourth embodiment.

Figure 19:
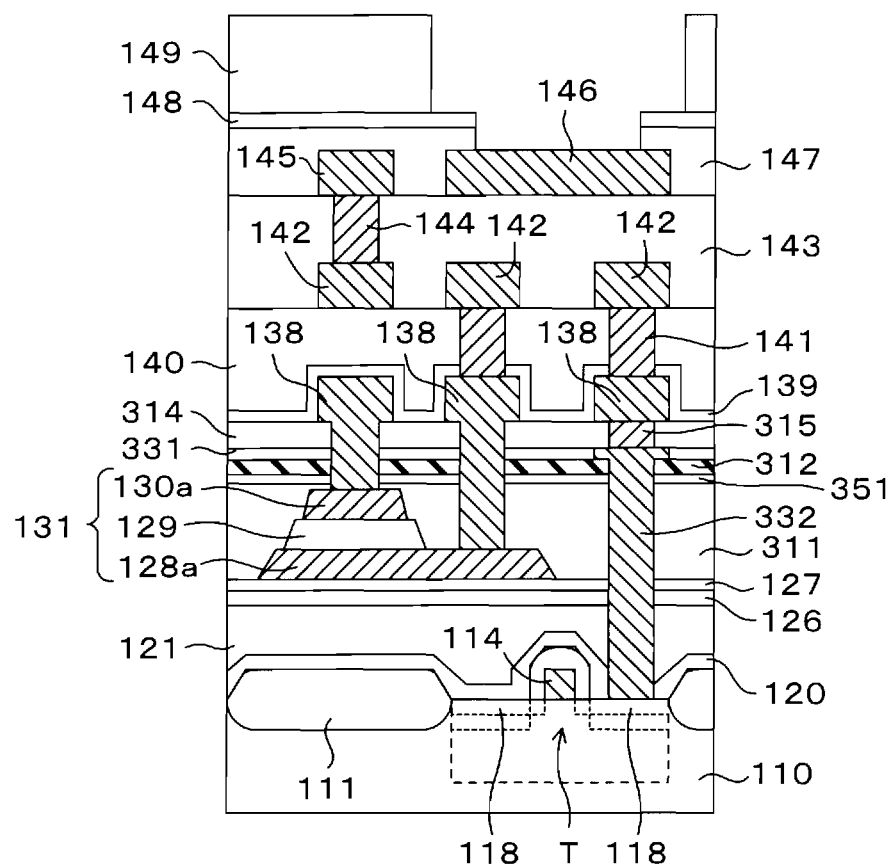
FIG. 19 is a schematic view depicting the structure of a semiconductor device according to a modified example of the ninth embodiment.

FIG. 19 is a schematic view depicting a modified example of the ninth embodiment. As depicted in this FIG. 19, an oxide film with the thickness of 50 to 100 nm may be formed as a cap layer 351 under the etching stopper film 312. With this, a void which is generated in the interlayer insulating film 311 at the time of the CMP processing can be filled. Accordingly, the characteristic of the ferroelectric capacitor 131 can be more securely prevented from being deteriorated.

In addition, a hydrogen barrier film (unillustrated) may be formed above the etching stopper film 312. With this, the penetration of moisture and hydrogen into the ferroelectric capacitor 131 can be further securely prevented. Thus, the characteristic of the ferroelectric capacitor 131 can be more securely prevented from being deteriorated.

(Tenth Embodiment)

Figure 20:
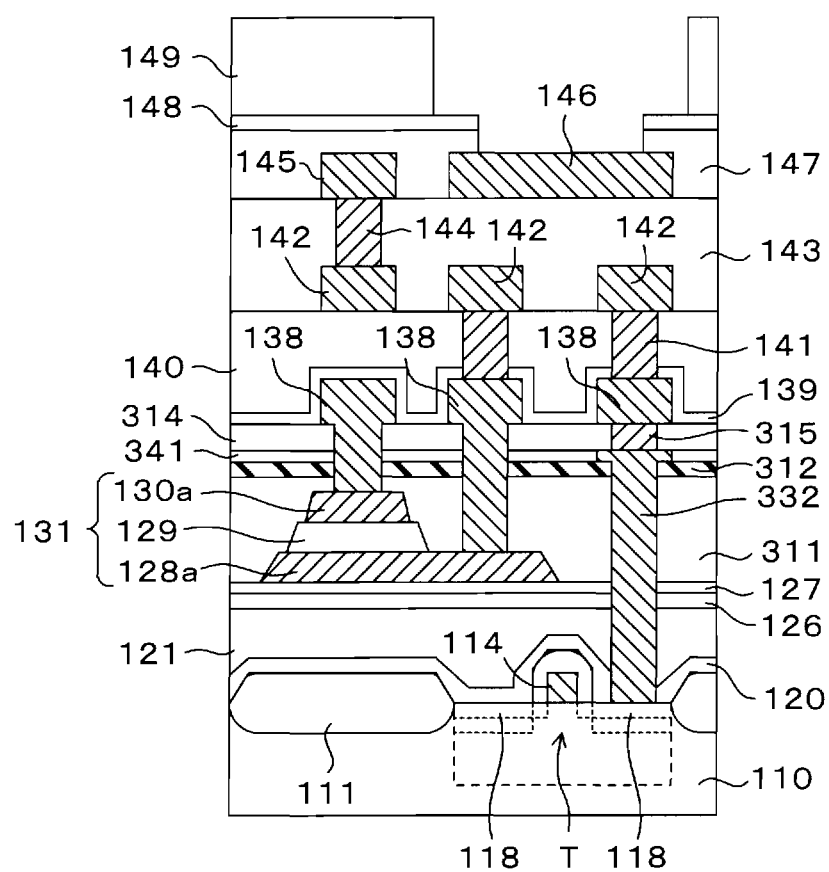
FIG. 20 is a schematic view depicting the structure of a semiconductor device according to a tenth embodiment.

FIG. 20 is a schematic view depicting the structure of a semiconductor device according to a tenth embodiment. The present embodiment is different from the ninth embodiment in that a SiON film 341 is formed on an etching stopper film 312. Other components are basically the same as those of the ninth embodiment. Accordingly, in FIG. 20, the same reference numerals are given to denote the components same as those in FIG. 18, and the detailed description thereof is omitted.

In the present embodiment, after an etching stopper film 312 is formed, a SiON film 341 is formed on the etching stopper film 312. Subsequently, this SiON film 341 is processed by the photolithography method and the etching method to form, in a predetermined region, an opening in which the etching stopper film 312 is exposed. Thereafter, by the photolithography method and the etching method, formed is a contact hole extending from the upper surface of the etching stopper film 312 exposed in the opening and reaching a high concentration impurity region 118. Then, this contact hole is filled with W (tungsten) to form a rivet-like W plug 332 with a diameter in an upper portion being larger than those in other portions.

Thereafter, an interlayer insulating film 314 made of TEOS-NSG is formed by the plasma CVD method on the SiON film 341. After that, a contact hole extending from the upper surface of the interlayer insulating film 314 and reaching a plug 332 is formed. Then, this contact hole is filled with W (tungsten) to form a plug 315 which is electrically connected to the plug 332.

Subsequently, by the photolithography method and the etching method, formed are a contact hole extending from the upper surface of the interlayer insulating film 314 and reaching an upper electrode 130a of a ferroelectric capacitor 131 and a contact hole extending from the upper surface of the interlayer insulating film 314 and reaching a lower electrode 128a of the ferroelectric capacitor 131. Thereafter, an aluminum (aluminum alloy) film is formed on the entire upper surface of a semiconductor substrate 110 and aluminum is filled into the contact holes. Then, by the photolithography method and the etching method, the aluminum film is patterned to form a wiring 138 of a first wiring layer.

The processes thereafter are the same as those of the first embodiment, and the description thereof is omitted here. In the present embodiment, effects similar to those of the first embodiment can be also obtained.

Figure 21:
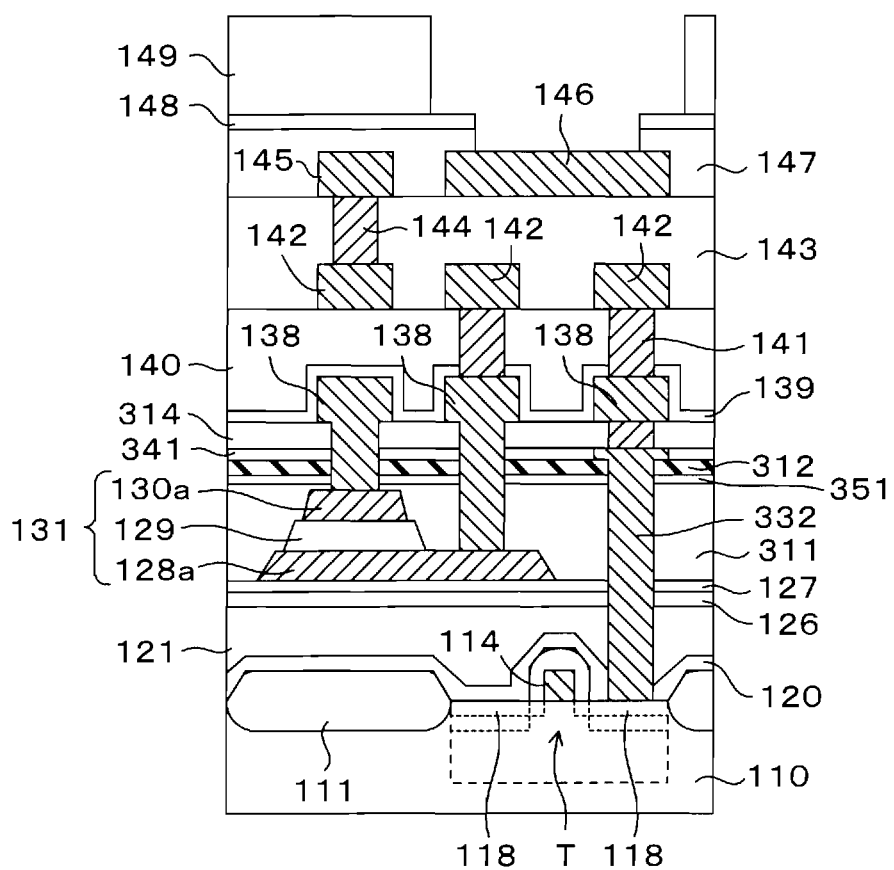
FIG. 21 is a schematic view depicting the structure of a semiconductor device according to a modified example of the tenth embodiment.

FIG. 21 is a schematic view depicting a modified example of the tenth embodiment. As depicted in this FIG. 21, an oxide film with the thickness of 50 to 100 nm may be formed as a cap layer 351 under the etching stopper film 312. With this, a void which is generated in the interlayer insulating film 311 at the time of the CMP processing can be filled. Accordingly, the characteristic of the ferroelectric capacitor 131 can be more securely prevented from being deteriorated.

In addition, a hydrogen barrier film (unillustrated) may be formed above the etching stopper film 312. With this, the penetration of moisture and hydrogen into the ferroelectric capacitor 131 can be further securely prevented. Thus, the characteristic of the ferroelectric capacitor 131 can be more securely prevented from being deteriorated.

(Other Embodiments)

Figure 22:
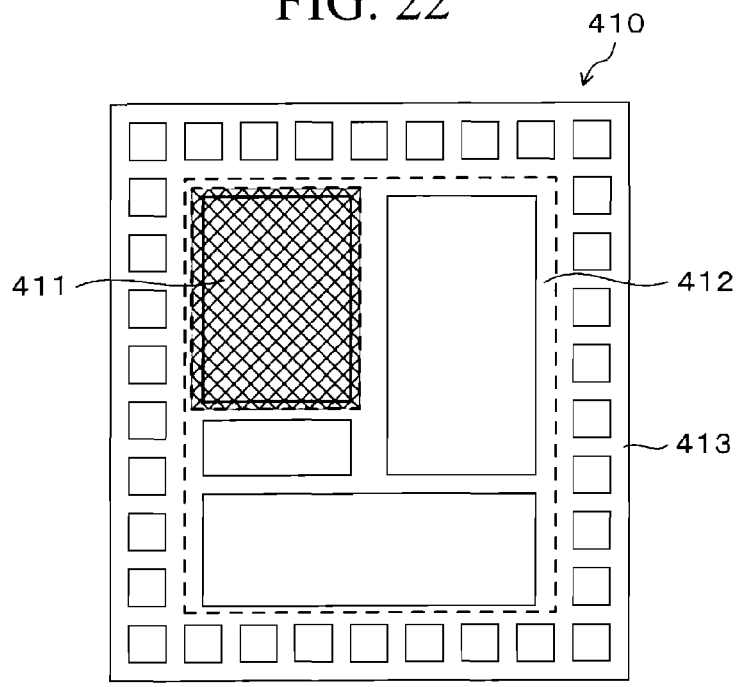
FIG. 22 is a top view depicting an example in which a hydrogen barrier film, a moisture barrier film, and an etching stopper film are only partially disposed on a semiconductor substrate.

In all of the above-described embodiments, it is assumed that there is no process to cut a hydrogen barrier film (hydrogen barrier films 127 and 134), a SiON film (SiON films 125, 135, 221, 271, 322, and 341), and an etching stopper film (etching stopper films 122 and 312) and these films are formed on the entire upper surface of a semiconductor substrate. However, as depicted in FIG. 22, these films may be disposed on a part of the semiconductor substrate. FIG. 22 is a top view depicting a chip forming region 410 for one chip of the semiconductor substrate, and 411 denotes a memory cell forming region, 412 denotes a peripheral circuit region, and 413 denotes a terminal forming region. This FIG. 22 depicts an example in which a hydrogen barrier film, a SiON film, and an etching stopper film are formed only in the hatched portion in the figure, that is, in the memory cell forming region 411.

Figure 23:
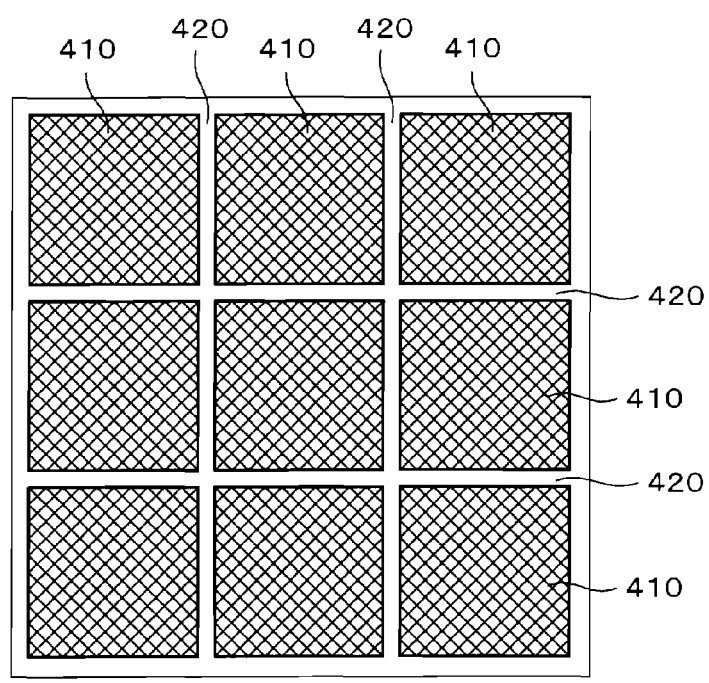
FIG. 23 is a top view depicting an example in which films such as a hydrogen barrier film, a moisture barrier film, an etching stopper film are formed on the entire upper surface of a semiconductor substrate, and, thereafter, the films in a scribe region are removed by etching.

In addition, as depicted in FIG. 23, a hydrogen barrier film, a SiON film, and an etching stopper film may be excluded from a scribe region 320. That is, after these films are formed on the entire upper surface of a semiconductor substrate by the CVD method or the like, the films in the scribe region 320 may be removed by etching.

In addition, in all of the above-described embodiments, the description is given of a case where the present invention is applied to a FeRAM having a planer-type ferroelectric capacitor. However, as a matter of course, the present invention can be applied to a FeRAM having a stack-type capacitor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
a semiconductor substrate;
a first insulating film formed on the semiconductor substrate;
an etching stopper film formed on the first insulating film;
a second insulating film formed on the etching stopper film;
a first plug, that is connected to the semiconductor substrate, formed in the first insulating film, the etching stopper film and the second insulating film;
a capacitor formed on the second insulating film;
a third insulating film formed on the second insulating film and the capacitor; and
a second plug, that is connected to the first plug, formed in the third insulating film,
wherein:
the first plug includes a first part located in the first insulating film and the etching stopper film;
the first plug includes a second part located only in the second insulating film; and
a diameter of the second part is larger than a diameter of the first part.

2. The semiconductor device according to claim 1, wherein a thickness of the second insulating film is equal to or less than 100 nm.

3. The semiconductor device according to claim 1, wherein the etching stopper film includes any one of insulating materials selected from a group consisting of silicon oxide nitride, silicon nitride, aluminum oxide, titanium oxide, zirconium oxide, magnesium oxide, and MgTiOx.

4. The semiconductor device according to claim 1, wherein a thickness of the etching stopper film is between 20 nm and 150 nm both inclusive.

5. The semiconductor device according to claim 1, further comprising a barrier film formed between the etching stopper film and the capacitor.

6. The semiconductor device according to claim 1, further comprising a barrier film formed above the capacitor.

7. The semiconductor device according to claim 1, wherein a thickness of the second part of the first plug is smaller than a thickness of the first part of the first plug.

* * * * *